(12) United States Patent
Chen et al.

(10) Patent No.: US 12,033,899 B2
(45) Date of Patent: Jul. 9, 2024

(54) SELF-ALIGNED METAL GATE FOR MULTIGATE DEVICE

(71) Applicant: Taiwan Semiconductor Manufacturing Co., Ltd., Hsin-Chu (TW)

(72) Inventors: Guan-Lin Chen, Hsinchu County (TW); Chih-Hao Wang, Hsinchu County (TW); Ching-Wei Tsai, Hsinchu (TW); Shi Ning Ju, Hsinchu (TW); Jui-Chien Huang, Hsinchu (TW); Kuo-Cheng Chiang, Hsinchu County (TW); Kuan-Lun Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/305,637

(22) Filed: Apr. 24, 2023

(65) Prior Publication Data
US 2023/0260849 A1 Aug. 17, 2023

Related U.S. Application Data

(63) Continuation of application No. 17/174,109, filed on Feb. 11, 2021, now Pat. No. 11,637,042.
(Continued)

(51) Int. Cl.
*H01L 21/8238* (2006.01)
*H01L 21/02* (2006.01)
*H01L 21/28* (2006.01)
(Continued)

(52) U.S. Cl.
CPC ........... *H01L 21/823828* (2013.01); *H01L 21/02603* (2013.01); *H01L 21/28123* (2013.01);
(Continued)

(58) Field of Classification Search
CPC ....... H01L 21/823828; H01L 21/02603; H01L 21/28123; H01L 21/823807;
(Continued)

(56) References Cited

U.S. PATENT DOCUMENTS

| | | |
|---|---|---|
| 6,287,904 B1 | 9/2001 | Lee et al. |
| 11,616,062 B2 | 3/2023 | Ju et al. |

(Continued)

FOREIGN PATENT DOCUMENTS

| | | |
|---|---|---|
| CN | 110556374 A | 12/2019 |
| DE | 102017126106 A1 | 4/2020 |

(Continued)

*Primary Examiner* — Tong-Ho Kim
(74) *Attorney, Agent, or Firm* — Haynes and Boone, LLP

(57) ABSTRACT

Self-aligned gate cutting techniques for multigate devices are disclosed herein that provide multigate devices having asymmetric metal gate profiles and asymmetric source/drain feature profiles. An exemplary multigate device has a channel layer, a metal gate that wraps a portion of the channel layer, and source/drain features disposed over a substrate. The channel layer extends along a first direction between the source/drain features. A first dielectric fin and a second dielectric fin are disposed over the substrate and configured differently. The channel layer extends along a second direction between the first dielectric fin and the second dielectric fin. The metal gate is disposed between the channel layer and the second dielectric fin. In some embodiments, the first dielectric fin is disposed on a first isolation feature, and the second dielectric fin is disposed on a second isolation feature. The first isolation feature and the second isolation feature are configured differently.

20 Claims, 32 Drawing Sheets

Related U.S. Application Data

(60) Provisional application No. 63/017,717, filed on Apr. 30, 2020.

(51) Int. Cl.
*H01L 27/092* (2006.01)
*H01L 29/06* (2006.01)
*H01L 29/423* (2006.01)
*H01L 29/66* (2006.01)
*H01L 29/786* (2006.01)

(52) U.S. Cl.
CPC ........... *H01L 21/823807* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/66742* (2013.01); *H01L 29/78618* (2013.01); *H01L 29/78696* (2013.01)

(58) Field of Classification Search
CPC .......... H01L 21/823878; H01L 27/092; H01L 29/0649; H01L 29/0673; H01L 29/42392; H01L 29/66742; H01L 29/78618; H01L 29/78696; H01L 21/823437; H01L 21/823842; H01L 29/0653; H01L 29/66439; H01L 21/823481; H01L 27/088; H01L 29/0847; H01L 29/165; H01L 29/7848; H01L 29/66545; H01L 29/775; H01L 27/0924; H01L 21/823821; B82Y 10/00

USPC ........................................................ 257/351
See application file for complete search history.

(56) References Cited

U.S. PATENT DOCUMENTS

| | | | |
|---|---|---|---|
| 11,637,042 B2 * | 4/2023 | Chen | H01L 29/775 |
| | | | 257/351 |
| 2019/0067417 A1 | 2/2019 | Ching et al. | |
| 2019/0393352 A1 | 12/2019 | Guha et al. | |
| 2020/0006577 A1 | 1/2020 | Ching et al. | |
| 2020/0091145 A1 * | 3/2020 | Guha | H01L 21/823437 |
| 2020/0105581 A1 | 4/2020 | Chang et al. | |
| 2020/0287015 A1 | 9/2020 | Subramanian et al. | |
| 2021/0375858 A1 | 12/2021 | Chiang et al. | |
| 2022/0320088 A1 | 10/2022 | Pan et al. | |

FOREIGN PATENT DOCUMENTS

| | | | |
|---|---|---|---|
| KR | 20180000518 | A | 6/2016 |
| KR | 20180079160 | A | 7/2018 |
| KR | 20190064514 | A | 6/2019 |
| TW | 201926684 | A | 7/2019 |
| WO | 2000060659 | A | 10/2000 |
| WO | 2016099570 | A1 | 12/2014 |
| WO | 2015094305 | A | 6/2015 |

\* cited by examiner

100

110 — Form a first isolation feature and a second isolation feature in a substrate, where the first isolation feature is different than the second isolation feature 115 — Form a first dielectric fin over the first isolation feature and a second dielectric fin over the second isolation feature, where the first dielectric fin is different than the second dielectric fin 120 — Form a multigate device having a channel layer, a metal gate that wraps a portion of the channel layer, and source/drain features, where the channel layer extends along a first direction between the source/drain features, the channel layer extends along a second direction between the first dielectric fin and the second dielectric fin, the second direction is different than the first direction, and the metal gate is disposed between and separates the channel layer from the second dielectric fin

FIG. 1

SELF-ALIGNED METAL GATE FOR MULTIGATE DEVICE

This application is a continuation application of U.S. patent application Ser. No. 17/174,109, filed Feb. 11, 2021, which is a non-provisional application of and claims benefit of U.S. Provisional Patent Application Ser. No. 63/017,717, filed Apr. 30, 2020, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, non-self-aligned gate cutting techniques typically implemented to isolate gates of different GAA devices from one another, such as a first gate of a first GAA transistor from a second gate of a second GAA transistor, are hindering the dense packing of IC features needed for advanced IC technology nodes. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method for fabricating a multigate device according to various aspects of the present disclosure.

DETAILED DESCRIPTION

Figure 2:
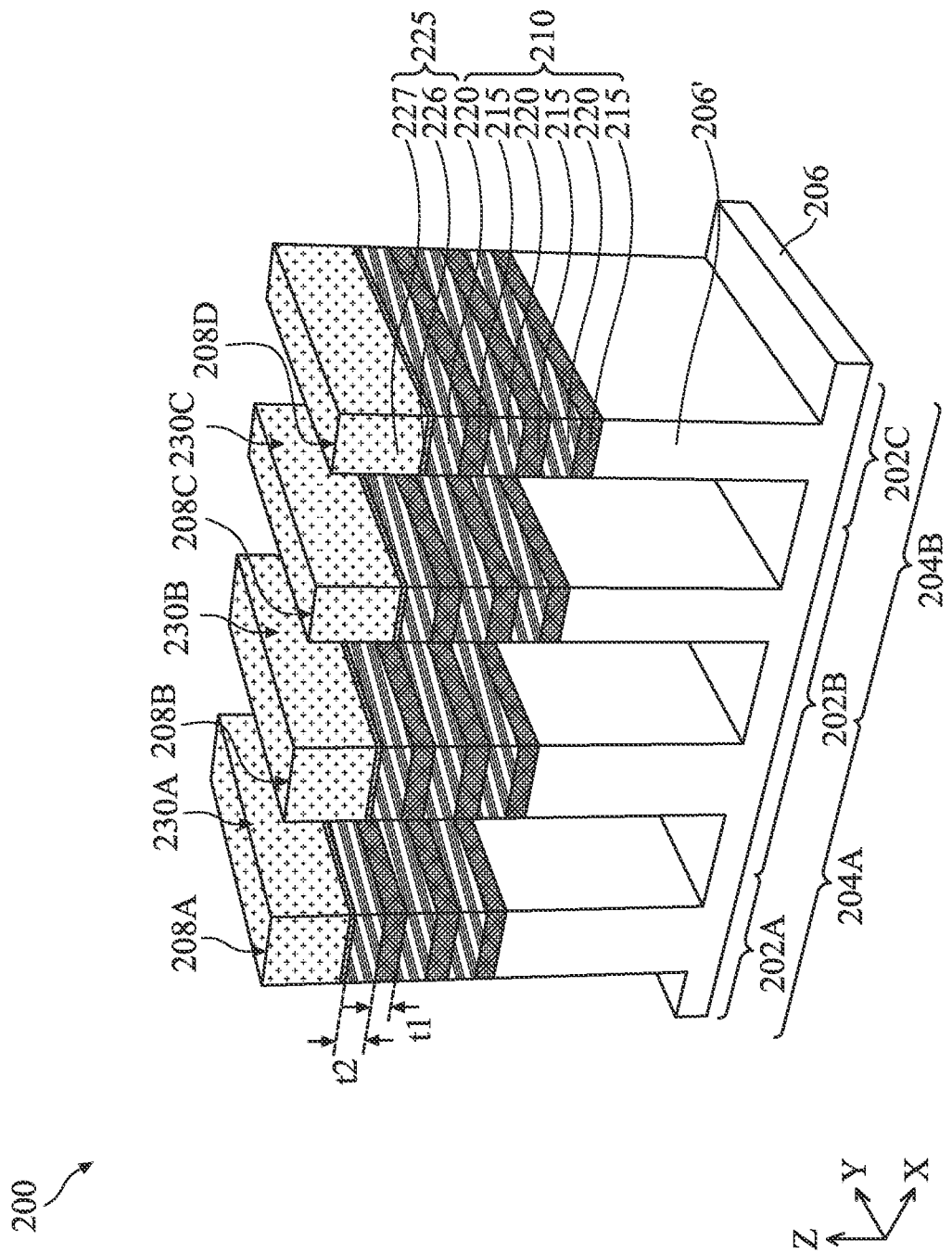
FIGS. 2-28, FIG. 29A, and FIG. 29B are fragmentary perspective views of a multigate device, in portion or entirety, at various fabrication stages (such as those associated with the method in FIG. 1) according to various aspects of the present disclosure.

The present disclosure relates generally to integrated circuit devices, and more particularly, to metal gate cutting technique for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An exemplary non-self-aligned gate cutting technique can involve forming a mask layer over a gate stack, where the mask layer covers a first portion of the gate stack and a second portion of the gate stack and exposes a third portion of the gate stack via an opening formed in the mask layer. The third portion of the gate stack is disposed between the first portion of the gate stack and the second portion of the gate stack. An etching process is then performed that removes the exposed third portion of the gate stack (including, for example, at least one gate electrode layer and at least one gate dielectric layer), thereby forming a gate opening between and separating the first portion of the gate stack from the second portion of the gate stack. A gate isolation feature, such as a dielectric layer (for example, a silicon nitride layer), is then formed in the gate opening to provide electrical isolation between the first portion of the gate stack, which may be disposed over a first channel layer of a first GAA device (i.e., first active device area), and the second portion of the gate stack, which may be disposed over a second channel layer of a second GAA device (i.e., second active device area).

A spacing between active device areas, such as the first channel layer and the second channel layer, is intentionally designed larger than necessary to compensate for process variations that arise during the non-self-aligned gate cutting technique. For example, etch loading effects and/or other loading effects may reduce critical dimension uniformity (CDU) across a wafer, such that in some locations, a width of the opening in the mask layer and/or a width of the gate opening may be larger than a target width, which can lead to unintentional exposure and/or damage of the first channel layer, the second channel layer, the first portion of the gate stack, and/or the second portion of the gate stack. In another example, overlay shift arising from lithography processes may result in the opening in the mask layer shifted left or right of its intended position, which can also lead to unintentional exposure and/or damage of the first channel layer, the second channel layer, the first portion of the gate stack, and/or the second portion of the gate stack. The increased spacing required between the active device areas to adequately compensate for such process variations prevents compact packing of active device areas needed for advanced IC technology nodes, thereby reducing pattern density.

The present disclosure thus proposes a self-aligned gate cutting technique for multigate devices that allows for smaller spacing between active device areas compared to spacing required between active device areas for non-self-aligned gate cutting techniques. The proposed self-aligned gate cutting technique also reduces both metal gate dimensions and source/drain feature dimensions, thereby increasing pattern density. It has further been observed that the reduced metal gate dimensions and source/drain feature dimensions reduce parasitic capacitance between a metal gate and source/drain features (Cgd), thereby improving speed and performance of a multigate device. In some embodiments, the proposed self-aligned gate cutting technique provides a multigate device with an asymmetric gate profile, for example, where a channel layer of the multigate device has a first sidewall physically contacting a metal gate of the multigate device and a second sidewall physically contacting a first-type dielectric fin. Where the multigate device is a multigate device, the proposed self-aligned gate cutting technique provides a second-type dielectric fin that separates the first multigate device (in particular, a first metal gate of the first multigate device) from a second multigate device (in particular, a second metal gate of the second multigate device). The second-type dielectric fin is different than the first-type dielectric fin. In some embodiments, the second-type dielectric fin includes a low-k dielectric layer, an oxide layer, and a high-k dielectric layer, whereas the first-type dielectric fin includes a low-k dielectric layer and an oxide layer. In some embodiments, the first-type dielectric fin and the second-type dielectric fin are disposed on differently configured isolation features, such as different shallow trench isolation (STI) features. For example, the first-type dielectric fin is disposed over a first-type isolation feature that includes an oxide layer disposed over a dielectric liner, and the second-type dielectric fin is disposed over a second-type isolation feature that includes an oxide layer (and is free of any dielectric liner). The proposed self-aligned gate cutting technique further provides a third-type dielectric fin that separates first source/drain features of the first multigate device from second source/drain features of the second multigate device. The first source/drain features are further disposed between the third-type dielectric fin and a fourth-type dielectric fin. In some embodiments, the third-type dielectric fin and the fourth-type dielectric fin each include a low-k dielectric layer, an oxide layer, and a high-k dielectric layer. In some embodiments, the third-type dielectric fin is disposed over an isolation feature configured substantially the same as the second-type isolation feature, and the fourth-type dielectric fin is disposed over an isolation feature configured substantially the same as the first-type isolation feature. In some embodiments, the third-type dielectric fin and the fourth-type dielectric fin are configured similar to the second-type dielectric fin, except that a top surface of the high-k dielectric layer of the second-type dielectric fin relative to a substrate is higher than top surfaces of the third-type dielectric fin and the fourth-type dielectric fin relative to the substrate. The first source/drain features have an asymmetric source/drain profile. In some embodiments, a length of a first sidewall of the first source/drain features physically contacting the third-type dielectric fin is less than a length of a second sidewall of the first source/drain features physically contacting the fourth-type dielectric fin. In some embodiments, a length of first facets of the first source/drain features proximate the third-type dielectric fin is greater than a length of second facets of the first source/drain features proximate the fourth-type dielectric fin. The various dielectric fins, which separate and isolate metal gates, can also be referred to as gate isolation fins, dielectric gate isolation fins, and/or isolation fins. Details of the proposed self-aligned gate cutting technique for multigate devices and resulting multigate devices are described herein in the following pages.

FIG. 1 is a flow chart of a method 100 for fabricating a multigate device according to various aspects of the present disclosure. In some embodiments, method 100 fabricates a p-type multigate transistor and/or an n-type multigate transistor. At block 110, method 100 includes forming a first isolation feature and a second isolation feature in a substrate. The first isolation feature is different than the second isolation feature. For example, the first isolation feature includes a first oxide layer, a first dielectric liner, and a first silicon liner, and the second isolation feature includes a second oxide layer and a second silicon liner. The second isolation feature is free of a dielectric liner, in some embodiments. At block 115, method 100 includes forming a first dielectric fin over the first isolation feature and a second dielectric fin over the second isolation feature. The first dielectric fin is different than the second dielectric fin. For example, the first dielectric fin includes a third oxide layer and a first dielectric layer in a channel region of the multigate device, the first dielectric fin includes the third oxide layer, the first dielectric layer, and a second dielectric layer in source/drain regions of the multigate device, and the second dielectric fin includes a fourth oxide layer, a third dielectric layer, and a fourth dielectric layer in the channel region and the source/drain regions of the multigate device. The first dielectric layer and the third dielectric layer have a first dielectric constant, the second dielectric layer and the fourth dielectric layer have a second dielectric constant, and the second dielectric constant is greater than the first dielectric constant. In some embodiments, the dielectric liner of the first isolation feature has the first dielectric constant. In some embodiments, a width of the first dielectric fin is about the same as a width of the first isolation feature, and a width of the second dielectric fin is less than a width of the second isolation feature. In some embodiments, the first dielectric layer and the third dielectric layer include a silicon-comprising dielectric material, and the second dielectric layer and the fourth dielectric layer include a metal-and-oxygen comprising material.

At block 120, method 100 includes forming a multigate device having a channel layer, a metal gate that wraps a portion of the channel layer, and source/drain features. The channel layer extends along a first direction between the source/drain features and along a second direction between the first dielectric fin and the second dielectric fin. The second direction being different than the first direction. The metal gate is disposed between and separates the channel layer from the second dielectric fin. The metal gate and the source/drain features have asymmetric profiles. In some embodiments, the multigate device is a first multigate device, such as a transistor, disposed in a first multigate device region of an IC device. In such embodiments, the first dielectric fin separates and isolates the metal gate of the first multigate device from a device feature, such as a metal gate, of a second multigate device in the first multigate device region. The first multigate device and the second multigate device may form a complementary transistor in the first multigate device region. In such embodiments, the second dielectric fin separates and isolates the first multigate device from a third multigate device or other type device in a second multigate device region that is disposed adjacent to the first multigate device region. Additional processing is contemplated by the present disclosure. Additional steps can be provided before, during, and after method 100, and some of the steps described can be moved, replaced, or eliminated for additional embodiments of method 100. The discussion that follows illustrates various embodiments of multigate-based integrated circuit devices that can be fabricated according to method 100.

FIGS. 2-28, FIG. 29A, and FIG. 29B are fragmentary perspective views of a multigate device 200, in portion or entirety, at various fabrication stages (such as those associated with method 100 in FIG. 1) according to various aspects of the present disclosure. FIG. 29C and FIG. 29D are fragmentary cross-sectional views of multigate device 200, in portion or entirety, at various fabrication stages (such as those associated with method 100 in FIG. 1) according to various aspects of the present disclosure. As described herein, multigate device 200 includes an n-type transistor region 202A processed to form n-type transistors, a p-type transistor region 202B processed to form p-type transistors, and an n-type transistor region processed to form n-type transistors. As further described herein, n-type transistor region 202A, p-type transistor region 202B, and n-type transistor region 202C are further processed to provide a first multigate device in a first multigate device region 204A and a second multigate device in a second multigate device region 204B. The first multigate device includes an n-type transistor (formed in n-type transistor region 202A) and a p-type transistor (formed in p-type transistor region 202B) and the second multigate device includes an n-type transistor (formed in n-type transistor region 202C) and a p-type transistor (formed in p-type transistor region 202B), such that first multigate device region 204A and second multigate device region 204B each include a complementary transistor, such as a complementary metal-oxide semiconductor (CMOS) transistor. In some embodiments, first multigate device region 204A and second multigate device region 204B are a portion of a device region, such as a core region (often referred to as a logic region), a memory region (such as a static random access memory (SRAM) region), an analog region, a peripheral region (often referred to as an I/O region), a dummy region, other suitable region, or combinations thereof. The device region can include various passive and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. Multigate device 200 can be included in a microprocessor, a memory, and/or other IC device. In some embodiments, multigate device 200 is a portion of an IC chip, a system on chip (SoC), or portion thereof. FIGS. 2-28, FIG. 29A, FIG. 29B, FIG. 29C, and FIG. 29D have been simplified for the sake of clarity to better understand the inventive concepts of the present disclosure. Additional features can be added in multigate device 200, and some of the features described below can be replaced, modified, or eliminated in other embodiments of multigate device 200.

Turning to FIG. 2, a fin fabrication process is performed to form fins extending from a substrate (wafer) 206. For example, a fin 208A, a fin 208B, a fin 208C, and a fin 208D (also referred to as fin structures, fin elements, etc.) extend from substrate 206 after the fin fabrication process. Each of fins 208A-208D include a substrate portion (i.e., a fin portion 206' of substrate 206 (also referred to as a substrate extension, a substrate fin portion, an etched substrate portion, etc.)), a semiconductor layer stack portion (i.e., a semiconductor layer stack 210 that includes semiconductor layers 215 and semiconductor layers 220) disposed over the substrate portion, and a patterning layer portion (i.e., a patterning layer 225 that includes a pad layer 226 and a mask layer 227) disposed over the semiconductor layer stack portion. Fins 208A-208D extend substantially parallel to one another along a y-direction, having a length defined in the y-direction, a width defined in an x-direction, and a height defined in a z-direction.

In some embodiments, a lithography and/or etching process is performed to pattern a semiconductor layer stack to form fins 208A-208D. The lithography process can include forming a resist layer over semiconductor layer stack 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 210 using the patterned resist layer as an etch mask. In some embodiments, the patterned resist layer is formed over a mask layer disposed over semiconductor layer stack 210, a first etching process removes portions of the mask layer to form patterning layer 225 (i.e., a patterned hard mask layer), and a second etching process removes portions of semiconductor layer stack 210 using patterning layer 225 as an etch mask. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. Alternatively, fins 208A-208D are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fins 208A-208D with patterning layer 225, semiconductor layer stack 210, and fin portion 206', as depicted in FIG. 2. In some embodiments, directed self-assembly (DSA) techniques are implemented while patterning semiconductor layer stack 210. Further, in some embodiments, the exposure process can implement maskless lithography, electron-beam (e-beam) writing, and/or ion-beam writing for patterning the resist layer.

In the depicted embodiment, substrate 206 includes silicon. Alternatively or additionally, substrate 206 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 206 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 206 can include various doped regions. For example, substrate 206 (including fin portions 206') can include p-type doped regions (referred to as p-wells) in n-type transistor regions 202A, 202C and n-type doped regions (referred to as n-wells) in p-type transistor region 202B. The n-wells are doped with n-type dopants, such as phosphorus, arsenic, other n-type dopant, or combinations thereof. The p-wells are doped with p-type dopants, such as boron, indium, other p-type dopant, or combinations thereof. In some embodiments, substrate 206 includes doped regions formed with a combination of p-type dopants and n-type dopants. The various doped regions can be formed directly on and/or in substrate 206, for example, providing a p-well structure, an n-well structure, a dual-well structure, a raised structure, or combinations thereof. An ion implantation process, a diffusion process, and/or other suitable doping process can be performed to form the various doped regions.

Each semiconductor layer stack 210 is disposed over a respective fin portion 206' of substrate 206 and includes semiconductor layers 215 and semiconductor layers 220 stacked vertically (e.g., along the z-direction) in an interleaving or alternating configuration from a top surface of substrate 206. In some embodiments, semiconductor layers 215 and semiconductor layers 220 are epitaxially grown in the depicted interleaving and alternating configuration. For example, a first one of semiconductor layers 215 is epitaxially grown on substrate 206, a first one of semiconductor layers 220 is epitaxially grown on the first one of semiconductor layers 215, a second one of semiconductor layers 215 is epitaxially grown on the first one of semiconductor layers 220, and so on until semiconductor layer stacks 210 have a desired number of semiconductor layers 215 and semiconductor layers 220. In such embodiments, semiconductor layers 215 and semiconductor layers 220 can be referred to as epitaxial layers. In some embodiments, epitaxial growth of semiconductor layers 215 and semiconductor layers 220 is achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 215 is different than a composition of semiconductor layers 220 to achieve etching selectivity and/or different oxidation rates during subsequent processing. In some embodiments, semiconductor layers 215 have a first etch rate to an etchant and semiconductor layers 220 have a second etch rate to the etchant, where the second etch rate is different than the first etch rate. In some embodiments, semiconductor layers 215 have a first oxidation rate and semiconductor layers 220 have a second oxidation rate, where the second oxidation rate is different than the first oxidation rate. In the depicted embodiment, semiconductor layers 215 and semiconductor layers 220 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 215 include silicon germanium and semiconductor layers 220 include silicon, a silicon etch rate of semiconductor layers 220 is less than a silicon germanium etch rate of semiconductor layers 215. In some embodiments, semiconductor layers 215 and semiconductor layers 220 include the same material but with different constituent atomic percentages to achieve the etching selectivity and/or different oxidation rates. For example, semiconductor layers 215 and semiconductor layers 220 can include silicon germanium, where semiconductor layers 215 have a first silicon atomic percent and/or a first germanium atomic percent and semiconductor layers 220 have a second, different silicon atomic percent and/or a second, different germanium atomic percent. The present disclosure contemplates that semiconductor layers 215 and semiconductor layers 220 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 220 or portions thereof form channel regions of multigate device 200. In the depicted embodiment, each semiconductor layer stack 210 includes three semiconductor layers 215 and three semiconductor layers 220 configured to form three semiconductor layer pairs disposed over substrate 206, each semiconductor layer pair having a respective semiconductor layer 215 and a respective semiconductor layer 220. After undergoing subsequent processing, such configuration will result in multigate device 200 having three channels. However, the present disclosure contemplates embodiments where semiconductor layer stack 210 includes more or less semiconductor layers, for example, depending on a number of channels desired for multigate device 200 and/or design requirements of multigate device 200. For example, semiconductor layer stacks 210 can include two to ten semiconductor layers 215 and two to ten semiconductor layers 220. In furtherance of the depicted embodiment, semiconductor layers 215 have a thickness t1 and semiconductor layers 220 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 220), thickness t2 can be configured to achieve desired thickness of channels of multigate device 200, and thickness t1 and thickness t2 can be configured to achieve desired performance of multigate device 200. In some embodiments, semiconductor layers 220 include n-type and/or p-type dopants depending on their corresponding transistor region. For example, semiconductor layers 220 in n-type transistor regions 202A, 202C can include p-type dopants and semiconductor layers 220 in p-type transistor region 202B can include n-type dopants.

Figure 3:
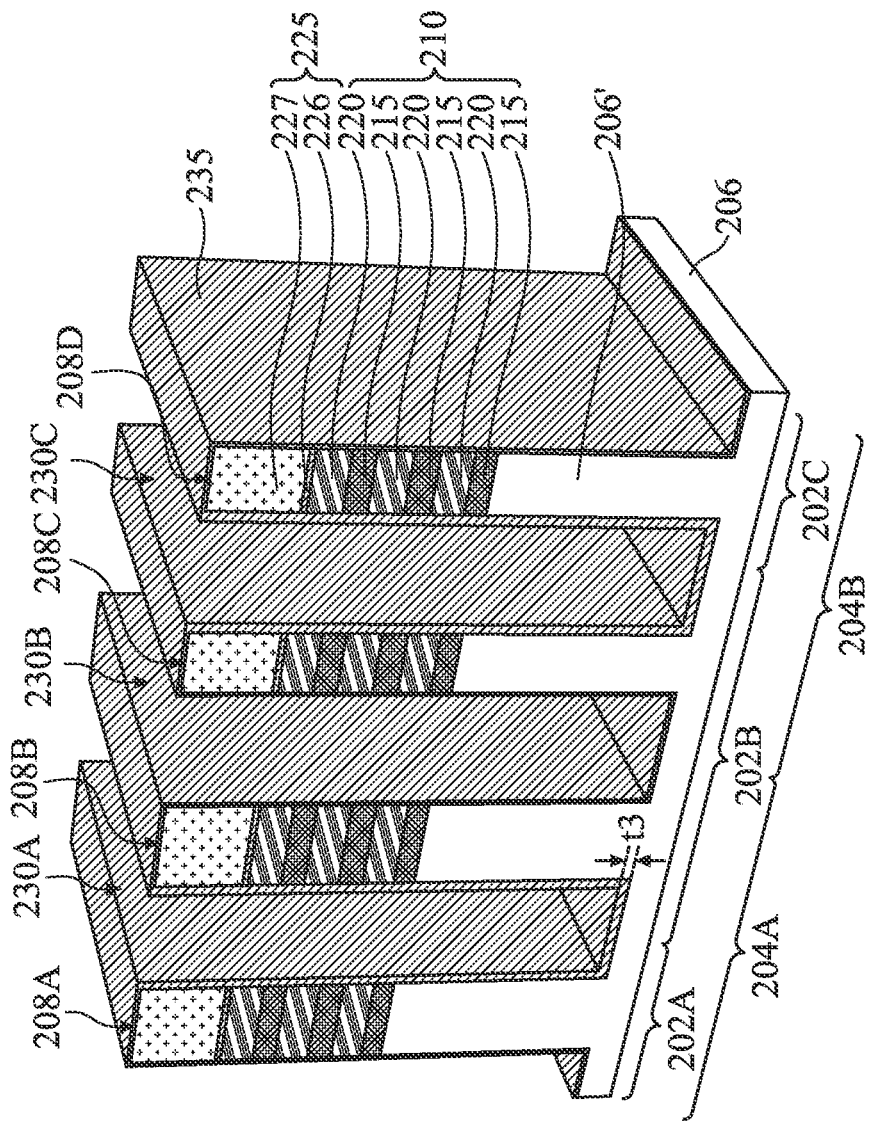

A trench 230A is defined between fin 208A and fin 208B, a trench 230B is defined between fin 208B and fin 208C, and a trench 230C is defined between fin 208C and fin 208D. For example, trench 230A has a sidewall defined by fin 208A, a sidewall defined by fin 208B, and a bottom defined by substrate 206 that extends between the sidewalls; trench 230B has a sidewall defined by fin 208B, a sidewall defined by fin 208C, and a bottom defined by substrate 206 that extends between the sidewalls; and trench 230C has a sidewall defined by fin 208C, a sidewall defined by fin 208D, and a bottom defined by substrate 206 that extends between the sidewalls. Turning to FIG. 3, a silicon liner 235 is formed over fins 208A-208D and substrate 206, such that silicon liner 235 partially fills trenches 230A-230C. For example, silicon liner 235 covers substrate 206 and fins 208A-208D, such that silicon liner 235 covers sidewalls and bottoms of trenches 230A-230C. In some embodiments, an atomic layer deposition (ALD) process is performed to deposit silicon liner 235 having a thickness t3 over multigate device 200. In some embodiments, thickness t3 is substantially uniform over various surfaces of multigate device 200. For example, thickness t3 along sidewalls of trenches 230A-230C (i.e., over sidewalls of fins 208A-208D) is substantially the same as thickness t3 along bottoms of trenches 230A-230C (i.e., over top surfaces of substrate 206) and thickness t3 along top surfaces of fins 208A-208D. In some embodiments, thickness t3 is about 1 nm to about 5 nm. In some embodiments, silicon liner 235 is formed by chemical vapor deposition (CVD), physical vapor deposition (PVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), other suitable methods, or combinations thereof. In some embodiments, silicon liner 235 includes n-type dopants and/or p-type dopants.

Figure 4:
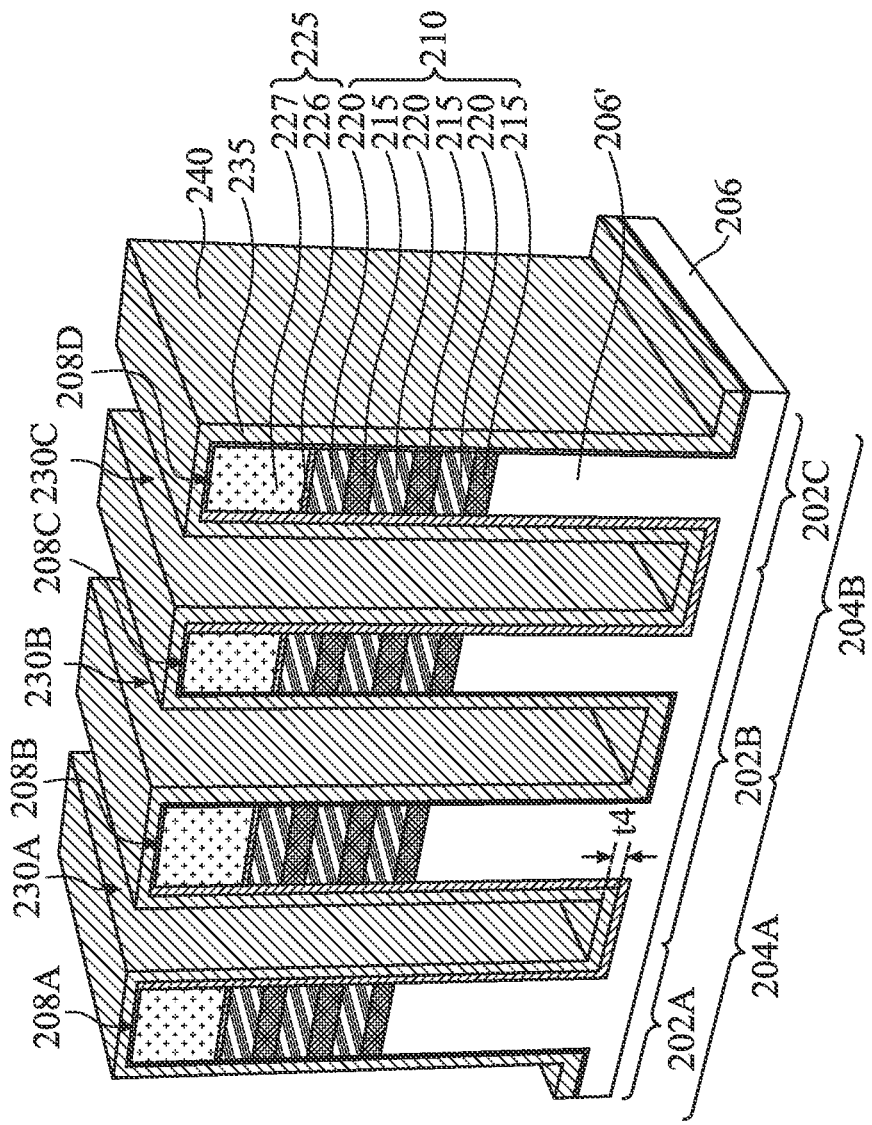

Turning to FIG. 4, a dielectric liner 240 is formed over silicon liner 235 and partially fills trenches 230A-230C. For example, dielectric liner 240 covers substrate 206 and fins 208A-208D, such that dielectric liner 240 covers sidewalls and bottoms of trenches 230A-230C. In some embodiments, an ALD process is performed to deposit dielectric liner 240 having a thickness t4 over multigate device 200. In some embodiments, thickness t4 is substantially uniform over various surfaces of multigate device 200. For example, thickness t4 along sidewalls of trenches 230A-230C (i.e., over sidewalls of fins 208A-208D) is substantially the same as thickness t4 along bottoms of trenches 230A-230C (i.e., over top surfaces of substrate 206) and thickness t4 along top surfaces of fins 208A-208D. In some embodiments, thickness t4 is about 2 nm to about 10 nm. In some embodiments, dielectric liner 240 is formed by CVD, PVD, HDPCVD, MOCVD, RPCVD, PECVD, LPCVD, APCVD, SAVCD, other suitable methods, or combinations thereof. Dielectric liner 240 includes a nitrogen-comprising dielectric material, such as a dielectric material that includes nitrogen in combination with silicon, carbon, and/or oxygen, and thus can be referred to as a nitride liner. For example, in some embodiments, dielectric liner 240 includes silicon nitride (SiN), silicon oxynitride (SiON), silicon carbon nitride (SiCN), and/or silicon oxycarbon nitride (SiOCN). In some embodiments, dielectric liner 240 includes n-type dopants and/or p-type dopants.

Figure 5:
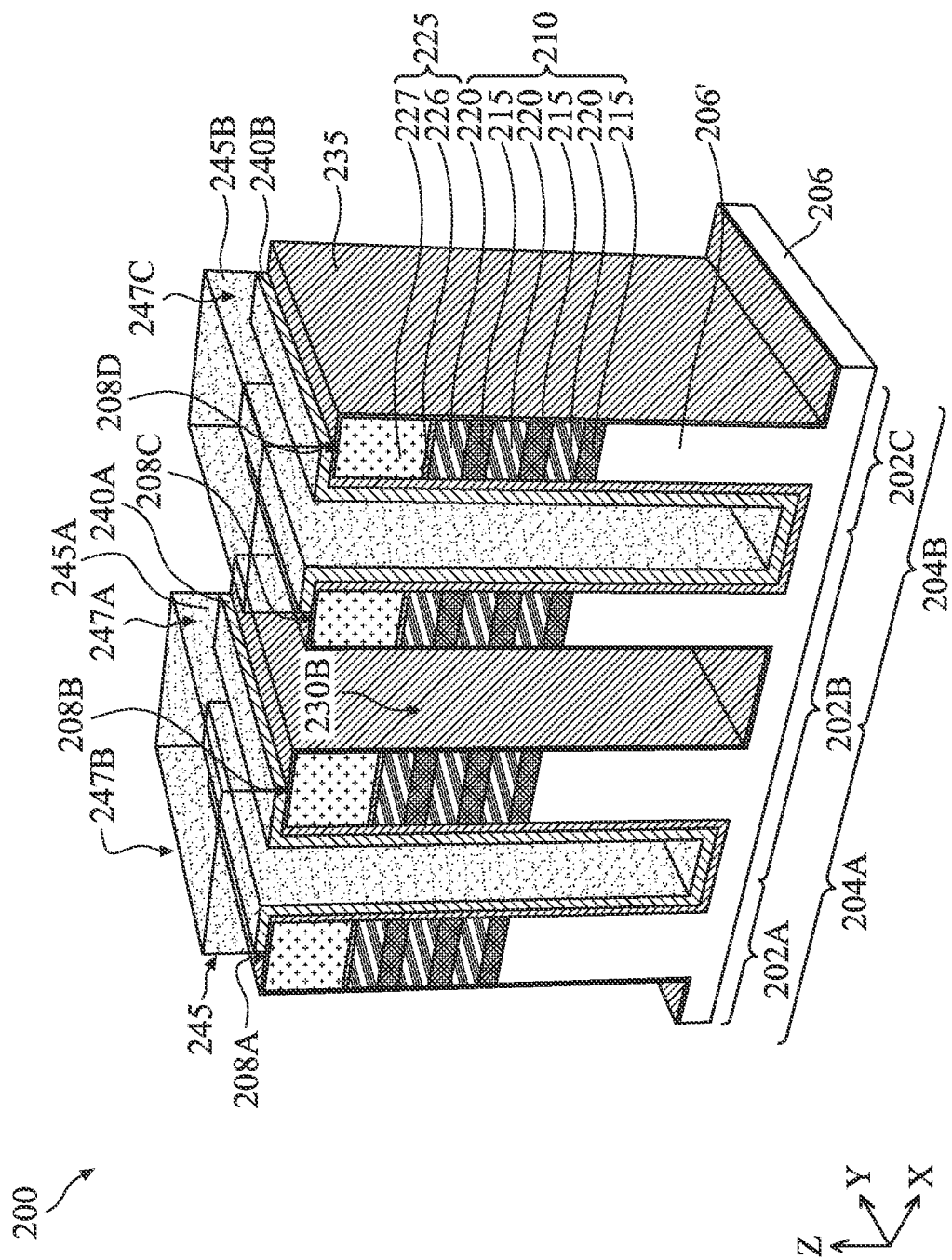
Figure 6:
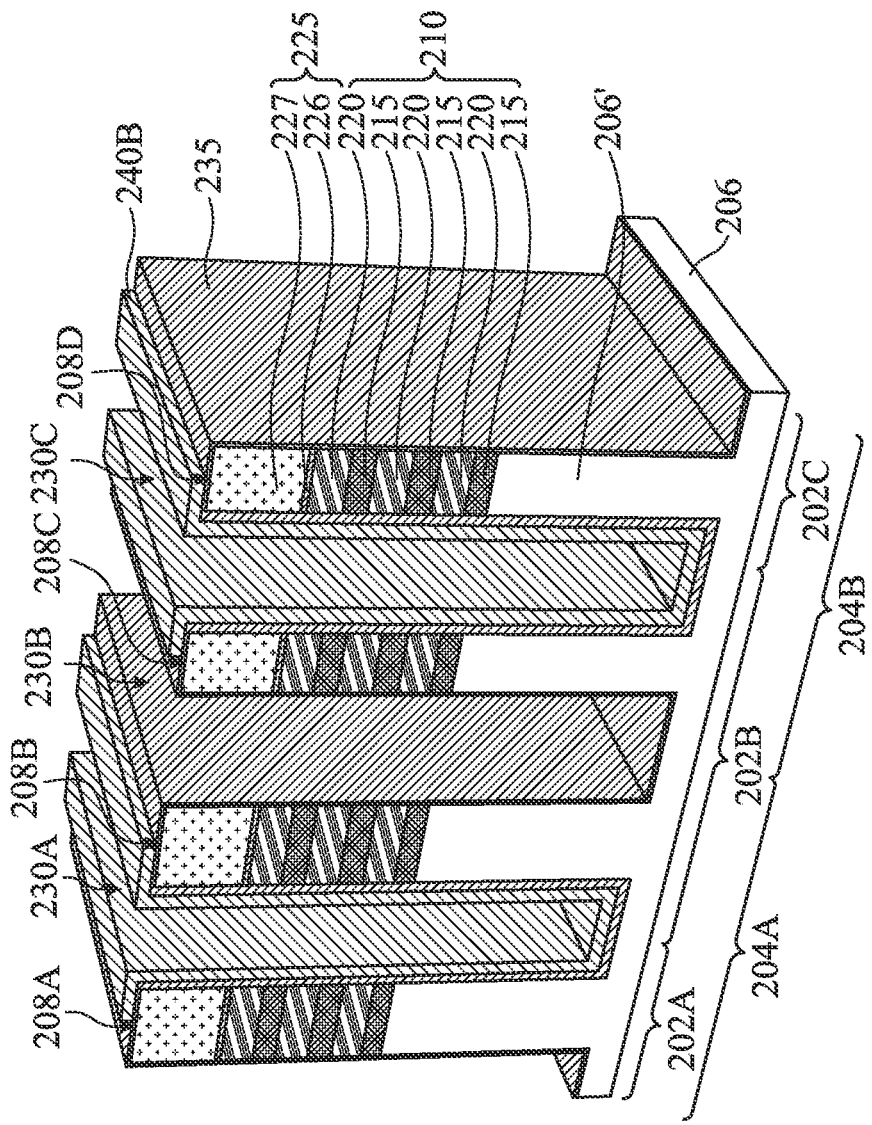

Turning to FIG. 5, dielectric liner 240 is removed from an interface region between different device regions, such as an interface region between first multigate device region 204A and second multigate device region 204B. For example, a lithography process, such as those described herein, is performed to form a patterned mask layer 245 having openings therein that expose interface regions of multigate device 200. In the depicted embodiment, patterned mask layer 245 includes an opening 247A that exposes a first interface region between first multigate device region 204A and second multigate device region 204B, an opening 247B that exposes a second interface region between first multigate device region 204A and another device region (for example, positioned left of first multigate device region 204A), and an opening 247C that exposes a third interface region between second multigate device region 204B and another device region (for example, positioned right of second multigate device region 204B). The first interface region, exposed by opening 247A, includes an interface between first multigate device region 204A and second multigate device region 204B, a portion of first multigate device region 204A adjacent to the interface, and a portion of second multigate device region 204B adjacent to the interface. Opening 247A thus exposes dielectric liner 240 disposed in trench 230B, along with a portion of dielectric liner 240 disposed over the top surface of fin 208B and a portion of dielectric liner 240 disposed over the top surface of fin 208C. Patterned mask layer 245 includes a mask portion 245A, which fills trench 230A and covers an interface region between n-type transistor region 202A and p-type transistor region 202B. Mask portion 245A covers a portion of the top surface of fin 208A and a portion of the top surface of fin 208B. Patterned mask layer 245 also includes a mask portion 245B, which fills trench 230C and covers an interface region between p-type transistor region 202B and n-type transistor region 202C. Mask portion 245B covers a portion of the top surface of fin 208C and a portion of the top surface of fin 208D.

An etching process is then performed to remove dielectric liner 240 from the exposed interface regions, thereby forming a dielectric liner 240A and a dielectric liner 240B. The etching process is a dry etching process, a wet etching process, or combination thereof. In the depicted embodiment, the etching process selectively etches dielectric liner 240 with minimal (to no) etch of silicon liner 235, such that silicon liner 235 remains in trenches at interface regions between different device regions, such as trench 230B spanning first multigate device region 204A and second multigate device region 204B. In FIG. 5, dielectric liner 240A spans an interface between n-type transistor region 202A and p-type transistor region 202B in first multigate device region 204A, and dielectric liner 240B spans an interface between p-type transistor region 202B and n-type transistor region 202C in second multigate device region 204B. Dielectric liner 240A covers sidewalls and bottom of trench 230A and dielectric liner 240B covers sidewalls and bottom of trench 230C. In some embodiments, dielectric liner 240A covers a portion of the top surface of fin 208A and a portion of the top surface of fin 208B, and dielectric liner 240B covers a portion of the top surface of fin 208C and a portion of the top surface of fin 208D. In some embodiments, patterned mask layer 245 is configured such that dielectric liner 240 is removed from the top surfaces of fins 208A-208D, dielectric liner 240A is disposed only in trench 230A, and dielectric liner 240B is disposed only in trench 230C. Thereafter, turning to FIG. 6, patterned mask layer 245 (here, mask portion 245A and mask portion 245B) is removed from multigate device 200, for example, by a resist stripping process, an etching process, other suitable process, or combination thereof. Accordingly, silicon liner 235 and dielectric liner 240A partially fill trench 230A, silicon liner 235 partially fills trench 230B, and silicon liner 235 and dielectric liner 240B partially fill trench 230C.

Figure 7:
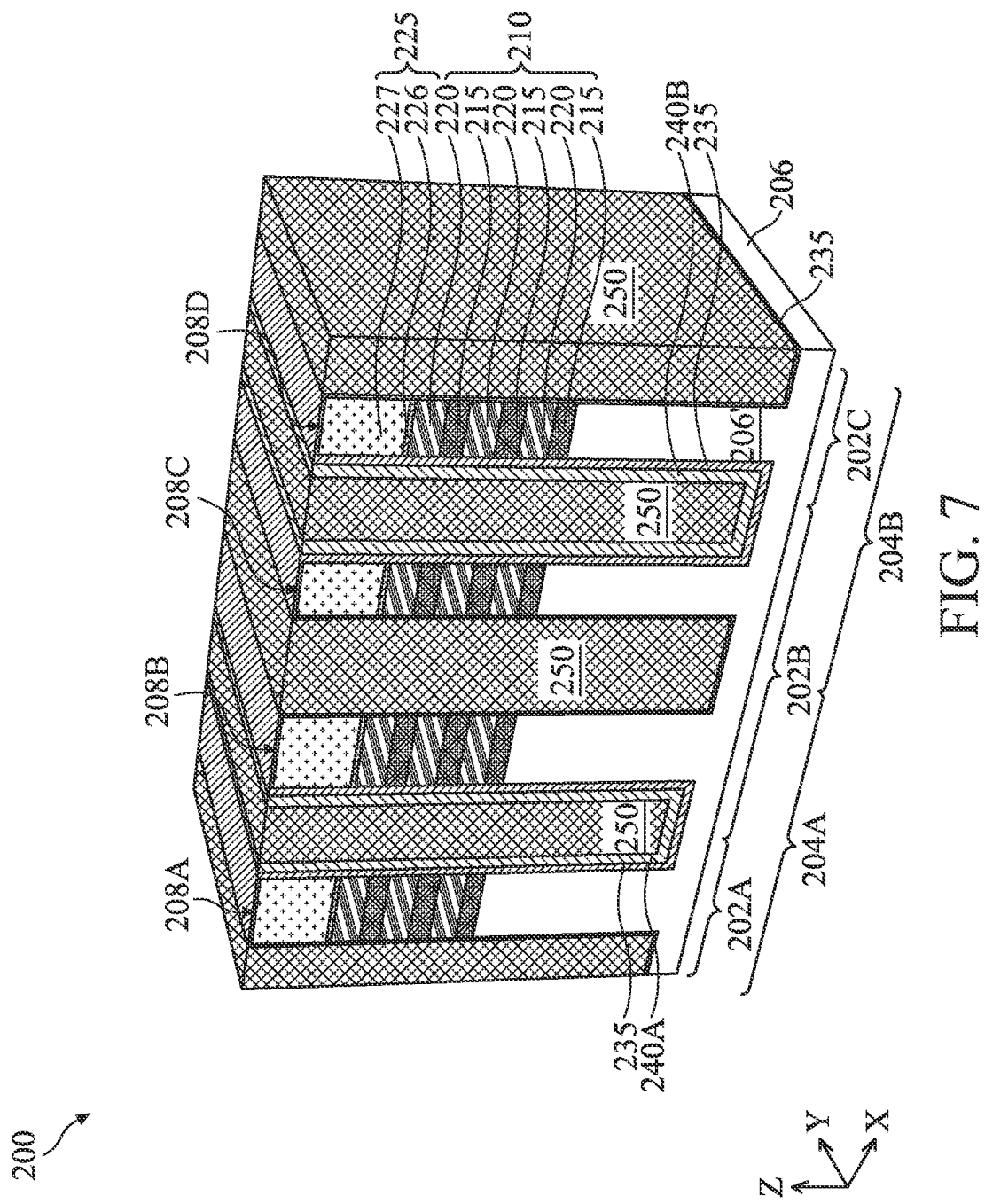

Turning to FIG. 7, remainders of trenches 230A-230C are filled with an oxide material 250. For example, a deposition process and a planarization process are performed to form oxide material 250 over silicon liner 235, dielectric liner 240A, and dielectric liner 240B and fill any remaining portions of trenches 230A-230C. In some embodiments, oxide material 250 is deposited by a flowable CVD (FCVD) process that includes, for example, depositing a flowable oxide material (for example, in a liquid state) over multigate device 200 and converting the flowable oxide material into a solid oxide material by an annealing process. The flowable oxide material can flow into trenches 230A-230C and conform to exposed surfaces of multigate device 200, enabling void free filling of trenches 230A-230C. For example, the FCVD process introduces a silicon-comprising precursor and an oxidizer (collectively referred to as reactants) into a deposition chamber, where the silicon-comprising precursor and the oxidizer react and condense onto exposed surfaces of multigate device 200 (for example, silicon liner 235, dielectric liner 240A, and/or dielectric liner 240B) to form the flowable oxide material. In some embodiments, the flowable oxide material is a flowable silicon-and-oxygen comprising material. In some embodiments, the silicon-containing precursor is a silazene-based precursor (e.g., polysilazane, silylamine, ditrisilylamine, dimethylsilane, trimethylsilane, tetramethylsilane, diethylsilane, other suitable silicon-containing precursor, or combinations thereof) and the oxidizer includes oxygen (e.g., $O_2$, $O_3$, hydrogen peroxide ($H_2O_2$), $H_2O$, other suitable oxygen-containing constituents, or combinations thereof). In some embodiments, the silicon-containing precursor, such as the silazene-based precursor, is introduced into the deposition chamber in a liquid or vapor state. In some embodiments, the oxidizer is excited to an ionized state by plasma, such that the oxidizer is introduced into the deposition chamber in a plasma state. In some embodiments, the silicon-containing precursor and/or the oxidizer is mixed with a carrier gas (including, for example, hydrogen, helium, argon, nitrogen, xenon, krypton, neon, other suitable constituent, or combinations thereof) before or after introduction into the deposition chamber. In the depicted embodiment, the annealing process converts the flowable silicon-and-oxygen material into a silicon-and-oxygen containing layer, such as a silicon oxide layer. Oxide material 250 may thus be referred to as a silicon oxide layer. In some embodiments, the annealing process is a thermal annealing that heats multigate device 200 to a temperature that can facilitate conversion of the flowable oxide material into the solid oxide material. In some embodiments, the annealing process exposes the flowable oxide material to UV radiation. In some embodiments, oxide material 250 is deposited by a high aspect ratio deposition (HARP) process. The HARP process can implement a TEOS precursor and an $O_3$ precursor. In some embodiments, oxide material 250 is deposited by HDPCVD. The HDPCVD can implement an $SiH_4$ precursor and an $O_2$ precursor. The present disclosure contemplates implementing other deposition processes and/or precursors to deposit oxide material 250.

The deposition process overfills trenches 230A-230C, such that a thickness of oxide material 250 is greater than a height of fins 208A-208D. After the deposition process, the planarization process, such as a chemical mechanical polishing (CMP) process, is performed on oxide material 250, thereby reducing the thickness of oxide material 250. In the depicted embodiment, silicon liner 235 functions as a planarization (e.g., CMP) stop layer, such that the planarization process is performed until reaching and exposing silicon liner 235 that is disposed over top surfaces of fins 208A-208D. Accordingly, after the planarization process, the thickness of oxide material is substantially equal to a sum of a height of fins 208A-208D and thickness t3 of silicon liner 235 disposed over the top surfaces of fins 208A-208D. The planarization process thus removes any oxide material 250, dielectric liner 240A, and dielectric liner 240B that is disposed over the top surfaces of fins 208A-280D. In some embodiments, top surfaces of oxide material 250, dielectric liner 240A, dielectric liner 240B, and silicon liner 235 are substantially planar after the planarization process. In some embodiments, an annealing process is subsequently performed to further cure and/or densify oxide material 250.

Figure 8:
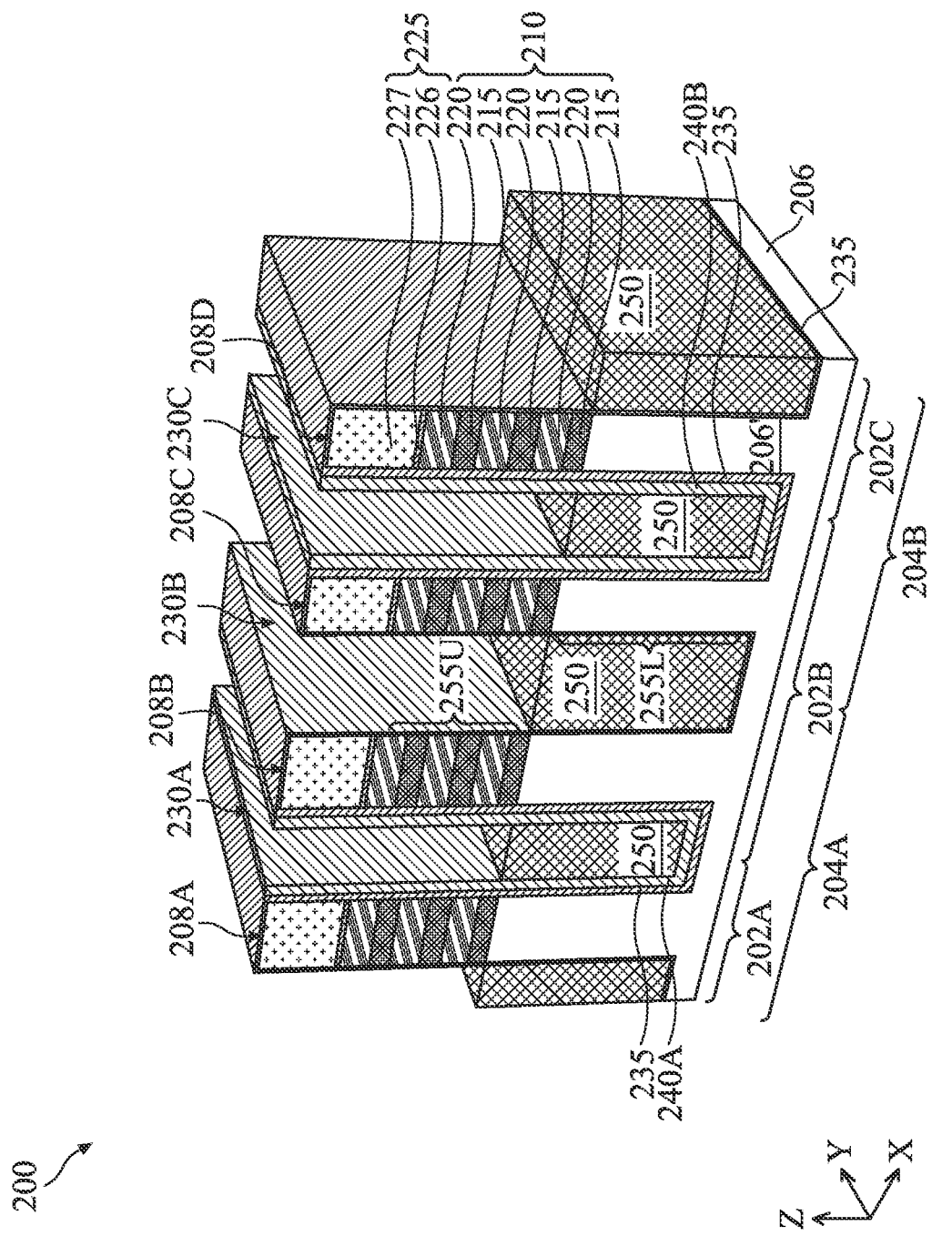

Turning to FIG. 8, oxide material 250 is recessed, such that fins 208A-208D extend (protrude) from between oxide material 250. For example, oxide material 250 surrounds a bottom portion of fins 208A-208D, thereby defining upper fin active regions 255U of fins 208A-208D (generally referring to a portion of fins 208A-208D that extends from top surfaces of oxide material 250) and lower fin active regions 255L of fins 208A-208D (generally referring to a portion of fins 208A-208D surrounded by oxide material 250, which extend from the top surface of substrate 206 to the top surfaces of oxide material 250). In FIG. 8, after recessing oxide material 250, lower portion of trench 230A is filled with oxide material 250, dielectric liner 240A, and silicon liner 235 while upper portion of trench 230A is partially filled with dielectric liner 240A and silicon liner 235; lower portion of trench 230B is filled with oxide material 250 and silicon liner 235 while upper portion of trench 230A is partially filled with silicon liner 235; and lower portion of trench 230C is filled with oxide material 250, dielectric liner 240A, and silicon liner 235 while upper portion of trench 230C is partially filled with dielectric liner 240A and silicon liner 235. In some embodiments, an etching process recesses oxide material 250 until achieving a desired (target) height of upper fin active regions 255U. In the depicted embodiment, the etching process proceeds until reaching fin portions 206' of fins 208A-208D, such that semiconductor layer stacks 210 define upper fin active regions 255U. In some embodiments, as depicted, top surfaces of fin portions 206' are substantially planar with top surfaces of oxide material 250 after the etching process. In some embodiments, fin portions 206' are partially exposed by the etching process, such that top surfaces of fin portions 206' are higher than top surfaces of oxide material 250 relative to the top surface of substrate 206 after the etching process. In some embodiments, semiconductor layer stacks 210 are partially, instead of fully exposed, by the etching process, such that top surfaces of fin portions 206' are lower than top surfaces of oxide material 250 relative to the top surface of substrate 206 after the etching process. The etching process is configured to selectively remove oxide material 250 with respect to silicon liner 235, dielectric liner 240A, and dielectric liner 240B. In other words, the etching process substantially removes oxide material 250 but does not remove, or does not substantially remove, silicon liner 235, dielectric liner 240A, and dielectric liner 240B. For example, an etchant is selected for the etch process that etches silicon oxide (i.e., oxide material 250) at a higher rate than silicon (i.e., silicon liner 235) and a silicon-and-nitrogen comprising material (i.e., dielectric liners 240A, 240B) (i.e., the etchant has a high etch selectivity with respect to silicon oxide). The etching process is a dry etching process, a wet etching process, or a combination thereof. In some embodiments, a dry etching process implements a nitrogen-comprising etch gas, such as $NF_3$ and $NH_3$ or $NH_3$ and HF, to selectively etch silicon oxide (i.e., oxide material 250) with respect to silicon (i.e., silicon liner 235) and silicon-and-nitrogen comprising material (i.e., dielectric liner 240A and dielectric liner 240B). In some embodiments, the etching process uses a patterned mask layer as an etch mask, where the patterned mask layer covers fins 208A-208D but has openings that expose oxide material 250.

Figure 9:
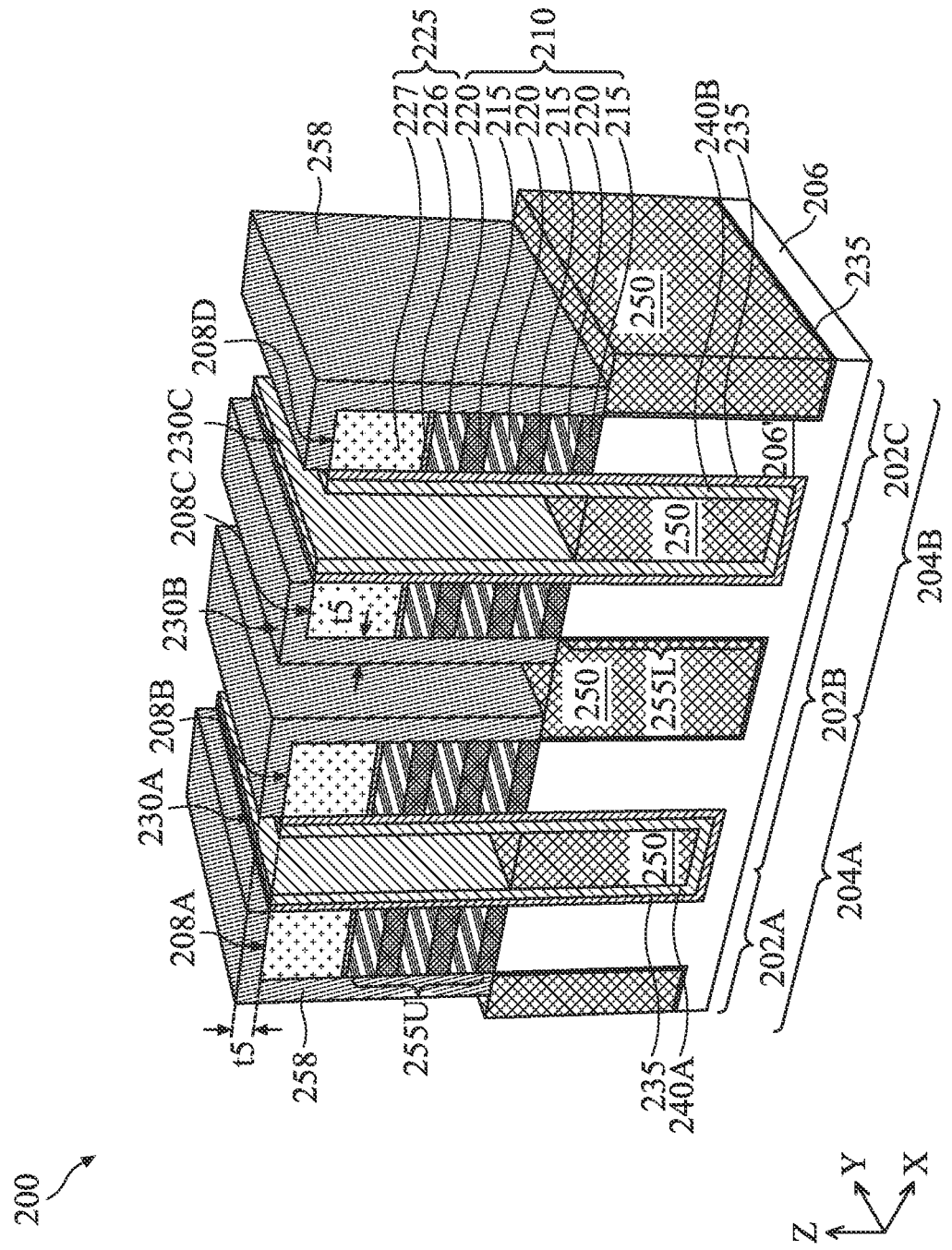

Turning to FIG. 9, a silicon germanium sacrificial layer 258 is formed over fins 208A-208D. In the depicted embodiment, silicon germanium sacrificial layer 258 is formed on top surfaces of fins 208A-208D and an upper portion of one sidewall of fins 208A-208D. In furtherance of the depicted embodiment, upper portion of trench 230B is partially filled with silicon germanium sacrificial layer 258, while upper portions of trench 230A and trench 230C are partially filled by dielectric liner 240A and dielectric liner 240B, respectively. Silicon germanium sacrificial layer 258 has a thickness t5 that is greater than thickness t3 of silicon liner 235. In some embodiments, thickness t5 is about 4 nm to about 15 nm. In some embodiments, a deposition process is performed that selectively grows a silicon germanium layer over exposed portions of silicon liner 235 (i.e., semiconductor surfaces) without growing the silicon germanium layer on exposed portions of dielectric liner 240A, dielectric liner 240B, and oxide material 250 (e.g., dielectric surfaces), where thermal conditions (e.g., growth temperatures) of the deposition process or a thermal process (e.g., an annealing process) performed after the deposition process drives (diffuses) germanium from the silicon germanium layer into the exposed portions of silicon liner 235, thereby causing the exposed portions of the silicon liner 235 to become a part of the silicon germanium layer. In some embodiments, the deposition process is an epitaxy process that uses CVD deposition techniques (for example, LPCVD, VPE, and/or UHV-CVD), molecular beam epitaxy, other suitable epitaxial growth processes, or combinations thereof. The epitaxy process can use gaseous and/or liquid precursors (e.g., a silane precursor and a germanium precursor), which interact with the composition of silicon liner 235. Silicon germanium sacrificial layer 258 can also be referred to as a silicon germanium cladding layer, a silicon germanium helmet, and/or a silicon germanium protection layer.

Figure 10:
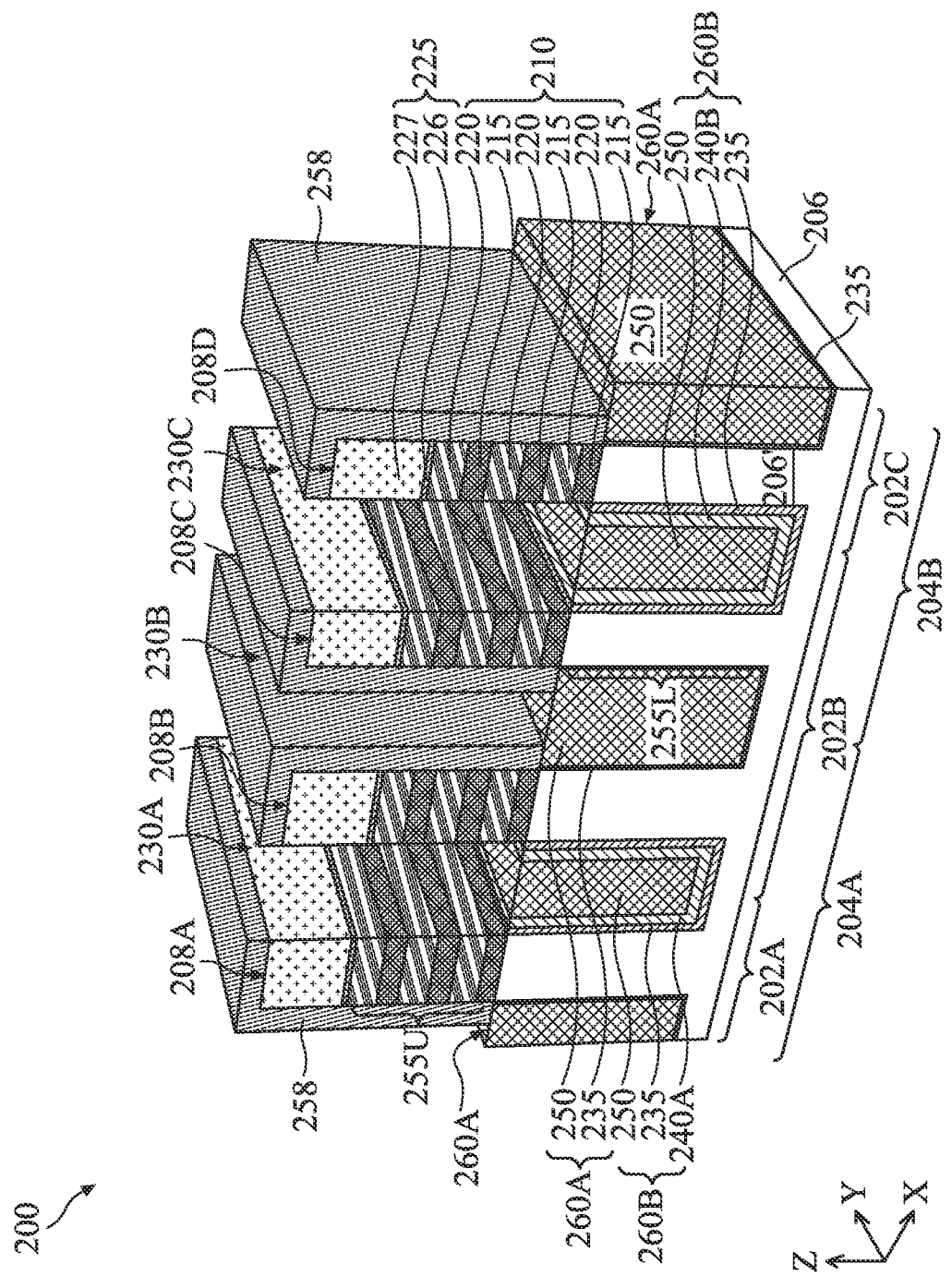

Turning to FIG. 10, dielectric liner 240A and dielectric liner 240B are removed from upper portions of trenches 230A-230C by an etching process, thereby forming isolation features 260A and isolation features 260B. Isolation features 260A electrically isolate active device regions and/or passive device regions of multigate device 200 from each other. For example, isolation features 260A separate and electrically isolate first multigate device region 204A from second multigate device region 204B, first multigate device region 204A form other active device regions and/or passive device regions of multigate device 200, and second multigate device region 204B form other active device regions and/or passive device regions of multigate device 200. In FIG. 10, one of isolation features 260A fills lower portion of trench 230B and is disposed between lower fin active regions 255L of fins 208B, 208C. Isolation features 260B electrically isolate devices within device regions of multigate device 200 from each other, such as different transistors within a device region. For example, isolation features 260B separate and electrically isolate n-type transistor region 202A from p-type transistor region 202B within first multigate device region 204A and p-type transistor region 202B from n-type transistor region 202C within second multigate device region 204B. In FIG. 10, isolation features 260B fill lower portions of trenches 230A, 230C, where one of isolation features 260B is disposed between lower fin active regions 255L of fins 208A, 208B and one of isolation features 260B is disposed between lower fin active regions 255L of fins 208C, 208D. Isolation features 260A, 260B include different liners—isolation features 260A include silicon liner 235 disposed on sidewalls of lower fin active regions 255L and oxide material 250 disposed on silicon liner 235, while isolation features 260B includes silicon liner 235 disposed on sidewalls of lower fin active regions 255L, a dielectric liner (e.g., dielectric liner 240A or dielectric liner 240B) disposed on silicon liner 235, and oxide material 250 disposed on the dielectric liner. In isolation features 260A, 260B, oxide material 250 may be referred to as oxide layer 250. Oxide material 250 can also be referred to as a bulk dielectric and/or bulk dielectric layer of isolation features 260A, 260B. Various dimensions and/or characteristics of isolation features 260A, 260B can be configured during the processing associated with FIGS. 3-10 to achieve shallow trench isolation (STI) structures, deep trench isolation (DTI) structures, local oxidation of silicon (LOCOS) structures, other suitable isolation structures, or combinations thereof. In the depicted embodiment, isolation features 260A and isolation features 260B are STIs.

The etching process is configured to selectively remove dielectric liners 240A, 240B with respect to silicon germanium sacrificial layer 258 and oxide material 250. In other words, the etching process substantially removes dielectric liners 240A, 240B but does not remove, or does not substantially remove, silicon germanium sacrificial layer 258 and oxide material 250. For example, an etchant is selected for the etch process that etches silicon nitride (i.e., dielectric liners 240A, 240B) at a higher rate than silicon germanium (i.e., silicon germanium sacrificial layer 258) and silicon oxide (i.e., oxide material 250) (i.e., the etchant has a high etch selectivity with respect to silicon nitride). The etching process is a dry etching process, a wet etching process, or a combination thereof. In some embodiments, a dry etching process uses an etch gas that includes $CHF_3$ and/or $O_2$ to selective etch silicon nitride (i.e., dielectric liners 240A, 240B) with respect to silicon germanium (i.e., silicon germanium sacrificial layer 258) and silicon oxide (i.e., oxide material 250). In some embodiments, the etch process includes multiple steps.

Figure 11:
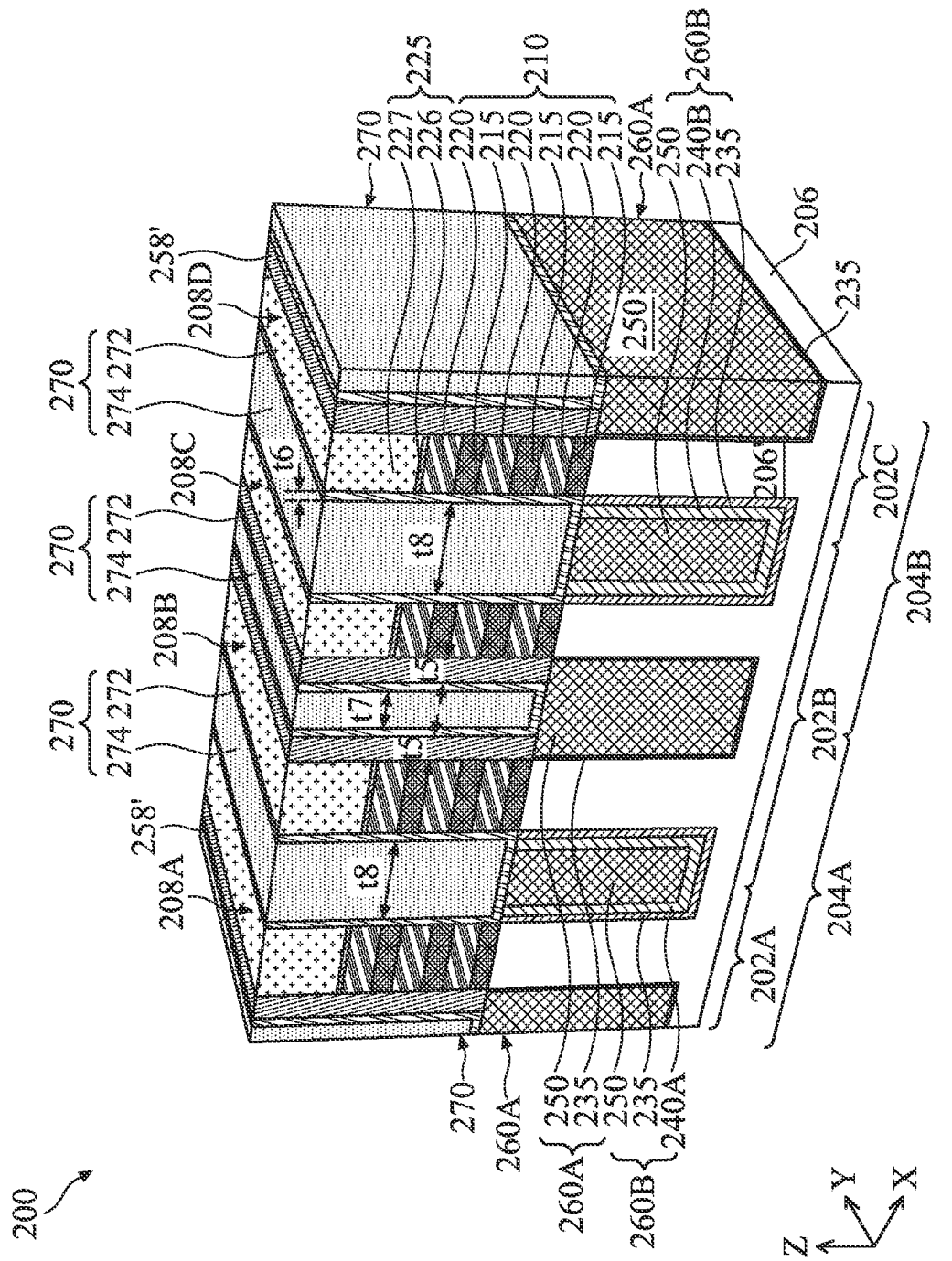

Turning to FIG. 11, upper portions of trenches 230A-230C are filled with dielectric features 270, each of which includes a dielectric liner 272 and an oxide layer 274 disposed over dielectric liner 272. In the depicted embodiment, dielectric liner 272 includes a dielectric material having a dielectric constant that is less than about 8.0

(k<8.0). For purposes of the present disclosure, such dielectric materials are referred to as low-k dielectric materials, and dielectric liner 272 can be referred to as a low-k dielectric liner. In some embodiments, dielectric liner 272 includes a dielectric material having a dielectric constant of about 1.0 to about 8.0. In some embodiments, dielectric liner 272 includes a nitrogen-comprising dielectric material, such as a dielectric material that includes nitrogen in combination with silicon, carbon, and/or oxygen. In such embodiments, dielectric liner 272 can also be referred to as a nitride liner. For example, dielectric liner 272 includes silicon nitride, silicon carbon nitride, silicon oxycarbonitride, or combinations thereof. In some embodiments, dielectric liner 272 includes n-type dopants and/or p-type dopants. For example, dielectric liner 272 can be a boron-doped nitride liner. In some embodiments, dielectric liner 272 includes a dielectric material having a dielectric constant that is less than a dielectric constant of silicon dioxide ($SiO_2$) (k≈3.9), such as fluorine-doped silicon oxide (often referred to as fluorosilicate glass (FSG)), carbon-doped silicon oxide (often referred to as carbon-doped FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other low-k dielectric material, or combinations thereof. In some embodiments, dielectric liner 272 includes boron silicate glass (BSG), phosphosilicate glass (PSG), and/or boron-doped phosphosilicate glass (BPSG). In some embodiments, oxide layer 274 is similar to oxide material 250 and thus may be formed and include materials as described above with reference to oxide material 250. For example, oxide layer 274 includes silicon and oxygen, and thus can be referred to as a silicon oxide layer.

In some embodiments, dielectric features 270 are formed by depositing a dielectric layer over multigate device 200, where the dielectric layer partially fills upper portions of trenches 230A-230C; depositing an oxide material over the dielectric layer, where the oxide material fills a remainder of upper portions of trenches 230A-230C; and performing a planarization process, such as a chemical mechanical polishing (CMP) process, to remove any of the oxide material and/or the dielectric layer that is disposed over top surfaces of fins 208-208D. For example, patterning layer 225 functions as a planarization (e.g., CMP) stop layer, such that the planarization process is performed until reaching and exposing patterning layer 225 of fins 208A-208D. A remainder of the oxide material and the dielectric layer form each dielectric liner 272 and each oxide layer 274 of dielectric features 270. In such embodiments, the planarization process removes portions of silicon germanium sacrificial layer 258 disposed over top surfaces of fins 208A-208D, thereby forming silicon germanium sacrificial features 258'. In some embodiments, an ALD process is performed to deposit the dielectric layer, such that dielectric liner 272 has a thickness t6 over multigate device 200. In some embodiments, an LPCVD process is performed to deposit the dielectric layer, such that dielectric liner 272 has thickness t6 over multigate device 200. In some embodiments, thickness t6 is substantially uniform over various surfaces of multigate device 200. For example, thickness t6 along sidewalls of upper portions of trenches 230A-230C (i.e., over sidewalls of fins 208A-208D and top and sidewall surfaces of silicon germanium sacrificial layer 258) is substantially the same as thickness t6 along bottoms of upper portions of trenches 230A-230C (i.e., over top surfaces of isolation features 260A, 260B). In some embodiments, thickness t6 is about 3 nm to about 10 nm. In some embodiments, dielectric liner 272 is formed by CVD, PVD, HDPCVD, MOCVD, RPCVD, PECVD, APCVD, SAVCD, other suitable deposition processes, or combinations thereof. In some embodiments, the oxide material is deposited over the dielectric layer by FCVD, HPCVD, HARP, CVD, and/or other suitable deposition process. In FIG. 11, dielectric features 270 fill an entirety of upper portion of trench 230A and an entirety of upper portion of trench 230C, whereas in trench 230B, silicon germanium sacrificial features 258' partially fill upper portion of trench 230B and one of dielectric features 270 fills a remainder of upper portion of trench 230B. Accordingly, a thickness t7 of oxide layer 274 in upper portion of trench 230B is less than a thickness t8 of oxide layer 274 in upper portions of trenches 230A, 230C. In some embodiments, thickness t7 is at least about 4 nm, and thickness t8 is about 4 nm to about 20 nm. In trench 230A, dielectric liner 272 covers sidewalls of upper fin active regions 255A of fin 208A and fin 208B (which define sidewalls of upper portion of trench 230A) and a top surface of isolation feature 260B filling bottom portion of trench 230A (which defines a bottom of upper portion of trench 230A). In trench 230B, dielectric liner 272 covers sidewalls of silicon germanium sacrificial features 258' (disposed in upper portion of trench 230B) and a top surface of isolation feature 260A filling bottom portion of trench 230B (which defines a bottom of upper portion of trench 230B). In trench 230C, dielectric liner 272 covers sidewalls of upper fin active regions 255A of fin 208C and fin 208D (which define sidewalls of upper portion of trench 230C) and a top surface of isolation feature 260B filling bottom portion of trench 230C (which defines a bottom of upper portion of trench 230C).

Figure 12:
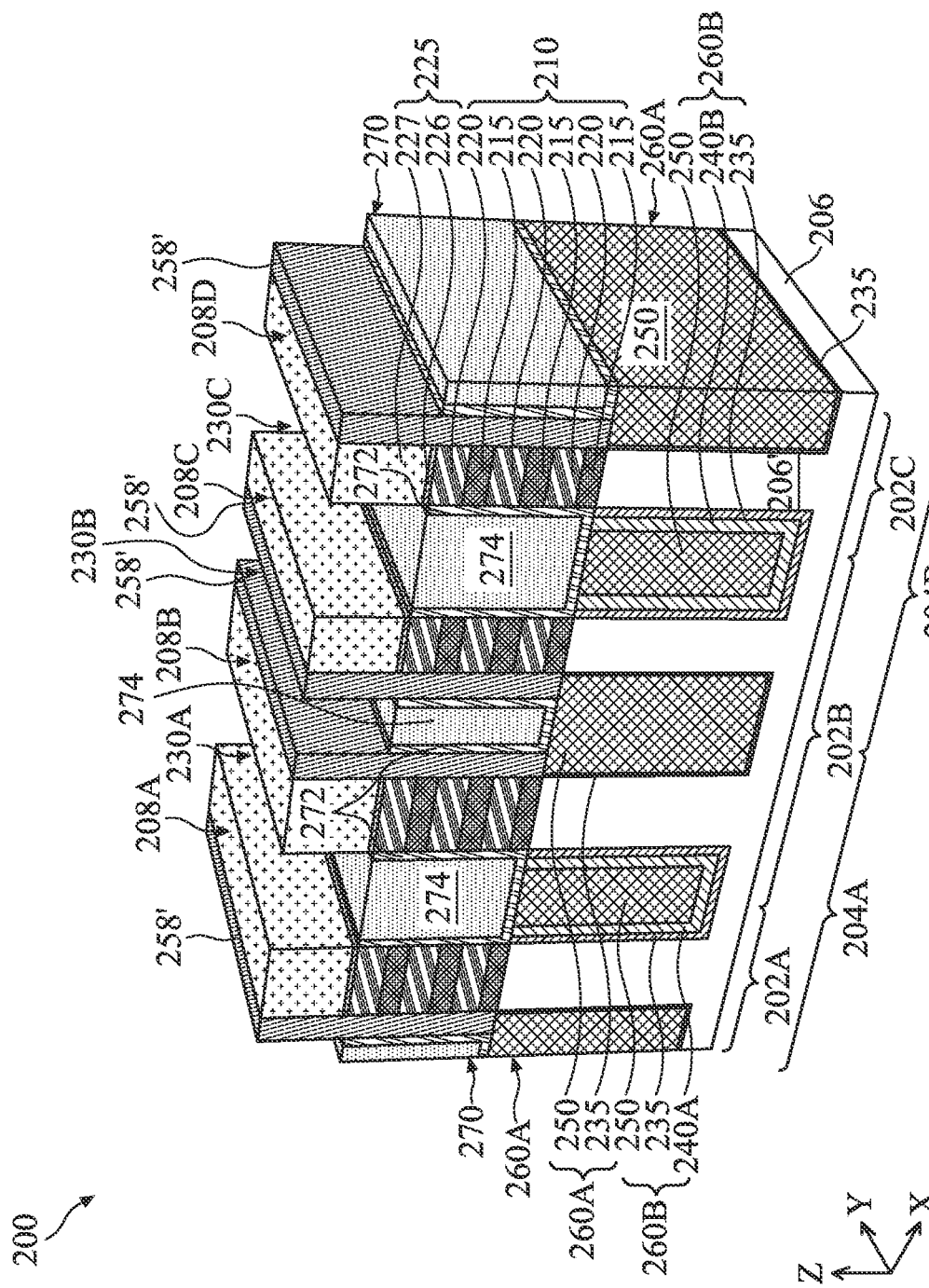

Turning to FIG. 12, dielectric features 270 are partially removed from trenches 230A-230C. For example, dielectric features 270 are recessed to expose sidewalls of patterning layer 225 and portions of silicon germanium sacrificial features 258' disposed along sidewalls of patterning layer 225. After recessing, dielectric features 270 partially fill upper portions of trenches 230A-230C (i.e., fills a lower portion of upper portions of trenches 230A-230C). In some embodiments, an etching process recesses dielectric features 270 until reaching semiconductor layer stacks 210 of fins 208A-208D. For example, top surfaces of semiconductor layer stacks 210 (here, top surfaces of topmost semiconductor layers 220 of semiconductor layer stacks 210) are substantially planar with top surfaces of dielectric features 270 after the etching process. In some embodiments, sidewalls of semiconductor layer stacks 210 are partially exposed by the etching process, such that top surfaces of dielectric features 270 are lower than top surfaces of semiconductor layer stacks 210 relative to the top surface of substrate 206 after the etching process. The etching process is configured to selectively remove dielectric liner 272 and oxide layer 274 with respect to silicon germanium sacrificial features 258' and patterning layer 225. In other words, the etching process substantially removes dielectric liner 272 and oxide layer 274 but does not remove, or does not substantially remove, silicon germanium sacrificial features 258' and patterning layer 225. In some embodiments, the etch process includes multiple steps, for example, implementing a first etchant to recess oxide layer 274 and a second etchant to recess dielectric liner 272. For example, a first etch step removes oxide layer 274 with high etch selectivity relative to dielectric liner 272 and/or patterning layer 225, and a second etch step removes dielectric liner 272 with high etch selectivity relative to semiconductor layer stacks 210, silicon germanium features 258', and/or patterning layer 225. In some embodiments, a first etchant of the first etch step can etch silicon oxide (i.e., oxide layer 274) at a higher rate than silicon carbon nitride (i.e., dielectric liner 272) and/or silicon nitride (i.e., patterning layer 225) (i.e., the etchant has a high etch selectivity with respect to silicon oxide). In some embodiments, a second etchant of the second etch step can etch silicon carbon nitride (i.e., dielectric liner 272) at a higher rate than silicon germanium (i.e., silicon germanium sacrificial features 258' and/or semiconductor layers stacks 210), silicon (i.e., semiconductor layer stacks 210), and/or silicon nitride (i.e., patterning layer 225) (i.e., the etchant has a high etch selectivity with respect to silicon carbon nitride). The etching process is a dry etching process, a wet etching process, or a combination thereof. In some embodiments, a dry etching process uses an etch gas that includes $NF_3$, $O_2$ and $H_2$ to achieve selective etching of dielectric liner 272 (including, for example, SiCN, SiOCN, and/or SiOC) with respect to silicon germanium sacrificial features 258' and patterning layer 225 (including, for example, SiN). In some embodiments, the etching process uses a patterned mask layer as an etch mask, where the patterned mask layer covers silicon germanium sacrificial features 258' and patterning layer 225 but has openings therein that expose dielectric liner 272 and oxide layer 274.

Figure 13:
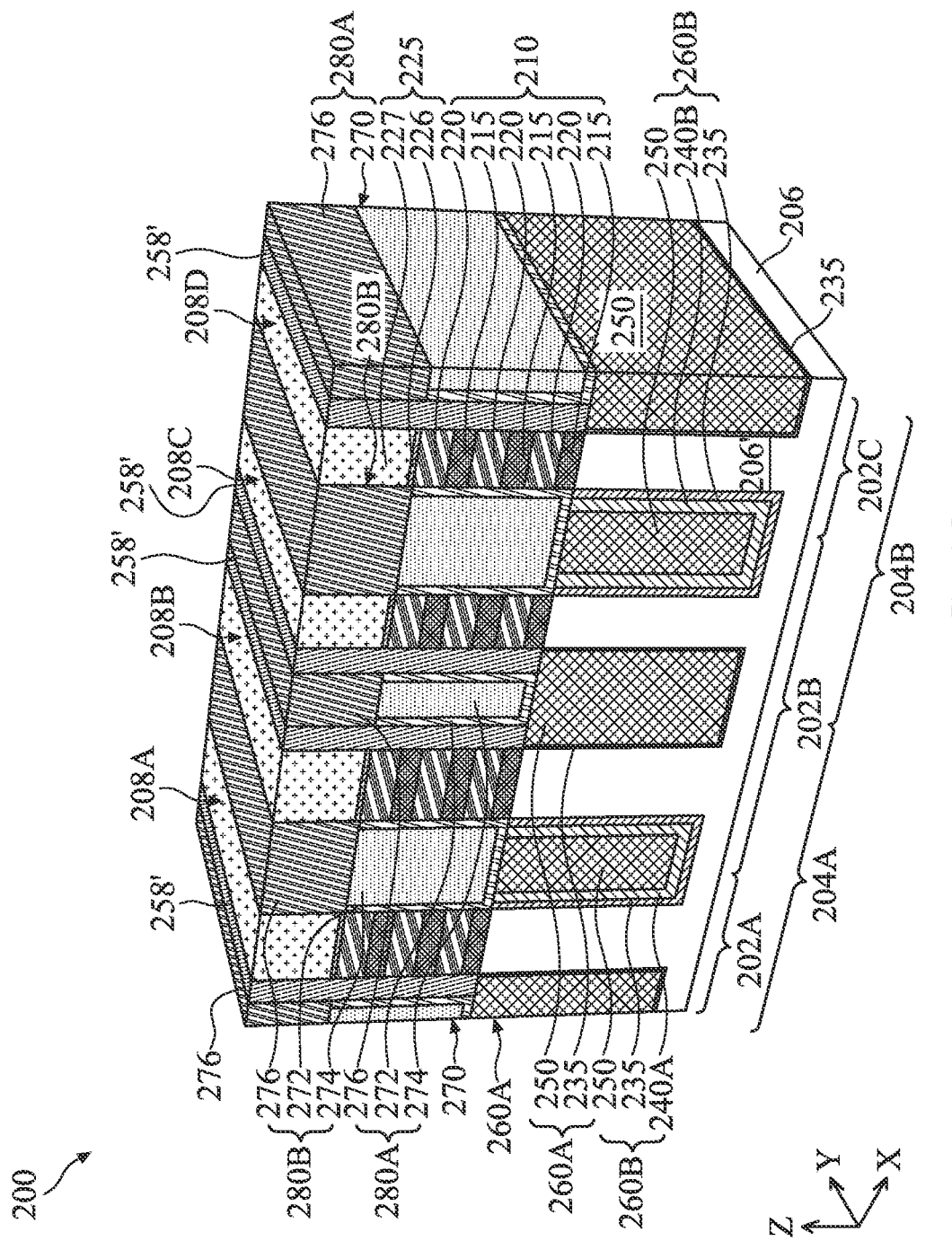

Turning to FIG. 13, dielectric layers 276 are formed over dielectric features 270 to fill a remainder of upper portions of trenches 230A-230C, thereby forming dielectric fins 280A over isolation features 260A and dielectric fins 280B over isolation features 260B. Each of dielectric fins 280A, 280B includes a respective dielectric layer 276 disposed over a respective dielectric feature 270. In the depicted embodiment, because some of the trenches (e.g., trench 230B) are partially filled with silicon germanium sacrificial features 258', sidewalls of fins 208A-208D physically, directly contact dielectric fins 280B, but do not physically, directly contact dielectric fins 280A. For example, each of fins 208A-208D has a first sidewall that physically contacts a respective dielectric fin 280B and a second sidewall that is separated from a respective dielectric fin 280A by a respective silicon germanium sacrificial feature 258', such that the second sidewall does not physically contact the respective dielectric fin 280A. Further, because some of the trenches (e.g., trench 230B) are partially filled with silicon germanium sacrificial features 258', a width of dielectric fins 280A along the x-direction is less than a width of isolation features 260A along the x-direction, whereas a width of dielectric fins 280B along the x-direction is substantially the same as a width of isolation features 260B along the x-direction. In some embodiments, dielectric layers 276 are formed by depositing a dielectric material over multigate device 200, where the dielectric material fills remaining upper portions of trenches 230A-230C, and performing a planarization process, such as a CMP process, to remove any of the dielectric material that is disposed over top surfaces of fins 208A-208D. For example, patterning layer 225 can function as a planarization stop layer, such that the planarization process is performed until reaching and exposing patterning layer 225 of fins 208A-208D. A remainder of the dielectric material forms dielectric layers 276. In some embodiments, the dielectric material is formed by ALD, CVD, PVD, HDPCVD, MOCVD, RPCVD, PECVD, APCVD, SAVCD, other suitable deposition processes, or combinations thereof. Dielectric layers 276 include a dielectric material having a dielectric constant that is greater than a dielectric constant of the dielectric material of dielectric liners 272. For example, dielectric layers 276 include a dielectric material having a dielectric constant that is greater than or equal to about 8.0 (k≥8.0). For purposes of the present disclosure, such dielectric materials are referred to as high-k dielectric materials, and dielectric layers 276 can be referred to as a high-k dielectric layers. In some embodiments, dielectric layers 276 includes a dielectric material having a dielectric constant of about 8.0 to about 30.0. In some embodiments, dielectric layers 276 include a metal-and-oxygen-comprising dielectric material having, for example, a dielectric constant of about 9.0 to about 30.0. In such embodiments, the metal can be hafnium, aluminum, and/or zirconium. In such embodiments, dielectric layers 276 can also be referred to as metal oxide layers. For example, dielectric layers 276 include hafnium oxide (e.g., $HfO_x$), aluminum oxide ($AlO_x$), zirconium oxide ($ZrO_x$), or combinations thereof, where x is a number of oxygen atoms in the dielectric material of dielectric layers 276. In some embodiments, dielectric layers 276 include n-type dopants and/or p-type dopants. In some embodiments, dielectric layers 276 include $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, (Ba, Sr)$TiO_3$, $HfO_2$—$Al_2O_3$, other suitable high-k dielectric material, or combinations thereof.

Figure 14:
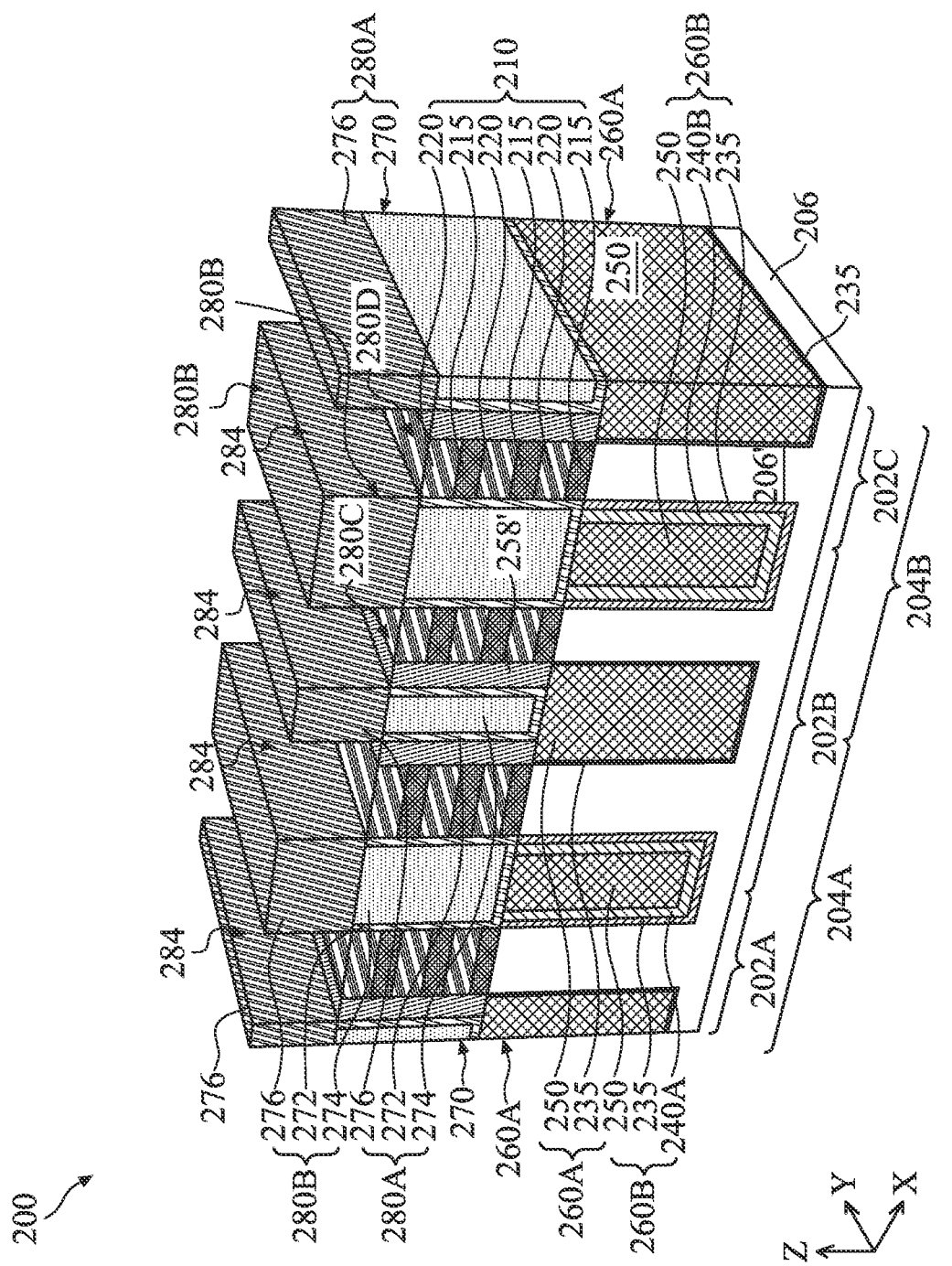

Turning to FIG. 14, an etching process is performed to remove patterning layer 225 from fins 208A-208D and portions of silicon germanium sacrificial features 258' disposed along sidewalls of patterning layer 225, thereby forming openings 284 (defined between dielectric layers 286) that expose semiconductor layer stacks 210 of fins 208A-208D. The etching process is configured to selectively remove patterning layer 225 and silicon germanium sacrificial features 258' with respect to dielectric layers 276 and semiconductor layers 220 of semiconductor layer stacks 210. In other words, the etching process substantially removes patterning layer 225 and silicon germanium sacrificial features 258' (in particular, portions of silicon germanium sacrificial features 258' disposed along sidewalls of patterning layer 225) but does not remove, or does not substantially remove, dielectric layers 276 and semiconductor layers 220. In some embodiments, the etch process includes multiple steps, for example, implementing a first etchant to remove silicon germanium sacrificial features 258' and a second etchant to remove patterning layer 225. For example, a first etch step removes silicon germanium sacrificial features 258' with high etch selectivity relative to dielectric layers 276 and/or patterning layer 225, and a second etch step removes patterning layer 225 with high etch selectivity relative to dielectric layers 276 and/or silicon germanium features 258'. In some embodiments, a first etchant of the first etch step can etch silicon germanium (i.e., silicon germanium sacrificial features 258') at a higher rate than high-k dielectric material (i.e., dielectric layers 276) and/or silicon nitride (i.e., patterning layer 225) (i.e., the etchant has a high etch selectivity with respect to silicon germanium). In some embodiments, a second etchant of the second etch step can etch silicon nitride (i.e., patterning layer 225) at a higher rate than high-k dielectric material (i.e., dielectric layers 276), silicon germanium (i.e., silicon germanium sacrificial features 258' and/or semiconductor layers stacks 210), and silicon (i.e., semiconductor layer stacks 210) (i.e., the etchant has a high etch selectivity with respect to silicon nitride). The etching process is a dry etching process, a wet etching process, or a combination thereof. In some embodiments, the first etchant is a wet etchant that includes $NH_4OH$, $H_2O_2$, and $H_2O$, a wet etchant that includes $O_3$ and DHF, a dry etch gas that includes $F_2$ and $NH_3$, or combinations thereof. In some embodiments, the second etchant is a wet etchant that includes H₃PO₄. In some embodiments, the etching process uses a patterned mask layer as an etch mask, where the patterned mask layer covers dielectric layers 276 but has openings therein that expose patterning layer 225 and, in some embodiments, portions of silicon germanium sacrificial features 258' disposed along sidewalls of patterning layer 225.

Figure 15:
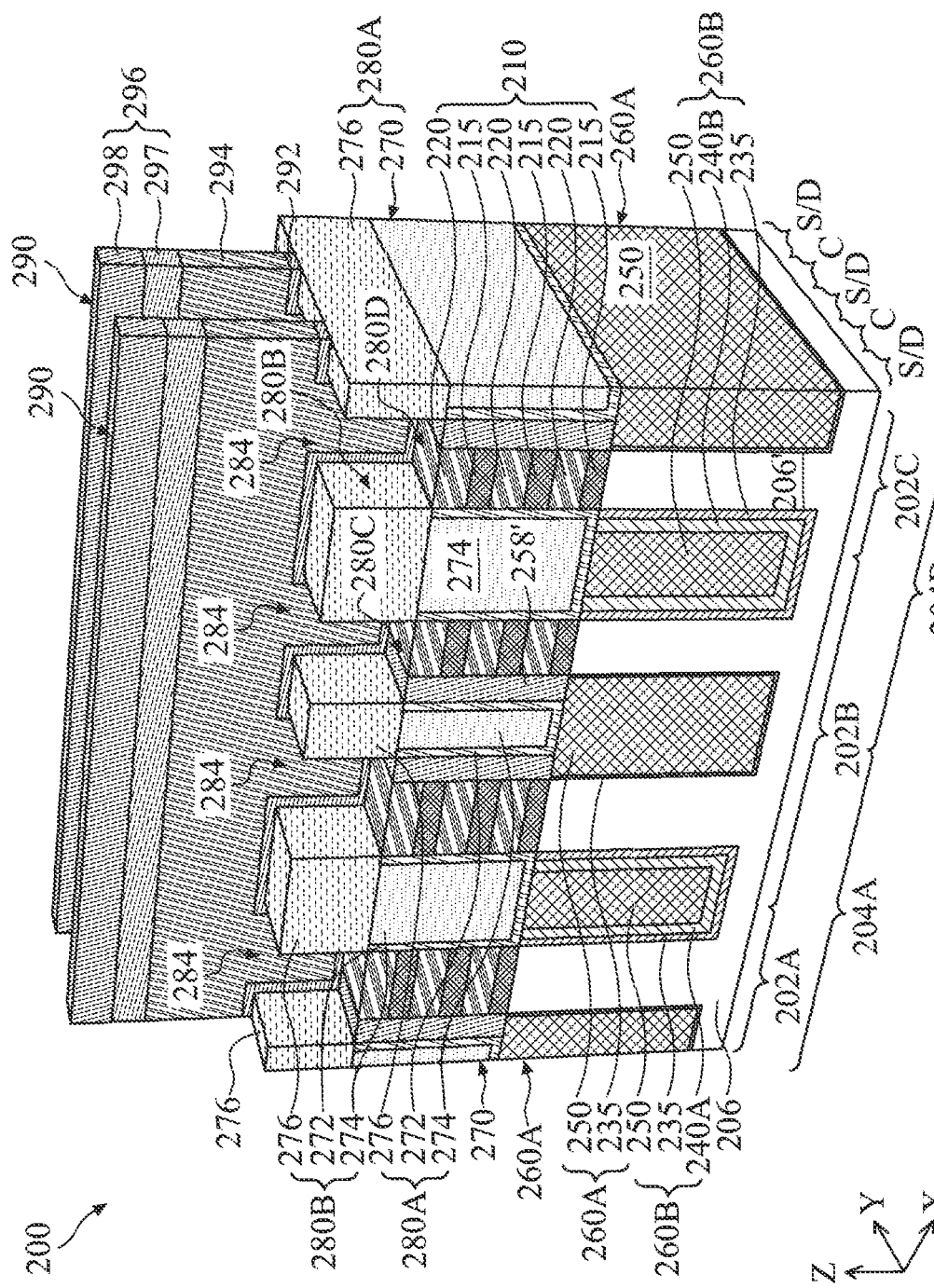

Turning to FIG. 15, dummy gate stacks 290 are formed over portions of fins 208A-208D, dielectric fins 280A, and dielectric fins 280B. Dummy gate stacks 290 fill portions of openings 284. Dummy gate stacks 290 extend lengthwise in a direction that is different than (e.g., orthogonal to) the lengthwise direction of fins 208A-208D. For example, dummy gate stacks 290 extend substantially parallel to one another along the x-direction, having a length defined in the x-direction, a width defined in the y-direction, and a height defined in the z-direction. Dummy gate stacks 290 are disposed over channel regions (C) of multigate device 200 and between source/drain regions (S/D) of multigate device 200, which are exposed by a remainder of openings 284 in dielectric layers 286. In the X-Z plane, dummy gate stacks 290 are disposed on top surfaces of fins 208A-208D (in particular, top surfaces of semiconductor layer stacks 210), top surfaces of dielectric layers 276 of dielectric fins 280A, 280B, and sidewall surfaces of dielectric layers 276 of dielectric fins 280A, 280B, such that dummy gate stacks 290 wrap portions of dielectric layers 276 of dielectric fins 280A, 280B. In the Y-Z plane, dummy gate stacks 290 are disposed over top surfaces of respective channel regions of fins 208A-208D, such that dummy gate stacks 290 interpose respective source/drain regions of fins 208A-208D. Each dummy gate stack 290 includes a dummy gate dielectric 292, a dummy gate electrode 294, and a hard mask 296 (including, for example, a first mask layer 297 and a second mask layer 298). Dummy gate dielectric 292 includes a dielectric material, such as silicon oxide, a high-k dielectric material, other suitable dielectric material, or combinations thereof. In some embodiments, dummy gate dielectric 292 includes an interfacial layer (including, for example, silicon oxide) and a high-k dielectric layer disposed over the interfacial layer. Dummy gate electrode 294 includes a suitable dummy gate material, such as polysilicon. In some embodiments, dummy gate stacks 290 include numerous other layers, for example, capping layers, interface layers, diffusion layers, barrier layers, or combinations thereof. Dummy gate stacks 290 are formed by deposition processes, lithography processes, etching processes, other suitable processes, or combinations thereof. For example, a first deposition process is performed to form a dummy gate dielectric layer over multigate device 200, a second deposition process is performed to form a dummy gate electrode layer over the dummy gate dielectric layer, and a third deposition process is performed to form a hard mask layer over the dummy gate electrode layer. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the hard mask layer, the dummy gate electrode layer, and the dummy gate dielectric layer to form dummy gate stacks 290, which include dummy gate dielectric 292, dummy gate electrode 294, and hard mask 296 as depicted in FIG. 15. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Figure 16:
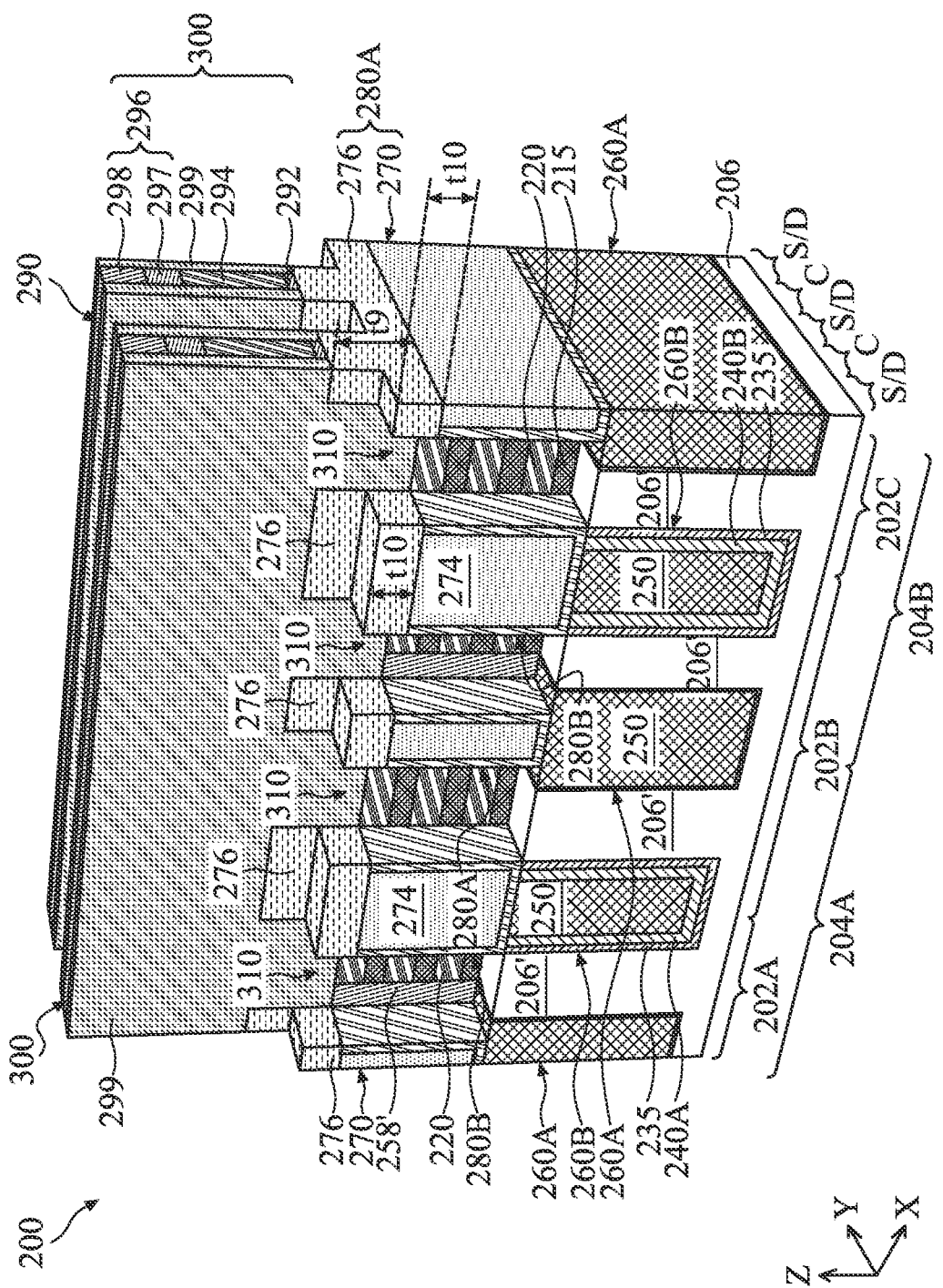

Turning to FIG. 16, gate spacers 299 are formed along sidewalls of dummy gate stacks 290, thereby forming gate structures 300 (which collectively refers to dummy gate stacks 290 and gate spacers 299). In FIG. 16, portions of fins 208A-208D in source/drain regions of multigate device 200 (i.e., source/drain regions of fins 208A-208D that are not covered by gate structures 300) are also at least partially removed to form source/drain recesses (trenches) 310. Processing associated with forming gate spacers 299 and/or source/drain recesses 310 reduces a thickness of exposed portions of dielectric layers 276 (e.g., portions of dielectric layers 276 in source/drain regions of multigate device 200) relative to unexposed portions of dielectric layers 276 (e.g., portions of dielectric layers 276 in channel regions of multigate device 200). For example, dielectric layers 276 have a thickness t9, and etching processes implemented to form gate spacers 299 and/or source/drain recesses 310 reduce, intentionally or unintentionally, a thickness of exposed portions of dielectric layers 276 from thickness t9 to thickness t10. In some embodiments, thickness t9 is about 10 nm to about 40 nm, and thickness t10 is less than about 30 nm. In some embodiments, a difference (offset) of thickness t9 to thickness t10 is about 5 nm to about 20 nm. Accordingly, portions of dielectric layers 276 disposed in channel regions of multigate device 200 under gate structures 300 (here, dummy gate stacks 290 and gate spacers 299) have thickness t9 while portions of dielectric layers 276 disposed in source/drain regions of multigate device 200 and not disposed under gate structures 300 have thickness t10. In some embodiments, exposed portions of dielectric layers 276 are completely removed when forming gate spacers 299 and/or source/drain recesses 310 (i.e., thickness t10=0).

Gate spacers 299 are disposed adjacent to (i.e., along sidewalls of) respective dummy gate stacks 290. Gate spacers 299 are formed by any suitable process and include a dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonnitride). For example, a dielectric layer including silicon and nitrogen, such as a silicon nitride layer, is deposited over multigate device 200 and etched (e.g., anisotropically etched) to form gate spacers 299. In some embodiments, gate spacers 299 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 290. In such embodiments, the various sets of spacers can include materials having different etch rates. For example, a first dielectric layer including silicon and oxygen (e.g., silicon oxide) is deposited and etched to form a first spacer set adjacent to sidewalls of dummy gate stacks 290, and a second dielectric layer including silicon and nitrogen (e.g., silicon nitride) is deposited and etched to form a second spacer set adjacent to the first spacer set.

In the depicted embodiment, an etching process completely removes semiconductor layer stacks 210 in source/drain regions of multigate device 200, thereby exposing fin portions 206' in source/drain regions of multigate device 200. The etching process also completely removes portions of silicon germanium sacrificial features 258' that are disposed along sidewalls of semiconductor layer stacks 210 in source/drain regions of multigate device 200. In the depicted embodiment, each source/drain recess 310 thus has a sidewall defined by a respective one of dielectric fins 280A, a sidewall defined by a respective one of dielectric fins 280B, and sidewalls defined by both remaining portions of semiconductor layer stacks 210 in channel regions of multigate device 200 and remaining portions of silicon germanium sacrificial features 258' disposed along sidewalls of the remaining portions of semiconductor layer stacks 210 (which remaining portions are disposed under gate structures 300). Each source/drain recess 310 further has a bottom defined by a respective fin portion 206' and respective isolation feature 260A. In some embodiments, the etching process removes some, but not all, of semiconductor layer stacks 210, such that source/drain recesses 310 have bottoms defined by respective semiconductor layers 215 or semiconductor layer 220. In some embodiments, the etching process further removes some, but not all, of fin portions 206' of fins 208A-208D, such that source/drain recesses 310 extend below top surfaces of isolation features 260A, 260B. The etching process can include a dry etching process, a wet etching process, other suitable etching process, or combinations thereof. In some embodiments, the etching process is a multi-step etch process. For example, the etching process may alternate etchants to separately and alternately remove semiconductor layers 215 and semiconductor layers 220. In some embodiments, parameters of the etching process are configured to selectively etch semiconductor layer stacks 210 with minimal (to no) etching of gate structures 300 (i.e., dummy gate stacks 290 and gate spacers 299), dielectric fins 280A, 280B, and/or isolation features 260A, 260B. In some embodiments, a lithography process, such as those described herein, is performed to form a patterned mask layer that covers gate structures 300 and/or dielectric fins 280A, 280B, and the etching process uses the patterned mask layer as an etch mask. In such embodiments, thicknesses of dielectric layers 276 are not reduced in the source/drain regions.

Figure 17:
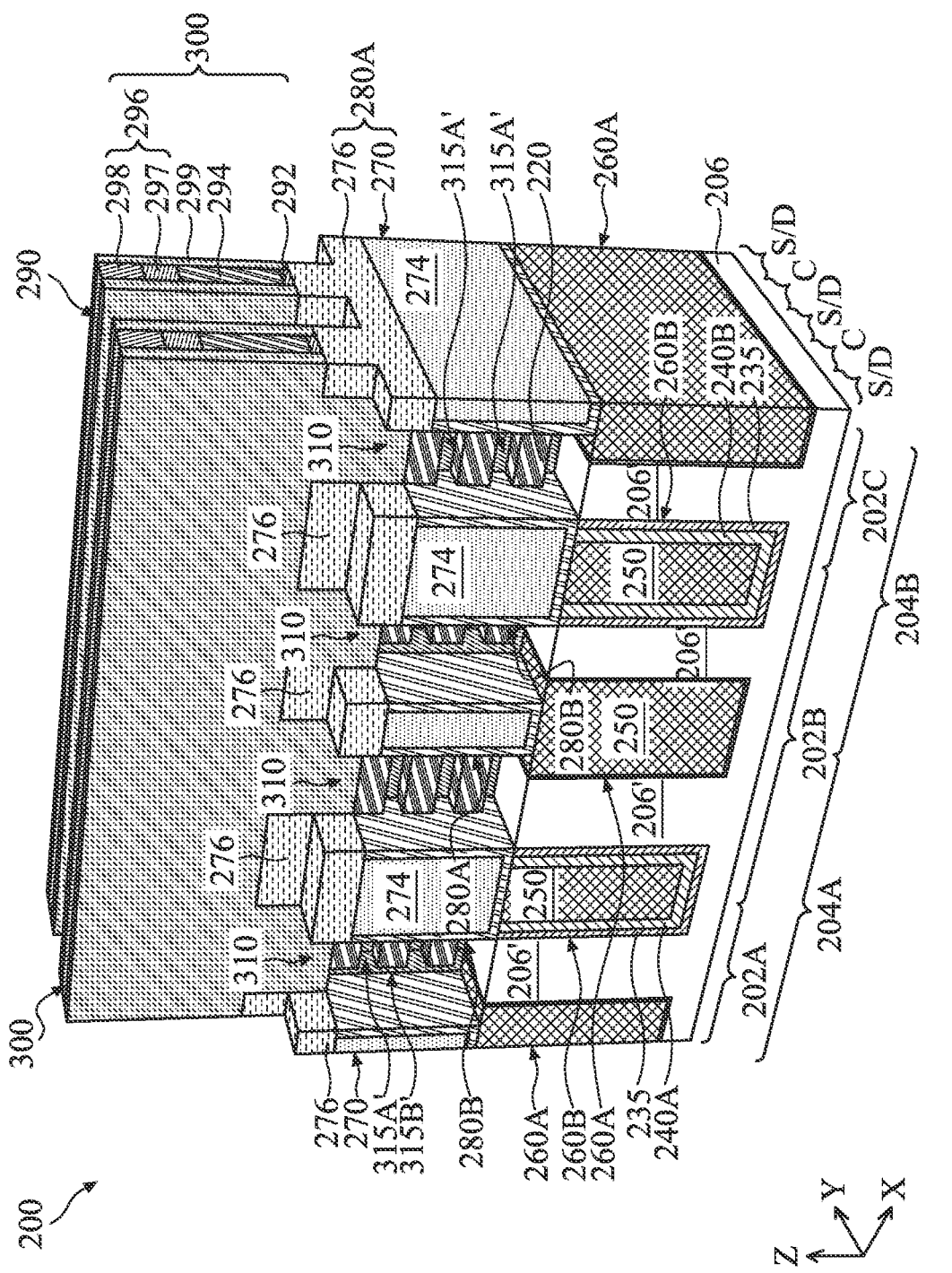
Figure 18:
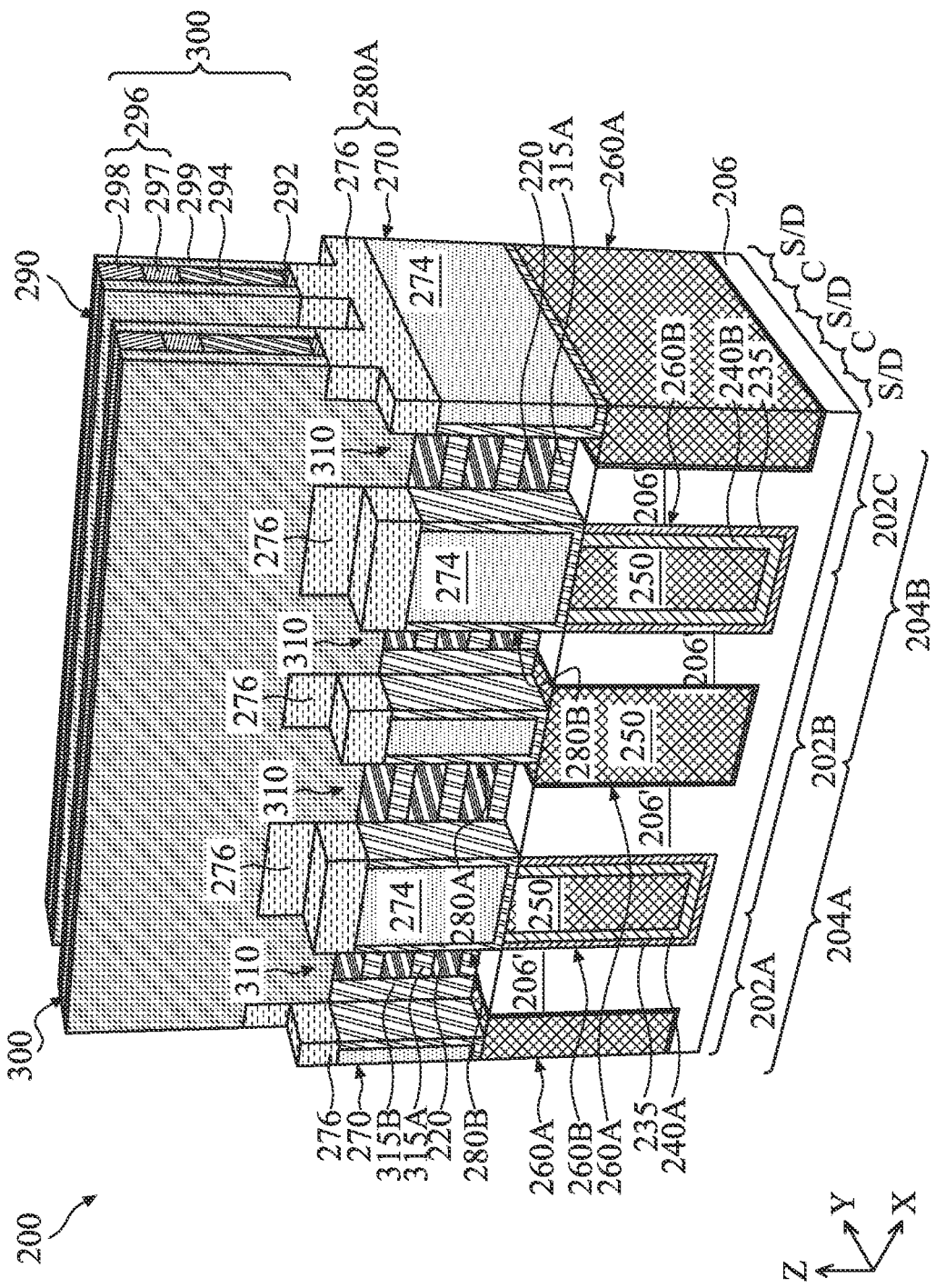

Turning to FIG. 17 and FIG. 18, inner spacers 315A and inner spacers 315B are formed under gate structures 300 (in particular, under gate spacers 299) along sidewalls of semiconductor layers 215 in channel regions of multigate device 200. Inner spacers 315A separate semiconductor layers 220 from one another and bottommost semiconductor layers 220 from fin portions 206', while inner spacers 315B separate semiconductor layers 220 and inner spacers 315A from dielectric fins 280A. In FIG. 17, a first etching process is performed that selectively etches semiconductor layers 215 exposed by source/drain trenches 310 with minimal (to no) etching of semiconductor layers 220, fin portions 206', isolation features 260A, dielectric fins 280A, dielectric fins 280B, and gate structures 300, such that gaps 315A' are formed between semiconductor layers 220 and between fin portions 206' and semiconductor layers 220. The first etching process further selectively etches silicon germanium sacrificial features 258' that are exposed by source/drain trenches 310, such that gaps 315B' are formed between semiconductor layers 220 and dielectric fins 280A and between gaps 315A' and dielectric fins 280A. Gaps 315A' and gaps 315B' are disposed under gate spacers 299. Semiconductor layers 220 are thus suspended under gate spacers 299, separated from one another by gaps 315A' and separated from dielectric fins 280A by gaps 315B'. In some embodiments, gaps 315A' and/or gaps 315B' extend at least partially under dummy gate stacks 290. The first etching process is configured to laterally etch (e.g., along the y-direction) semiconductor layers 215, thereby reducing a length of semiconductor layers 215 along the y-direction. The first etching process is a dry etching process, a wet etching process, other suitable etching process, or combinations thereof. In FIG. 18, a deposition process then forms a spacer layer over gate structures 300 and over features defining source/drain recesses 310 (e.g., semiconductor layers 215, semiconductor layers 220, fin portions 206', dielectric fins 280A, dielectric fins 280B, and isolation features 260A), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills source/drain recesses 310. The deposition process is configured to ensure that the spacer layer fills gaps 315A' and gaps 315B'. A second etching process is then performed that selectively etches the spacer layer to form inner spacers 315A, which fill gaps 315A', and inner spacers 315B, which fill gaps 315B', as depicted in FIG. 18 with minimal (to no) etching of semiconductor layers 220, fin portions 206', isolation features 260A, dielectric fins 280A, dielectric fins 280B, and gate structures 300. The spacer layer (and thus inner spacers 315A and inner spacers 315B) includes a material that is different than a material of semiconductor layers 220, a material of fin portions 206', a material of isolation features 260A, a material of dielectric fins 280A, a material of dielectric fins 280B, a material of dummy gate stacks 290, and/or a material of gate spacers 299 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that the spacer layer includes a doped dielectric material.

Figure 19:
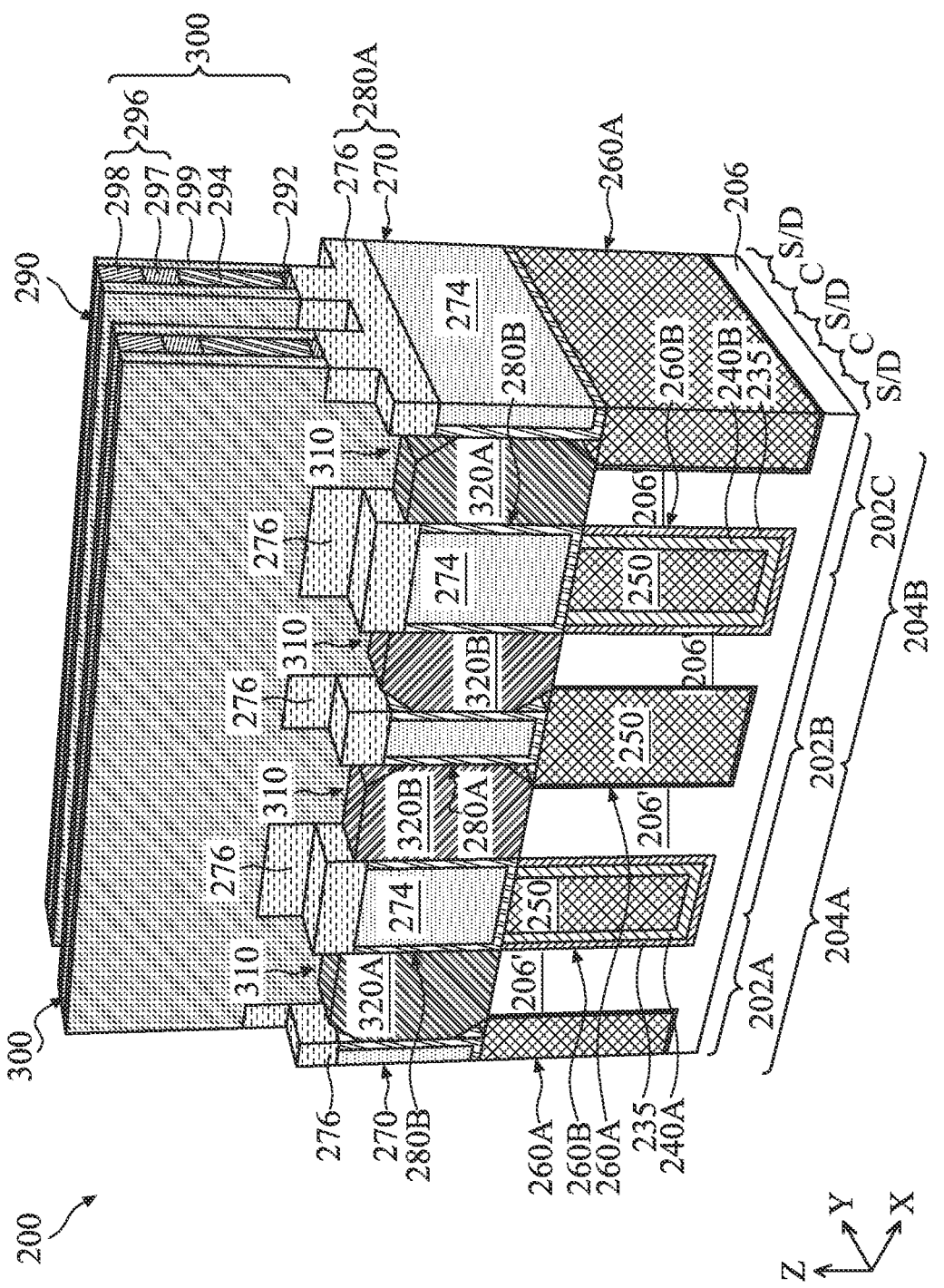

Turning to FIG. 19, epitaxial source/drain features are formed in source/drain recesses 310. For example, a semiconductor material is epitaxially grown from fin portions 206' of substrate 206 and semiconductor layers 220 exposed by source/drain recesses 310, forming epitaxial source/drain features 320A in source/drain recesses 310 that correspond with n-type transistors (e.g., source/drain regions in n-type transistor regions 202A, 202C) and epitaxial source/drain features 320B in source/drain recesses 310 that correspond with p-type transistors (e.g., source/drain regions in p-type transistor region 202B). As described in detail below, epitaxial source/drain features 320A, 320B have asymmetric profiles along the X-Z plane, which result from epitaxial growth differences (variations) along the x-direction that arise from positions of sidewalls of fin portions 206' and sidewalls of semiconductor layers 220 relative to dielectric fins 280A, 280B. In some embodiments, such as depicted, epitaxial source/drain features 320A, 320B do not completely fill source/drain recesses 310, such that top surfaces of epitaxial source/drain features 320A, 320B are lower than top surfaces of dielectric layers 276 relative to the top surface of substrate 206. In some embodiments, epitaxial source/drain features 320A, 320B completely fill source/drain recesses 310, such that top surfaces of epitaxial source/drain features 320A, 320B are substantially planar with top surfaces of dielectric layers 276 or higher than top surfaces of dielectric layers 276 relative to the top surface of substrate 206. An epitaxy process can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of fin portions 206' and/or semiconductor layers 220. Epitaxial source/drain features 320A, 320B are doped with n-type dopants and/or p-type dopants. In some embodiments, for the n-type transistors, epitaxial source/drain features 320A include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type transistors, epitaxial source/drain features 320B include silicon germanium or germanium, which can be doped with boron, other p-type dopant, or combinations thereof (for example, forming Si:Ge:B epitaxial source/drain features). In some embodiments, epitaxial source/drain features 320A and/or epitaxial source/drain features 320B include more than one epitaxial semiconductor layer, where the epitaxial semiconductor layers can include the same or different materials and/or dopant concentrations. In some embodiments, epitaxial source/drain features 320A, 320B include materials and/or dopants that achieve desired tensile stress and/or compressive stress in respective channel regions of the n-type transistors and/or the p-type transistors. In some embodiments, epitaxial source/drain features 320A, 320B are doped during deposition by adding impurities to a source material of the epitaxy process (i.e., in-situ). In some embodiments, epitaxial source/drain features 320A, 320B are doped by an ion implantation process subsequent to a deposition process. In some embodiments, annealing processes (e.g., rapid thermal annealing and/or laser annealing) are performed to activate dopants in epitaxial source/drain features 320A, 320B and/or other source/drain regions (for example, heavily doped source/drain regions and/or lightly doped source/drain (LDD) regions). In some embodiments, epitaxial source/drain features 320A, 320B are formed in separate processing sequences that include, for example, masking p-type transistor region 202B when forming epitaxial source/drain features 320A in n-type transistor regions 202A, 202C and masking n-type transistor regions 202A, 202C when forming epitaxial source/drain features 320B in p-type transistor region 202B.

Figure 20:
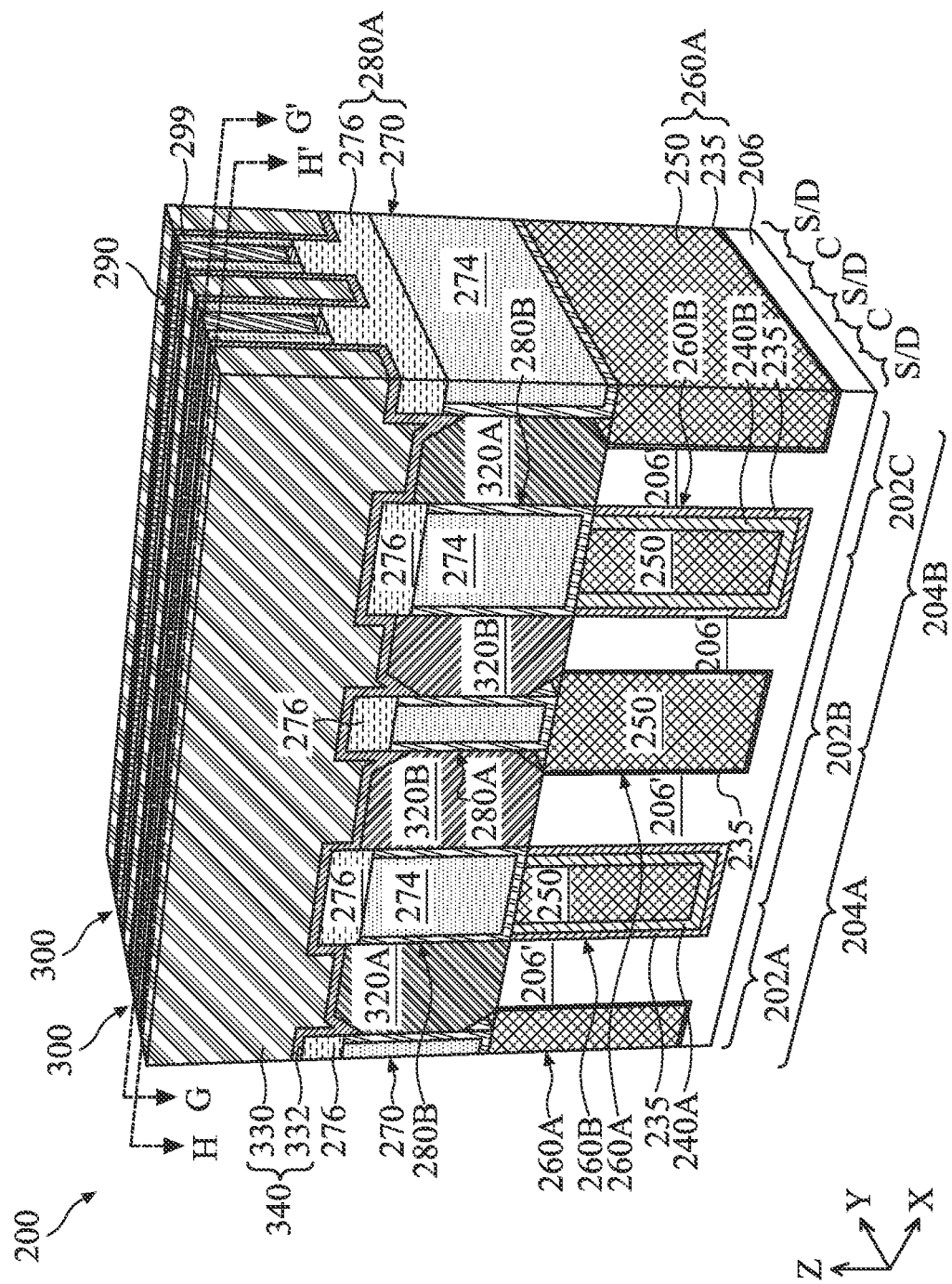

Turning to FIG. 20, a deposition process (such as CVD, PVD, ALD, HDPCVD, MOCVD, RPCVD, PECVD, LPCVD, ALCVD, APCVD, other suitable methods, or combinations thereof) is performed to form an inter-level dielectric (ILD) layer 330 over multigate device 200 and a CMP process and/or other planarization process is performed until reaching (exposing) top portions (or top surfaces) of dummy gate stacks 290. In some embodiments, ILD layer 330 is formed by FCVD, HARP, HDP, or combinations thereof. In some embodiments, such as depicted, the planarization process removes hard mask layers 296 of dummy gate stacks 290 to expose underlying dummy gate electrodes 294 of dummy gate stacks 290, such as polysilicon gate electrodes. ILD layer 330 is disposed over epitaxial source/drain features 320A, 320B, dielectric fins 280A, and dielectric fins 280B in source/drain regions of multigate device 200. ILD layer 330 is further disposed between adjacent gate structures 300. ILD layer 330 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 330 includes a dielectric material having a dielectric constant that is less than a dielectric constant of silicon dioxide (e.g., k<3.9). In some embodiments, ILD layer 330 includes a dielectric material having a dielectric constant that is less than about 2.5 (i.e., an extreme low-k (ELK) dielectric material), such as silicon dioxide ($SiO_2$) (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. ILD layer 330 can include a multilayer structure having multiple dielectric materials. In some embodiments, such as depicted, a contact etch stop layer (CESL) 332 is disposed between ILD layer 330 and epitaxial source/drain features 320A, 320B, dielectric layers 276 (of dielectric fins 280A, 280B), and gate spacers 299. CESL 332 includes a material different than ILD layer 330, such as a dielectric material that is different than the dielectric material of ILD layer 330. For example, where ILD layer 330 includes a dielectric material that includes silicon and oxygen and having a dielectric constant that is less than about the dielectric constant of silicon dioxide, CESL 332 can include silicon and nitrogen, such as silicon nitride or silicon oxynitride. ILD layer 330 and CESL 332 can be a portion of a multilayer interconnect (MLI) feature 340 of multigate device 200. MLI feature 340 electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors), such that the various devices and/or components can operate as specified by design requirements of multigate device 200. MLI feature 340 includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 340. During operation, the interconnect features are configured to route signals between the devices and/or the components of multigate device 200 and/or distribute signals (for example, clock signals, voltage signals, and/or ground signals) to the devices and/or the components of multigate device 200.

Figure 21:
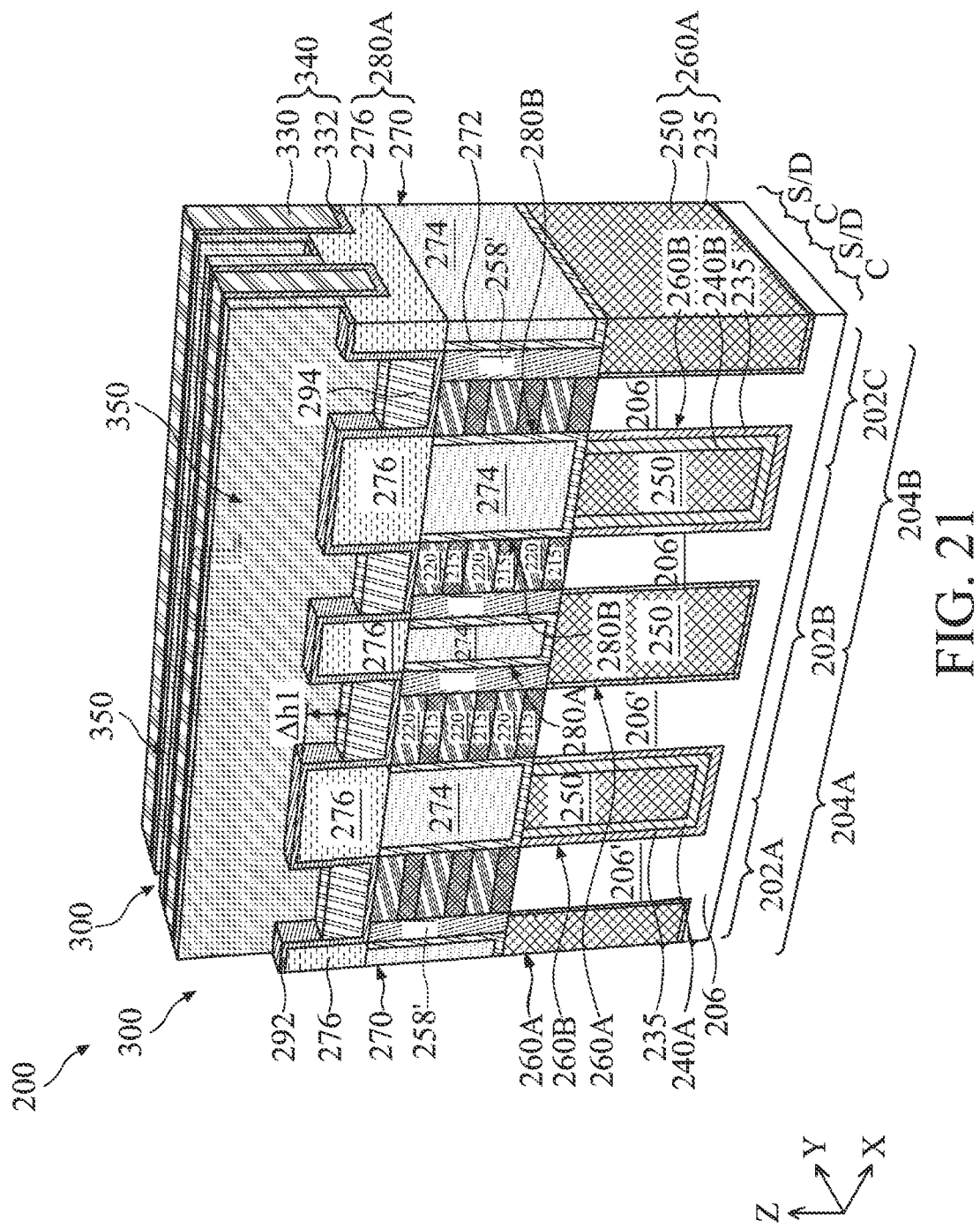

Turning to FIGS. 21-26, a gate replacement process is performed to replace dummy gate stacks 290 with metal gate stacks and a channel release process is performed to form suspended channel layers in channel regions of multigate device 200, where the metal gate stacks at least partially surround the suspended channel layers. For ease of description and understanding, FIGS. 21-26 are taken (cut) through one of gate structures 300 along line G-G' in FIG. 20 (and are thus referred to as metal gate cut perspective views). Turning to FIG. 21, gate openings 350 are formed in gate structures 300 by partially removing dummy gate stacks 290. For example, an etching process is performed that recesses dummy gate electrodes 294 until dielectric layers 276 of dummy fins 280A, 280B are exposed and extend (protrude) from between remaining portions of dummy gate electrodes 294. In FIG. 21, after recessing dummy gate electrodes 294, topmost surfaces of dummy gate electrodes 294 are lower than topmost surfaces of dielectric layers 276 of dummy fins 280A, 280B relative to top surface of substrate 206. In some embodiments, a height difference Δh1 between topmost surfaces of dummy gate electrodes 294 and topmost surfaces of dielectric layers 276 in channel regions of multigate device 200 is about 5 nm to about 30 nm. The etching process is configured to selectively remove dummy gate electrodes 294 with respect to ILD layer 330, CESL 332, gate spacers 299, and/or dummy gate dielectrics 292. In other words, the etching process substantially removes dummy gate electrodes 294 but does not remove, or does not substantially remove, ILD layer 330, CESL 332, gate spacers 299, and/or dummy gate dielectrics 292. For example, an etchant is selected for the etch process that etches polysilicon (i.e., dummy gate electrodes 294) at a higher rate than silicon oxide and/or silicon nitride (i.e., ILD layer 330, CESL 332, gate spacers 299, and/or dummy gate dielectrics 292) (i.e., the etchant has a high etch selectivity with respect to polysilicon). In some embodiments, such as depicted, the etching process does not remove dummy gate dielectrics 232, such that dummy gate dielectrics 292 remain covering exposed portions of dielectric layers 276. In some embodiments, the etching process partially or completely removes dummy gate dielectrics 292. The etching process is a dry etching process, a wet etching process, or a combination thereof. In some embodiments, a dry etching process uses an etch gas that includes HBr and/or $Cl_2$ to achieve selective etching of polysilicon (i.e., dummy gate electrodes 294) with respect to silicon oxide and/or silicon nitride (i.e., ILD layer 330, gate spacers 299, and/or dummy gate dielectrics 292). In some embodiments, the etch process includes multiple steps. In some embodiments, the etching process uses a patterned mask layer as an etch mask, where the patterned mask layer covers ILD layer 330, CESL 332, and/or gate spacers 299 but has openings therein that expose dummy gate electrodes 294.

Figure 22:
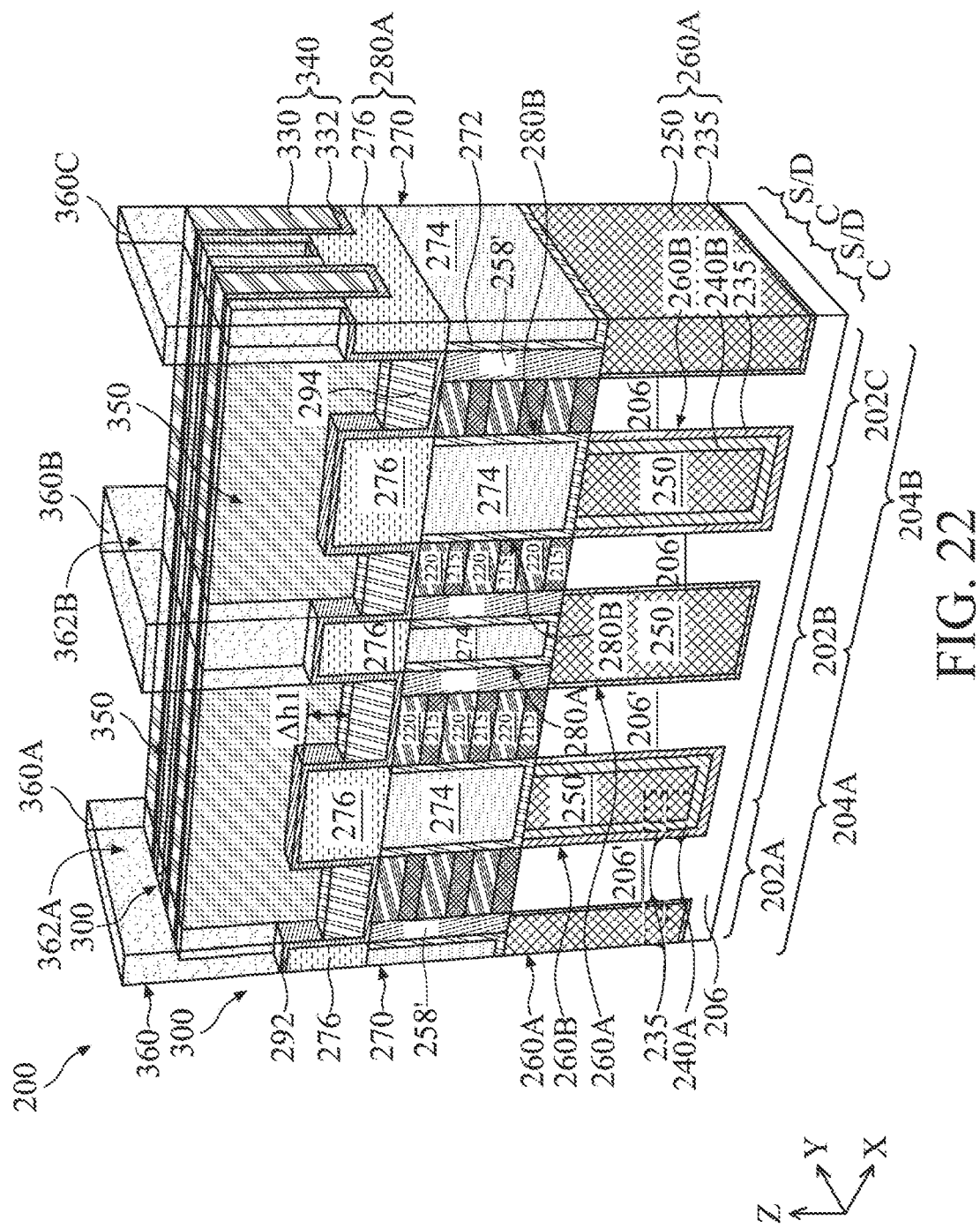
Figure 23:
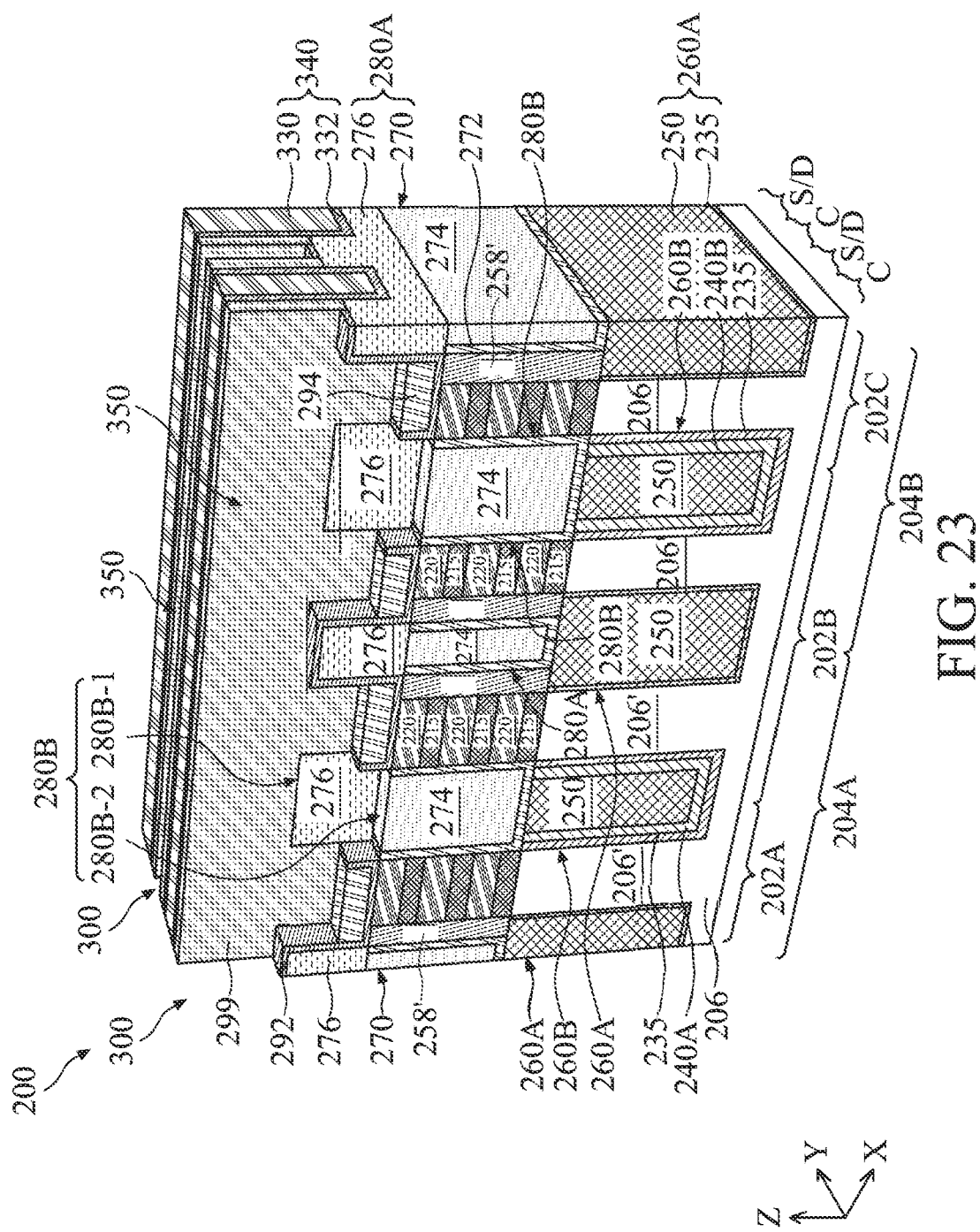

Turning to FIG. 22 and FIG. 23, dielectric layers 276 are removed from dielectric fins 280B in channel regions of multigate device 200. In FIG. 22, a lithography process, such as those described herein, is performed to form a patterned mask layer 360, which includes a mask portion 360A, a mask portion 360B, a mask portion 360C, an opening 362A defined by mask portions 360A, 360B, and an opening 362B defined by mask portions 360B, 360C. In some embodiments, patterned mask layer 360 is a patterned resist layer. Mask portions 360A-360C cover dielectric fins that span interface regions between different device regions, such as dielectric fins 280A. For example, mask portion 360A covers a first device interface region between first multigate device region 204A and another device region (for example, positioned left of first multigate device region 204A), mask portion 360B covers a second device interface region between multigate device region 204A and multigate device region 204B, and mask portion 360C covers a third device interface region between second multigate device region 204B and another device region (for example, positioned right of second multigate device region 204B). Dielectric fins 280A spanning the first device interface region, the second device interface region, and the third device interface region are thus covered by mask portions 360A-360C. Openings 362A, 362B expose dielectric fins that span interface regions between different transistors and/or devices within a device region, such as dielectric fins 280B. For example, opening 362A exposes a first transistor interface region between n-type transistor region 202A and p-type transistor region 202B, and opening 362B exposes a second transistor interface region between p-type transistor region 202B and n-type transistor region 202C. In furtherance of the depicted embodiment, opening 362A exposes portions of gate structures 300 in n-type transistor device region 202A and p-type transistor region 202B that are adjacent to the first transistor interface region, and opening 362B exposes portions of gate structures 300 in p-type transistor device region 202B and n-type transistor region 202C that are adjacent to the second transistor interface region. Openings 362A, 362B thus expose dielectric fins 280B spanning the first transistor interface region and the second transistor interface region, portions of dummy gate dielectrics 292, and portions of dummy gate electrodes 294.

In FIG. 23, an etching process is then performed to remove dielectric layers 276 from the portions of dielectric fins 280B that are disposed in channel regions of multigate device 200, such that dielectric fins 280B have first portions 280B-1 in channel regions of multigate device 200 and second portions 280B-2 in source/drain regions of multigate device 200. First portions 280B-1 include dielectric layer 276 and dielectric feature 270 (i.e., dielectric liner 272 and oxide layer 274), while second portions 280B-2 include only dielectric feature 270. In the depicted embodiment, the etching process selectively etches dielectric layers 276 with minimal (to no) etch of gate spacers 299, ILD layer 330, and/or CESL 332. In other words, the etching process substantially removes dielectric layers 276 but does not remove, or does not substantially remove, gate spacers 299, ILD layer 330, and/or CESL 332. For example, an etchant is selected for the etch process that etches metal oxide (i.e., dielectric layers 276) at a higher rate than silicon oxide and/or silicon nitride (i.e., ILD layer 330, CESL 332, and/or gate spacers 299) (i.e., the etchant has a high etch selectivity with respect to metal oxide). In some embodiments, the etchant has a first etch selectivity between dielectric layers 276 and gate spacers 299, ILD layer 330, and/or CESL 232 and a second etch selectivity between dielectric layers 276 and dummy gate dielectrics 292 and/or dummy gate electrodes 294, where the first etch selectivity is greater than the second etch selectivity. In such embodiments, such as depicted in FIG. 23, the etching process does not remove, or does not substantially remove, gate spacers 299, ILD layer 330, and/or CESL 332, but partially removes dummy gate dielectrics 292 and/or dummy gate electrodes 294. For example, the etching process removes portions of dummy gate dielectrics 292 that cover dielectric layers 276 in openings 362A, 362B and partially removes portions of dummy gate dielectrics 292 and/or dummy gate electrodes 294 that cover fins 208A-208D in channel regions of multigate device 200. In some embodiments, the etching process partially removes patterned mask layer 360. The etching process is a dry etching process, a wet etching process, or a combination thereof. Thereafter, patterned mask layer 360, or any remaining portion thereof, is removed from multigate device 200, for example, by a resist stripping process, an etching process, other suitable process, or combination thereof.

Figure 24:
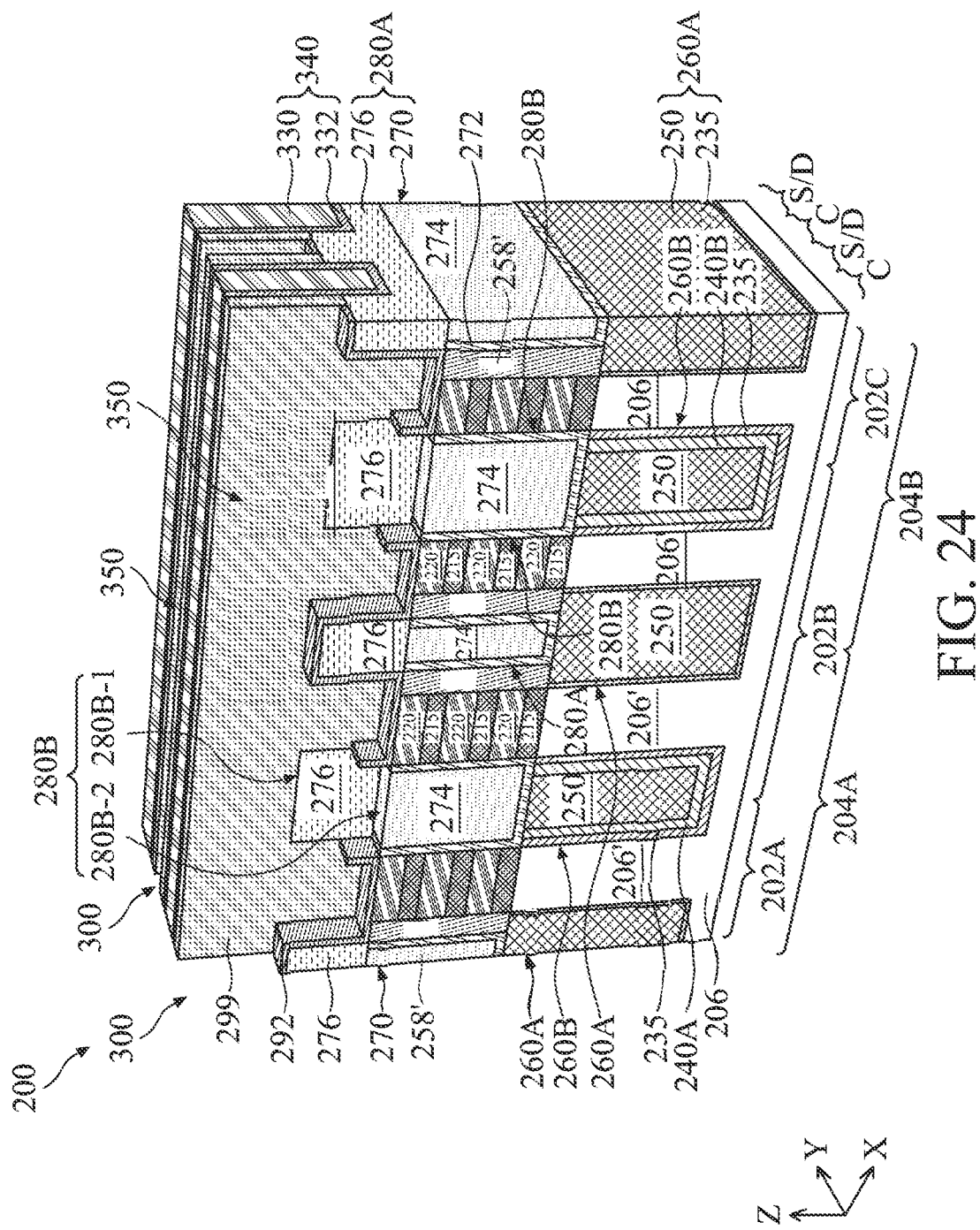

In FIG. 24, a remainder of dummy gate electrodes 294 is removed from gate openings 350. For example, an etching process completely removes dummy gate electrodes 294 to expose semiconductor layer stacks 210. The etching process is similar to the etching process described above with reference to FIG. 21. The etching process is configured to selectively etch dummy gate electrodes 294 with minimal (to no) etching of other features of multigate device 200, such as gate spacers 299, dielectric fins 280A, dielectric fins 280B, ILD layer 330, CESL 332, and/or semiconductor layers 220. In the depicted embodiment, the etching process further selectively etches dummy gate electrodes 294 with minimal (to no) etching of dummy gate dielectrics 292, such that dummy gate dielectrics 292 remain covering semiconductor layers stacks 210 and dielectric layers 276 of dielectric fins 270 in channel regions of multigate device 200. In some embodiments, the etching process is configured to completely or partially remove dummy gate dielectrics 292. The etching process is a dry etching process, a wet etching process, other suitable etching process, or combinations thereof. In some embodiments, the etching process is a multi-step etch process. For example, the etching process may alternate etchants to separately remove various layers of dummy gate stacks, such as dummy gate electrodes 294, dummy gate dielectrics 292, and/or hard mask layers. In some embodiments, a lithography process, such as those described herein, is performed to form a patterned mask layer that covers ILD layer 330 and/or gate spacers 299 during the etching process.

Figure 25:
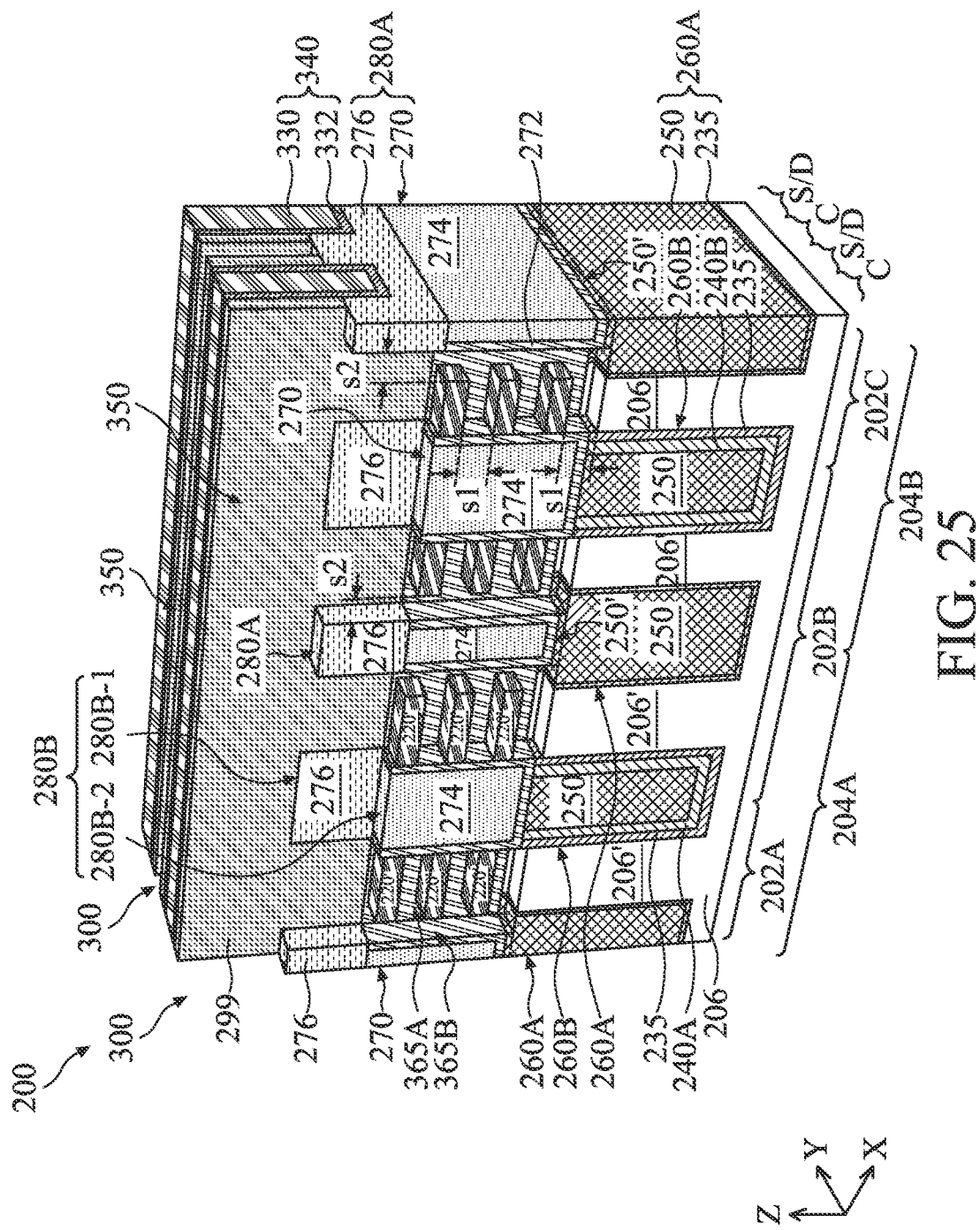

In FIG. 25, semiconductor layers 215 of semiconductor layer stacks 210 exposed by gate openings 350 are selectively removed from channel regions of multigate device 200, thereby forming suspended semiconductor layers 220' separated from one another and/or fin portions 206' by gaps 365A. Silicon germanium sacrificial features 258' are also selectively removed from channel regions of multigate device 200, thereby forming gaps 365B between suspended semiconductor layers 220' and dielectric fins 280A. As such, n-type transistor region 202A, p-type transistor region 202B, and n-type transistor region 202C each have at least one suspended semiconductor layer 220'. For example, n-type transistor region 202A, p-type transistor region 202B, and n-type transistor region 202C each include three suspended semiconductor layers 220' vertically stacked along the z-direction, which will provide three channels through which current can flow between respective epitaxial source/drain features (epitaxial source/drain features 320A or epitaxial source/drain features 320B) during operation of the transistors. Suspended semiconductor layers 220' are thus referred to as channel layers 220' hereinafter, and the process depicted in FIG. 25 can be referred to as a channel release process. A spacing s1 is defined between channel layers 220' along the z-direction, and a spacing s2 is defined between channel layers 220' and dielectric fins 280A along the x-direction. Spacing s1 and spacing s2 correspond with widths of gaps 365A and gaps 365B, respectively. In some embodiments, spacing s1 is about equal to a thickness t1 of semiconductor layers 215, and spacing s2 is about equal to thickness t5 of silicon germanium sacrificial features 258', though the present disclosure contemplates embodiments where spacing s1 is greater than or less than thickness t1 and spacing s2 is greater than or less than thickness t5. In some embodiments, each channel layer 220' has nanometer-sized dimensions and can be referred to as "nanostructures," alone or collectively. For example, each channel layer 220' can have a width along the x-direction that is about 6 nm to about 80 nm, a length along the y-direction that is about 8 nm to about 150 nm, and a thickness along the z-direction that is about 3 nm to about 15 nm. The present disclosure further contemplates embodiments channel layers 220' having sub-nanometer dimensions. In some embodiments, channel layers 220' have cylindrical-shaped profiles (e.g., nanowires), rectangular-shaped profiles (e.g., nanobars), sheet-shaped profiles (e.g., nanosheets (i.e., dimensions in the X-Y plane are greater than dimensions in the X-Z plane and the Y-Z plane to form sheet-like structures), or any other suitable shaped profile.

In some embodiments, an etching process is performed to selectively etch semiconductor layers 215 and silicon germanium sacrificial features 258' with minimal (to no) etching of semiconductor layers 220, fin portions 206', isolation features 260A, dielectric fins 280A, dielectric fins 280B, gate spacers 299, inner spacers 315A, inner spacers 315B, ILD layer 330, and/or CESL 332. In some embodiments, an etchant is selected for the etch process that etches silicon germanium (i.e., semiconductor layers 215 and silicon germanium sacrificial features 258') at a higher rate than silicon (i.e., semiconductor layers 220 and fin portions 206') and dielectric materials (i.e., isolation features 260A, dielectric fins 280A, dielectric fins 280B, gate spacers 299, inner spacers 315A, inner spacers 315B, ILD layer 330, and/or CESL 332) (i.e., the etchant has a high etch selectivity with respect to silicon germanium). In some embodiments, the etching process partially, but minimally, etches semiconductor layers 220, fin portions 206', and/or isolation features 260A. For example, in FIG. 25, the etching process slightly recesses fin portions 206', such that topmost surfaces of fin portions 206' in channel regions of multigate device 200 are lower than topmost surfaces of fin portions 206' in source/drain regions of multigate device 200 relative to a top surface of substrate 206. In furtherance of the example, in FIG. 25, the etching process also slightly recesses portions of isolation features 260A that are exposed by gate openings 350, such as dielectric liners 235 and portions of oxide material 250 not covered by dielectric fins 280A. The etching process does not recess portions of oxide material 250 disposed under dielectric fins 280A, such that isolation features 260A have oxide extensions 250' in channel regions of multigate device 200. In such embodiments, topmost surface of fin portions 206' in channel regions of multigate device 200 are lower than topmost surfaces of oxide extensions 250' of isolation features 260A relative to the top surface of substrate 206. In some embodiments, topmost surfaces of recessed portions of isolation features 260 (i.e., dielectric liners 235 and oxide material 250) are substantially planar with topmost surfaces of fin portions 206' in channel regions of multigate device 200.

The etching process is a dry etching process, a wet etching process, or a combination thereof. In some embodiments, a dry etching process (such as an RIE process) utilizes a fluorine-containing gas (for example, $SF_6$) to selectively etch semiconductor layers 215 and silicon germanium sacrificial features 258'. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes $NH_4OH$ and $H_2O$ to selectively etch semiconductor layers 215 and silicon germanium sacrificial features 258'. In some embodiments, a chemical vapor phase etching process using HCl selectively semiconductor layers 215 and silicon germanium sacrificial features 258'. In some embodiments, before performing the etching process, an oxidation process can be implemented to convert semiconductor layers 215 and silicon germanium sacrificial features 258' into silicon germanium oxide features, where the etching process then removes the silicon germanium oxide features. In some embodiments, the etch process includes multiple steps. In some embodiments, the etching process uses a patterned mask layer as an etch mask, where the patterned mask layer covers ILD layer 330, CESL 332, and/or gate spacers 299 but has openings therein that expose channel regions of multigate device 200. In some embodiments, after removing semiconductor layers 215 and silicon germanium sacrificial features 258', an etching process is performed to modify a profile of channel layers 220' to achieve desired dimensions and/or desired shapes.

Figure 26:
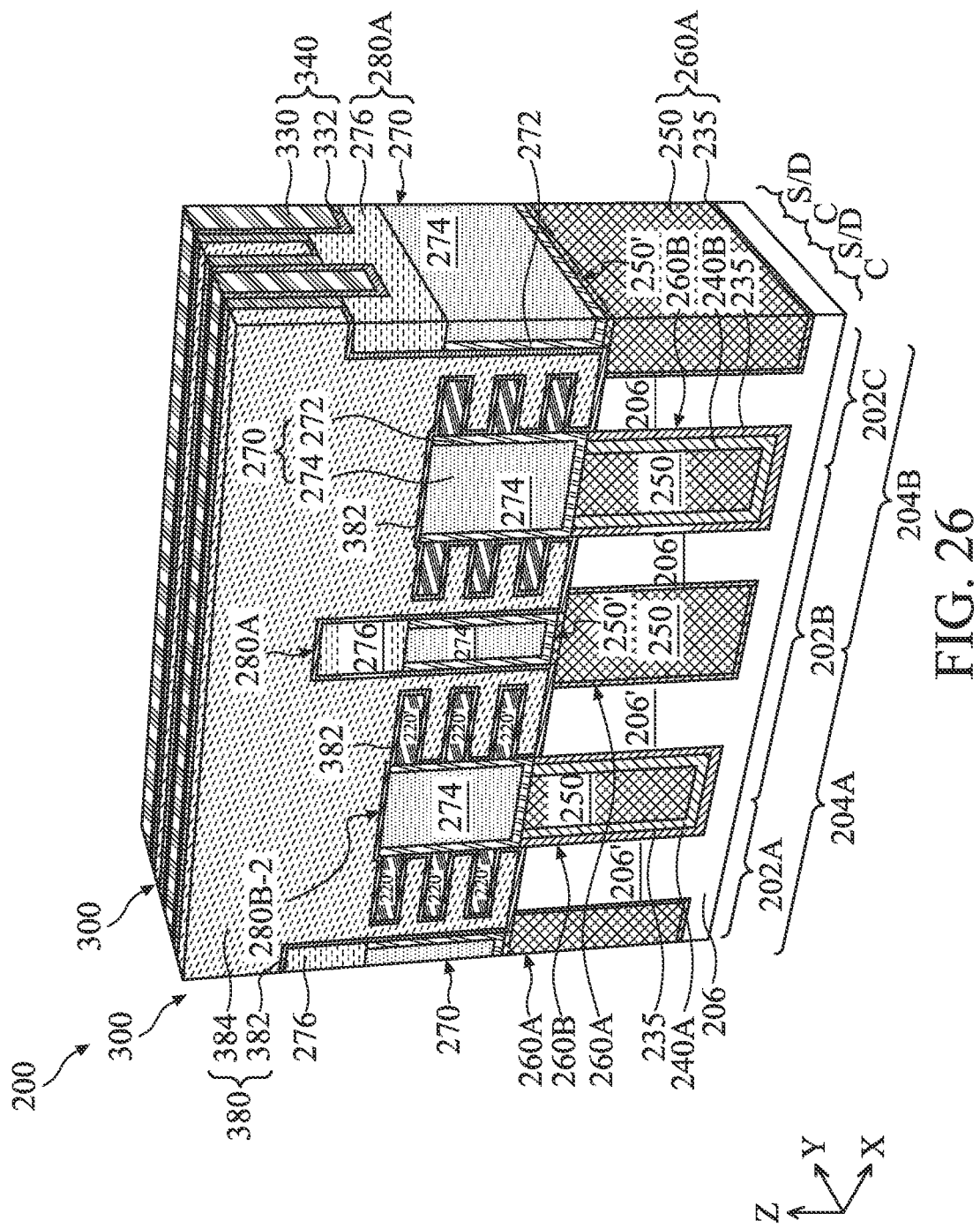

Turning to FIG. 26, metal gate stacks 380 (also referred to as metal gates and/or high-k/metal gates) are formed in gate openings 350. Metal gate stacks 380 are configured to achieve desired functionality according to design requirements of multigate device 200. Metal gate stacks 380 each include a gate dielectric 382 (for example, a gate dielectric layer) and a gate electrode 384 (for example, a work function layer and a bulk conductive layer). Metal gate stacks 380 may include numerous other layers, for example, capping layers, interface layers, diffusion layers, barrier layers, hard mask layers, or combinations thereof. In some embodiments, forming metal gate stacks 380 includes depositing a gate dielectric layer over multigate device 200, where the gate dielectric layer partially fills gate openings 350, depositing a gate electrode layer over the gate electrode layer, where the gate electrode layer fills a remainder of gate openings 350, and performing a planarization process to remove excess gate materials from multigate 200. For example, a CMP process is performed until a top surface of ILD layer 330 is reached (exposed), such that a top surface of gate structures 300 are substantially planar with a top surface of ILD layer 330 after the CMP process. In FIG. 26, gate dielectric 382 and gate electrode 284 each extend uninterrupted from n-type transistor region 202A to p-type transistor region 202B to n-type transistor region 202C. Gate dielectric 382 and gate electrode 284 also each extend uninterrupted from first multigate device region 204A to second multigate device region 204B. Since metal gate stacks 380 span n-type transistor region 202A, p-type transistor region 202B, and n-type transistor region 202C, metal gate stacks 380 may have different layers in regions corresponding with n-type transistor region 202A, p-type transistor region 202B, and n-type transistor region 202C. For example, a number, configuration, and/or materials of layers of gate dielectrics 382 and/or gate electrode 384 corresponding with p-type transistor region 202B may be different than a number, configuration, and/or materials of layers of gate dielectrics 382 and/or gate electrode 384 corresponding with n-type transistor region 202A and/or n-type transistor region 202C. In another example, a number, configuration, and/or materials of layers of gate dielectrics 382 and/or gate electrode 384 corresponding with n-type transistor region 202A in first multigate device region 204A may be different than a number, configuration, and/or materials of layers of gate dielectrics 382 and/or gate electrode 384 corresponding with n-type transistor region 202C in second multigate device region 204B. In yet another example, a number, configuration, and/or materials of layers of gate dielectrics 382 and/or gate electrode 384 corresponding with p-type transistor region 202B in first multigate device region 204A may be different than a number, configuration, and/or materials of layers of gate dielectrics 382 and/or gate electrode 384 corresponding with p-type transistor region 202B in second multigate device region 204B.

Gate dielectric 382 partially fills gate openings 350 and wraps channel layers 220', such that gate dielectric 382 partially fill gaps 365A and gaps 365B. In the depicted embodiment, gate dielectric 382 covers exposed surfaces of channel layers 220', such that gate dielectric 382 is disposed along top surfaces, bottom surfaces, and one sidewall of channel layers 220' (in other words, along three sides of channel layers 220'). In some embodiments, gate dielectric 382 is further disposed over fin portions 206', isolation features 260A, dielectric fins 280A, and dielectric fins 280B in channel regions of multigate device 200. Gate dielectric 382 includes a high-k dielectric layer, which includes a high-k dielectric material, which for purposes of metal gate stacks 380 refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectric 382 includes an interfacial layer disposed between the high-k dielectric layer and channel layers 220'. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes exposed surfaces of channel layers 220' to hydrofluoric acid. In some embodiments, the interfacial layer is formed by a thermal oxidation process that exposes the exposed surfaces of channel layers 220' to an oxygen and/or air ambient. In some embodiments, the interfacial layer is formed after forming the high-k dielectric layer. For example, in some embodiments, after forming the high-k dielectric layer, multigate device 200 may be annealed in an oxygen and/or nitrogen ambient (e.g., nitrous oxide).

Gate electrode 384 is formed over gate dielectric 382, filling a remainder of gate openings 350 and wrapping channel layers 220', such that gate electrode 284 fills a remainder of gaps 365A and gaps 365B. In the depicted embodiment, gate electrode 384 is disposed along top surfaces, bottom surfaces, and one sidewall of channel layers 220' (in other words, along three sides of channel layers 220'). In some embodiments, gate electrode 384 is further disposed over fin portions 206', isolation features 260A, dielectric fins 280A, and dielectric fins 280B in channel regions of multigate device 200. Gate electrode 384 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrode 284 includes a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrode 284 is formed by any of the processes described herein, such as ALD, CVD, PVD, plating, other suitable process, or combinations thereof.

Figure 27:
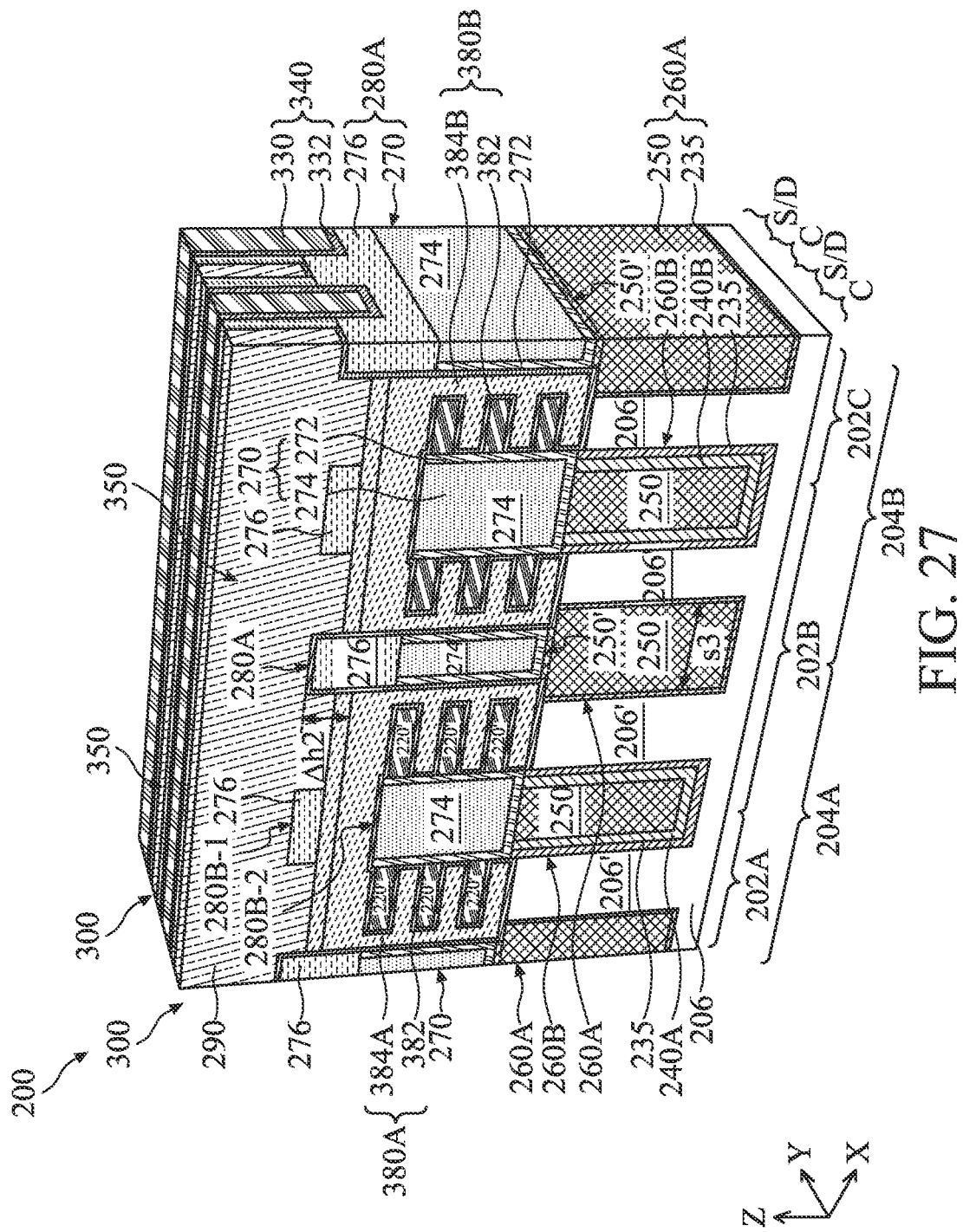

Turning to FIG. 27, a self-aligned metal gate cut process is performed that removes portions of metal gate stacks 380 to form metal gates 380A in first multigate device region 204A and metal gates 380B in second multigate device region 204B, where dielectric fins 280A separate and isolate metal gates 380A from metal gates 380B. Dielectric fins 280A also separate metal gates 380A and metal gates 380B from metal gates and/or other device features in adjacent device regions, such as to the left of first multigate device region 204A and/or to the right of second multigate device region 204B. For example, an etch back process is performed to recess gate electrodes 384 until top surfaces of dielectric fins 280A are free of gate electrodes 384 (i.e., gate electrodes 384 are not disposed over and do not extend over top surfaces of dielectric fins 280A). The etch back process reopens gate openings 350. After the etch back process, gate electrodes 384 no longer extend uninterrupted from first multigate device region 204A to second multigate device region 204B, thereby forming gate electrodes 384A in first multigate device region 204A and gate electrodes 384B in second multigate device region 204B, where dielectric fins 280A separate gate electrodes 384A and gate electrodes 384B from one another and from gate electrodes and/or other device features in adjacent multigate device regions. In the depicted embodiment, top surfaces of gate electrodes 384A, 384B are lower than top surfaces of dielectric fins 280A relative to a top surface of substrate 206. For example, a height difference Δh2 between topmost surfaces of gate electrodes 384A, 384B and topmost surfaces of dielectric fins 280A (e.g., topmost surfaces of dielectric layers 276) is about 1 nm to about 10 nm. In some embodiments, top surfaces of gate electrodes 384A, 384B are substantially planar with top surfaces of dielectric fins 280A. In the furtherance of the depicted embodiment, the etch back process does not, or minimally, etches gate dielectrics 382, such that gate dielectrics 382 still extend uninterrupted from first multigate device region 204A to second multigate device region 204B. Accordingly, metal gates 380A include respective portions of respective gate dielectrics 382 and respective gate electrodes 384A, and metal gates 380B include respective portions of respective gate dielectrics 382 and respective gate electrodes 384B.

The etch back process is configured to selectively remove gate electrodes 384 with respect to gate spacers 299, ILD layer 330, CESL 332, and dielectric layers 276. In other words, the etch back process substantially removes gate electrodes 384 but does not remove, or does not substantially remove, gate spacers 299, ILD layer 330, CESL 332, and/or dielectric layers 276. For example, an etchant is selected for the etch process that etches metal materials (e.g., gate electrodes 384) at a higher rate than dielectric materials (e.g., gate spacers 299, ILD layer 330, CESL 332, dielectric layers 276, and/or gate dielectrics 232) (i.e., the etchant has a high etch selectivity with respect to metal materials). The etch back process is a dry etching process, a wet etching process, other suitable etching process, or combinations thereof. In some embodiments, a wet etching process uses a wet etchant solution that can remove metal materials without substantially removing dielectric materials, such as wet etchant solution having a mixture of $BCl_3$, Cl, and/or HBr. In some embodiments, the etch back process includes multiple steps (for example, each step is configured to etch a particular layer of gate electrodes 384).

The metal gate cut process is referred to as "self-aligned" because gate isolation structures (here, dielectric fins 280A, also referred to as gate isolation fins) are aligned between metal gates 380A and metal gates 380B without having to perform a lithography process after forming metal gate stacks 380. The self-aligned placement of the gate isolation structures provides electrical isolation between devices in adjacent active regions, such as transistors formed in first multigate device region 204A and transistors formed in second multigate device region 204B. The self-aligned placement of the gate isolation structures also allows for higher packing density without negatively affecting operation of closely spaced devices in a high-density IC. For example, a spacing S3 between an active region (e.g., fin portion 206') of first multigate device region 204A and an active region (e.g., fin portion 206') of second multigate device region 204B can be smaller than spacings required between active regions of adjacent multigate device regions when implementing non-self-aligned metal gate cut techniques, which often require a lithography process to form the gate isolation structures. In some embodiments, spacing S3 is about 20 nm. Smaller spacings between active regions are possible because the proposed self-aligned metal gate cut technique does not suffer from overlay issues associated with non-self-aligned metal gate cut techniques. Smaller spacings between active regions can thus be implemented without risking unintentional damage to channel layers 220', metal gates 380A, and/or metal gates 380B, which damage can arise from process variations inherent in non-self-aligned metal gate cut techniques. Different embodiments may have different advantages, and no particular advantage is necessarily required of any embodiment.

Figure 28:
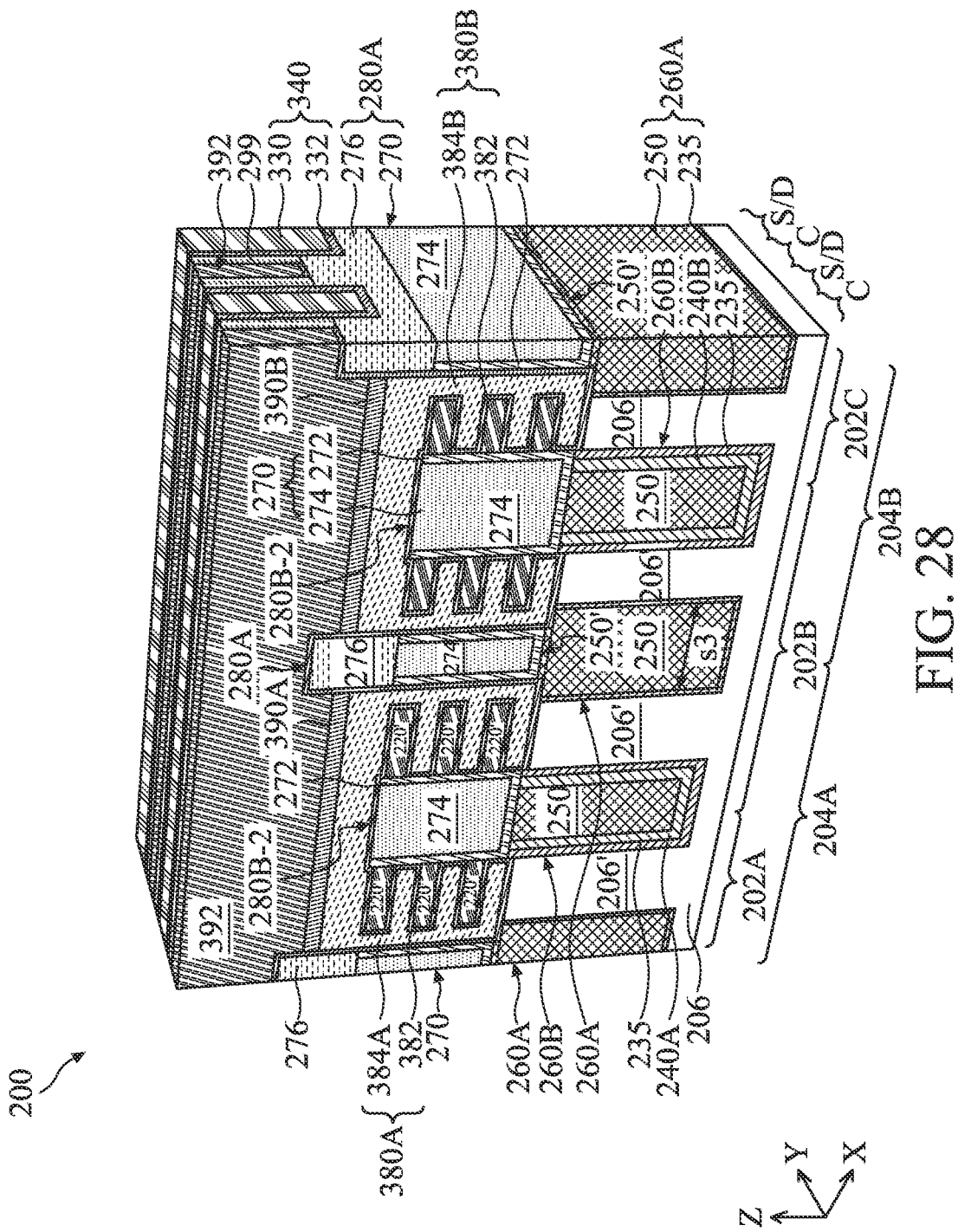

Turning to FIG. 28, a metal capping layer 390A is formed over metal gate 380A, a metal capping layer 390B is formed over metal gate 380B, and dielectric layers 392 are formed over metal capping layers 390A, 390B. Metal capping layer 390A, metal capping layer 390B, and dielectric layer 392 fill remainders of gate openings 350, such that metal capping layers 390A, 390B and dielectric layers 392 are disposed between gate spacers 299 of gate structures 300. Dielectric layers 392 extend over top surfaces of dielectric fins 280A, such that dielectric layers 392 extend uninterrupted from first multigate device region 204A to second multigate device region 204B. In the depicted embodiment, gate dielectrics 382 separate dielectric layers 392 from dielectric fins 280A. In some embodiments, where gate dielectrics 382 are removed from top surfaces of dielectric fins 280A, for example, during the etch back process in FIG. 27, dielectric layers 392 may directly, physically contact dielectric fins 280A (in particular, dielectric layers 276). Metal capping layers 390A, 390B include a metal material and are formed by any suitable process, such as those described herein. In some embodiments, metal capping layers 390A, 390B are formed by a deposition process that selectively grows a metal layer from metal surfaces (i.e., gate electrodes 384A, 384B) without growing the metal layer on dielectric surfaces (i.e., gate dielectrics 382, gate spacers 299, ILD layer 330, and/or CESL 332). In some embodiments, metal capping layers 390A, 390B include tungsten and are referred to as tungsten layers. Dielectric layers 392 include a dielectric material and are formed by any suitable process, such as those described herein. The dielectric material can include silicon, oxygen, carbon, nitrogen, other suitable material, or combinations thereof (for example, silicon oxide, silicon nitride, silicon oxynitride, silicon carbide, and/or silicon oxycarbonitride). In the depicted embodiment, dielectric layers 392 include silicon and nitrogen, such as a silicon nitride layer. In some embodiments, dielectric layers 392 are formed by depositing the dielectric material over multigate device 200, where the dielectric material fills gate openings 350, and performing a planarization process to remove the dielectric material from over ILD layer 330.

Figure 29A:
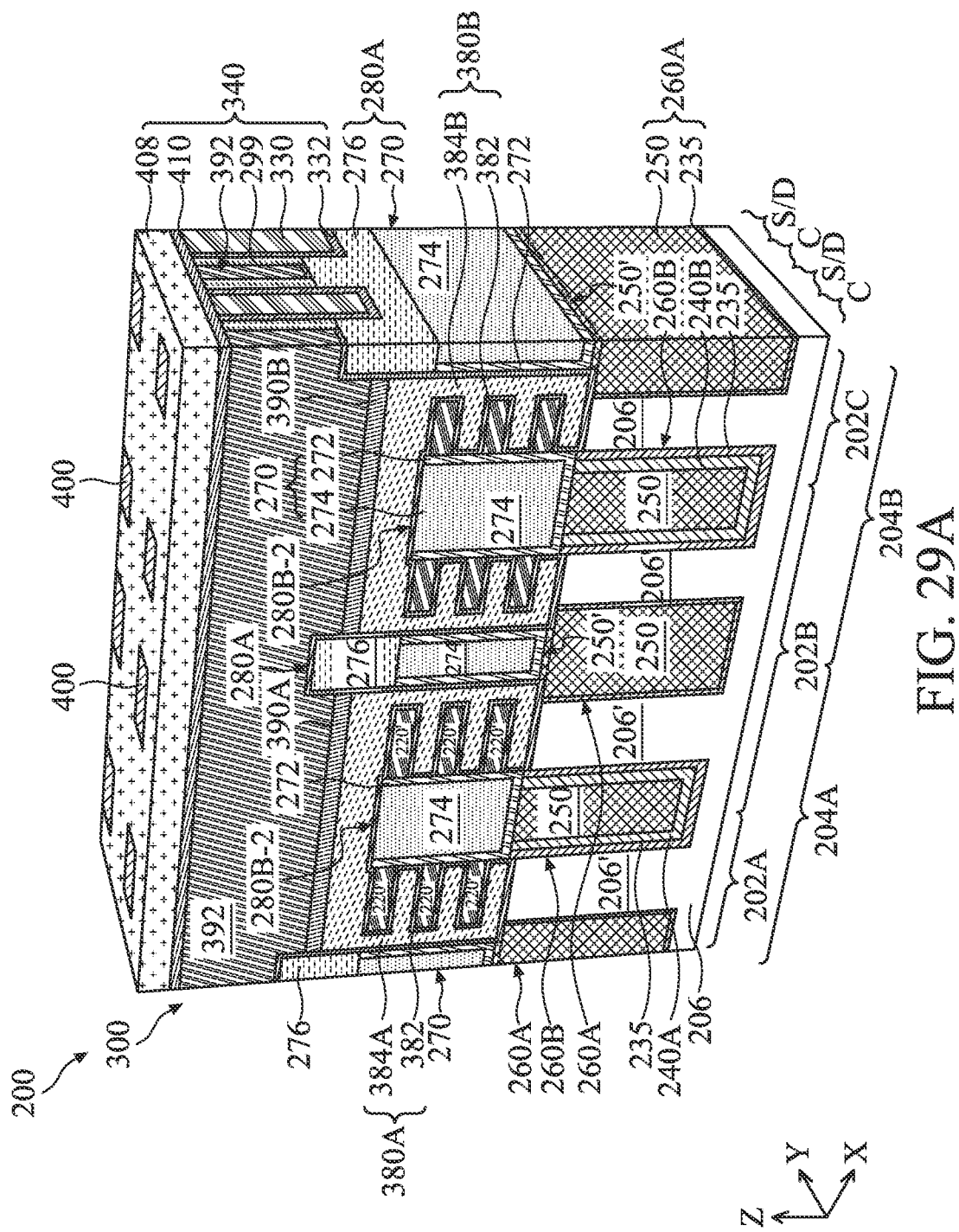
Figure 29B:
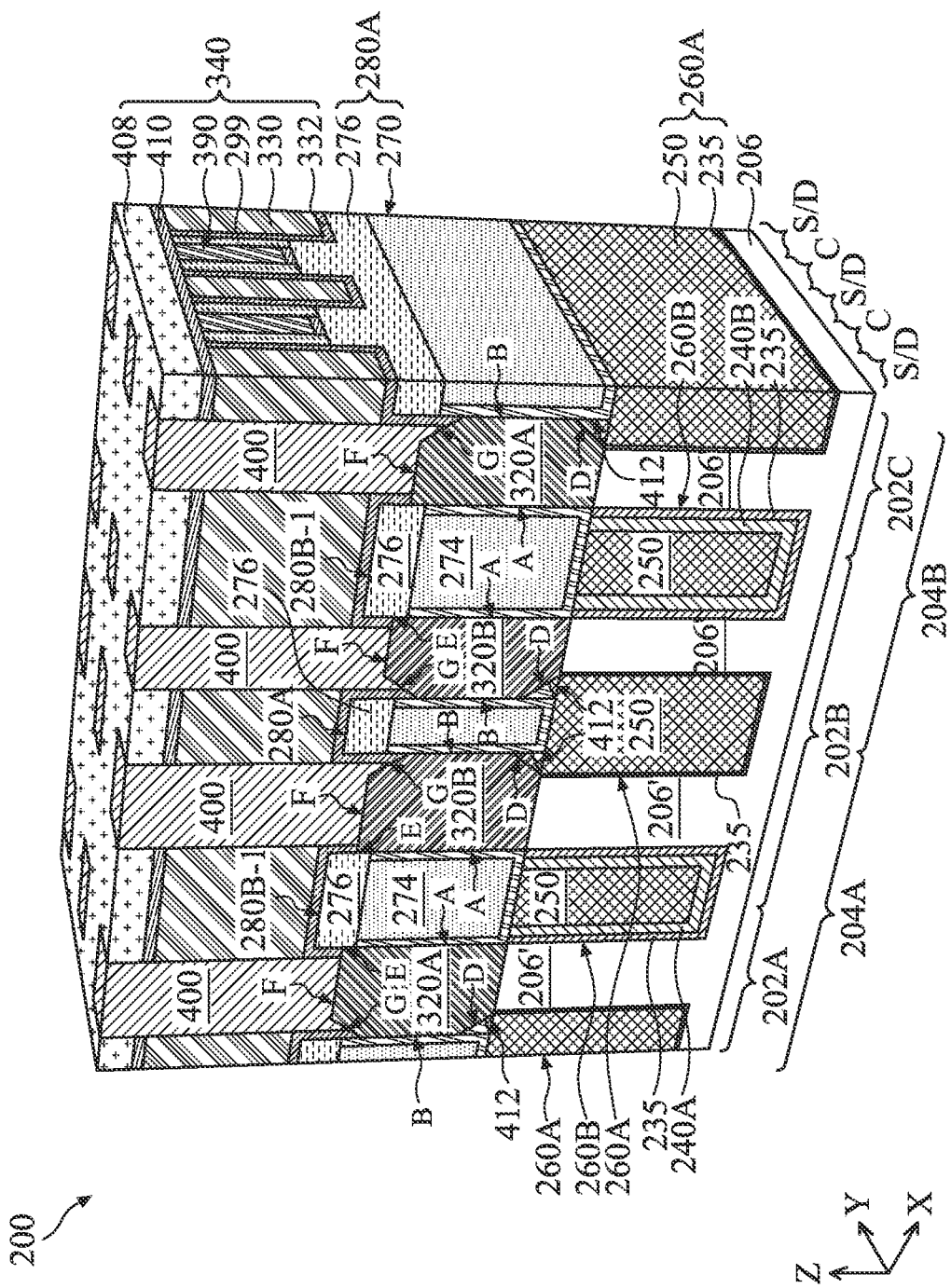
Figure 29C:
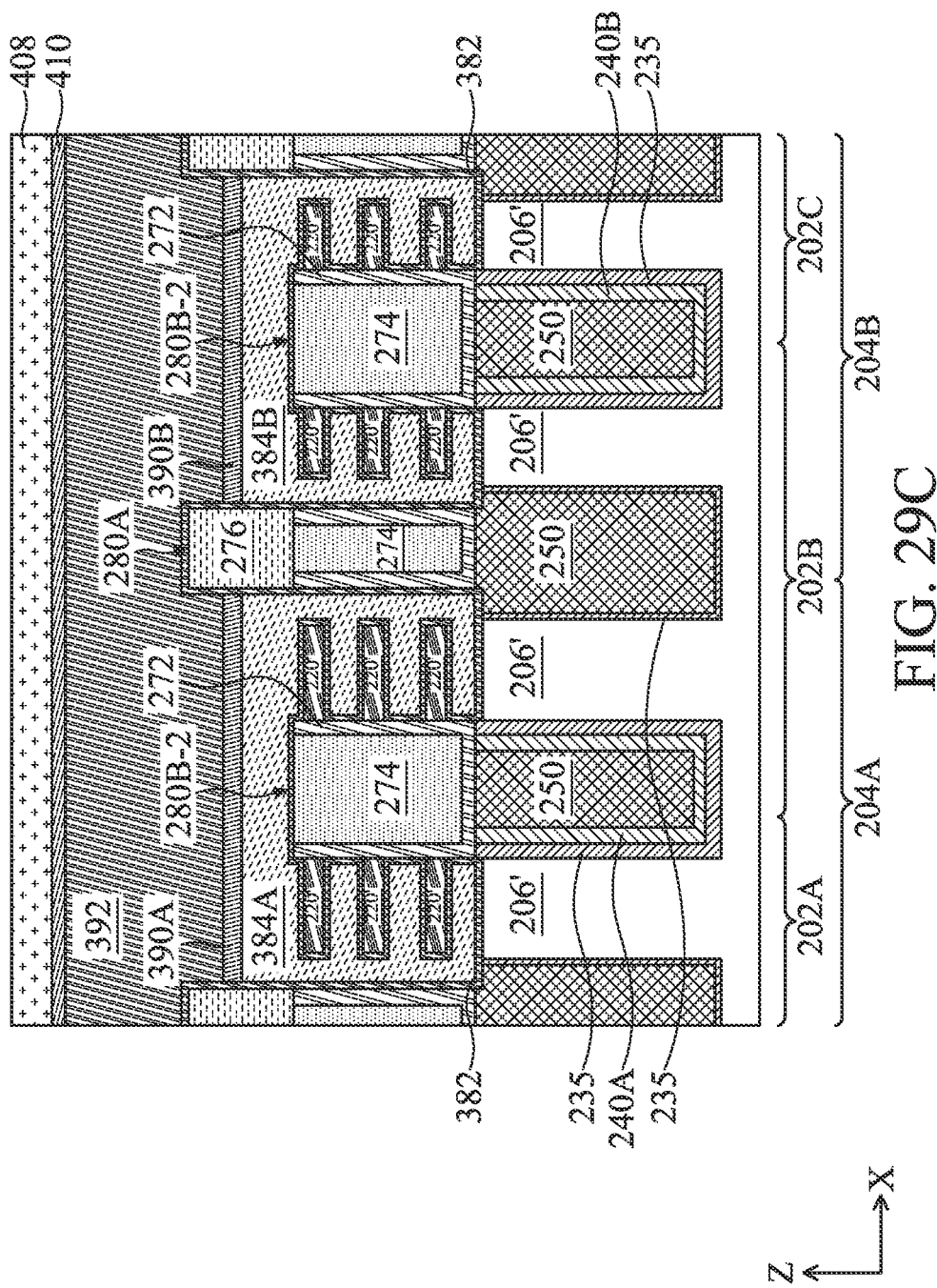
FIG. 29C and FIG. 29D are fragmentary cross-sectional views of a multigate device, in portion or entirety, at various fabrication stages (such as those associated with the method in FIG. 1) according to various aspects of the present disclosure.
Figure 29D:
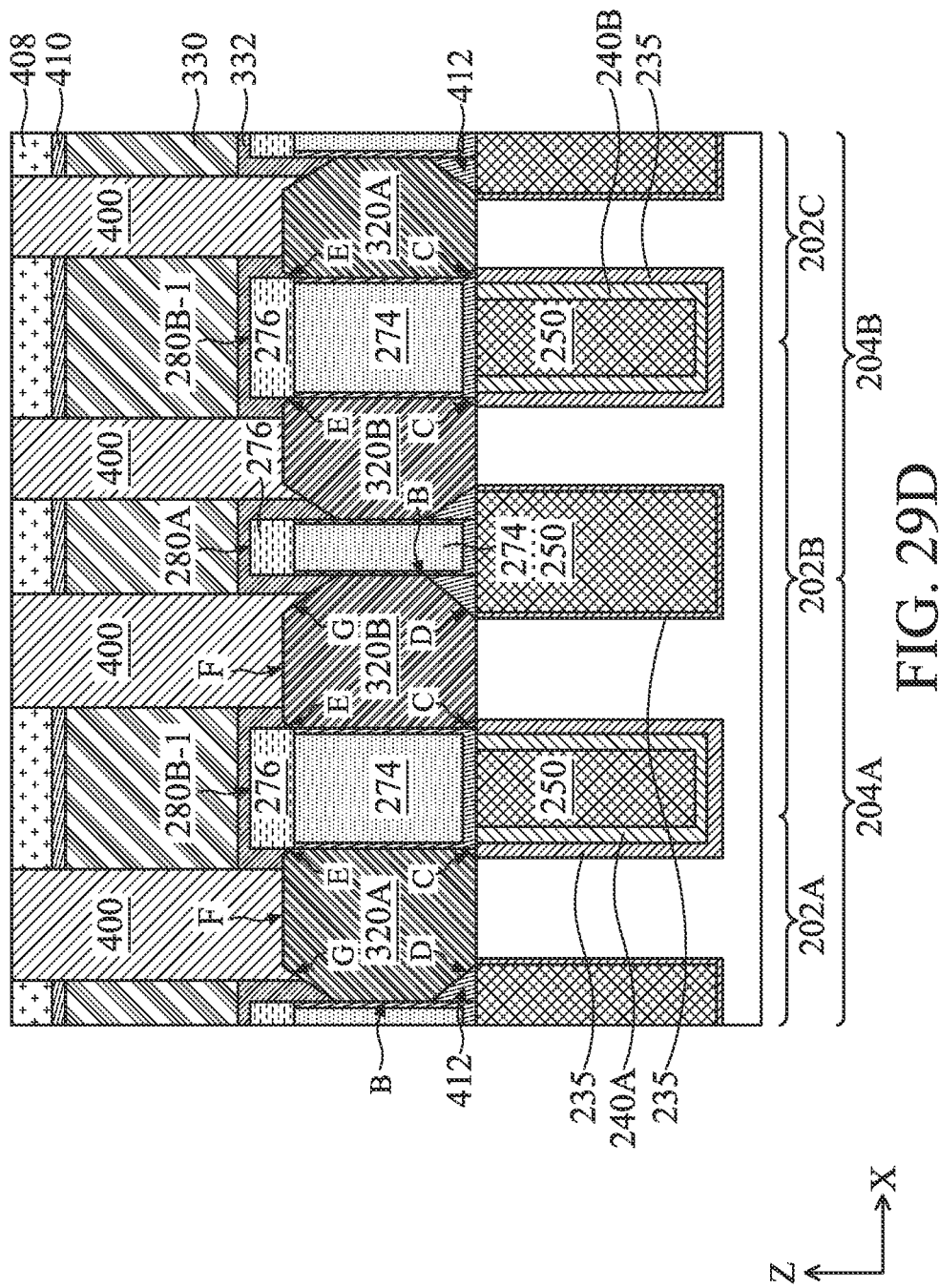

Fabrication can then proceed with forming various contacts, such as gate contacts and source/drain contacts to facilitate operation of transistors of multigate device 200. Turning to FIGS. 29A-29D, source/drain contacts 400 are formed to epitaxial source/drain features 320A, 320B. For ease of description and understanding, FIG. 29A is taken (cut) through one of gate structures 300 along line G-G' in FIG. 20 after undergoing processing associated with FIGS. 21-28 and FIGS. 29A-29D (and can be referred to as metal gate cut perspective view), FIG. 29B is taken (cut) through one of gate structures 300 along line H-H' in FIG. 20 after undergoing processing associated with FIGS. 21-28 and FIGS. 29A-29D (and can be referred to as a source/drain cut perspective view); FIG. 29C is a cross-sectional view along line G-G' in FIG. 20 after undergoing processing associated with FIGS. 21-28 and FIGS. 29A-29D (and can be referred to as a metal gate cut cross-sectional view); and FIG. 29D is a cross-sectional view along line H-H' in FIG. 20 after undergoing processing associated with FIGS. 21-26 and FIGS. 29A-29D (and can be referred to as a source/drain cross-sectional view). In FIGS. 29A-29D, source/drain contacts 400 extend through an ILD layer 408, a CESL 410, ILD layer 330, and CESL 332 to epitaxial source/drain features 320A, 320B. In some embodiments, source/drain contacts 400 are formed by depositing CESL 410 over multigate device 200 (in particular, over gate contacts 390, CESL 332, ILD layer 330, and gate spacers 299), depositing ILD layer 408 over CESL 410, patterning ILD layers and/or CESLs (e.g., ILD layers 408, 330 and/or CESLs 410, 332) to form source/drain contact openings, and filling source/drain contact openings with a conductive material. Patterning ILD layers 408, 330 and/or CESLs 410, 332 can include lithography processes and/or etching processes. In some embodiments, the lithography processes include forming a resist layer over respective ILD layer 408, exposing the resist layer to patterned radiation, and developing the exposed resist layer, thereby forming a patterned resist layer that can be used as a masking element for etching source/drain contact opening(s) that extend through ILD layer 408, CESL 410, ILD layer 330, and CESL 332 to expose epitaxial source/drain features 320A, 320B. The etching processes include dry etching processes, wet etching processes, other etching processes, or combinations thereof. Thereafter, the source/drain contact opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, source/drain contacts 400 include a bulk layer (also referred to as a conductive plug). In some embodiments, source/drain contacts 400 include a barrier layer, an adhesion layer, and/or other suitable layer disposed between the bulk layer and ILD layers 408, 330 and/or CESLs 410, 332. In such embodiments, the barrier layer and/or the adhesion layer conform to the source/drain contact openings, such that the barrier layer and/or the adhesion layer is disposed on ILD layers 408, 330 and/or CESLs 410, 332 and the bulk layer is disposed on the barrier layer and/or the adhesion layer. In some embodiments, the barrier layer, the adhesion layer, and/or other suitable layer include titanium, titanium alloy (for example, TiN), tantalum, tantalum alloy (for example, TaN), other suitable constituent, or combinations thereof. Thereafter, any excess conductive material(s) can be removed by a planarization process, such as a CMP process, thereby planarizing a top surface of ILD layer 408 and top surfaces of epitaxial source/drain features.

Accordingly, multigate device 200 includes first CMOS transistors in first multigate device region 204A and second CMOS transistors in second multigate device region 204B. The first CMOS transistors have metal gates 380A (each of which includes a respective portion of a respective gate dielectric 382 and a respective gate electrode 384A) and metal capping layer 390A, and the second CMOS transistors have metal gates 380B (each of which includes a respective portion of a respective gate dielectric 382 and a respective gate electrode 384B) and metal capping layer 390B. Metal capping layers 390A, 390B can be considered a portion of metal gates 380A, 380B, respectively, in some embodiments. Each first CMOS transistor includes an n-type transistor in n-type transistor region 202A and a p-type transistor in p-type transistor region 202B, where the n-type transistor includes a first portion of metal gate 380A and respective epitaxial source/drain features 320A and the p-type transistor includes a second portion of metal gate 380A and respective epitaxial source/drain features 320B. The first portion of metal gate 380A wraps respective channel layers 220' and is disposed between its respective epitaxial source/drain features 320A. The second portion of metal gate 380A wraps respective channel layers 220' and is disposed between its respective epitaxial source/drain features 320B. In a similar manner, each second CMOS transistor includes a p-type transistor in p-type transistor region 202B and an n-type transistor in n-type transistor region 202C, where the p-type transistor includes a first portion of metal gate 380B and respective epitaxial source/drain features 320B and the n-type transistor includes a second portion of metal gate 380B and respective epitaxial source/drain features 320A. The first portion of metal gate 380B wraps respective channel layers 220' and is disposed between its respective epitaxial source/drain features 320A. The second portion of metal gate 380B wraps respective channel layers 220' and is disposed between its respective epitaxial source/drain features 320B.

Dielectric fins 280A separate and isolate the first CMOS transistors from the second CMOS transistors. The first portions of metal gates 380A, 380B are separated from the second portions of metal gates 380A, 380B by respective ones of second portions 280B-2 of dielectric fins 280B. Different types of dielectric fins separate different multigate devices and different devices within the different multigate devices. Because of the different types of dielectric fins used for isolation and separation, the n-type transistors and the p-type transistors of the first CMOS transistors and the second CMOS transistors have metal gates with asymmetric profiles. For example, first portion of metal gate 380A, second portion of metal gate 380A, first portion of metal gate 380B, and second portion of metal gate 380B are disposed along a first sidewall of their respective channel layers 220', but not along a second sidewall of their respective channel layers 220', where a width of the respective channel layers 220' is defined between the first sidewall and the second sidewall. Instead, the second sidewall of their respective channel layers 220' physically contacts a respective one of first portions 280B-1 of dielectric fins 280B. First portion of metal gate 380A, second portion of metal gate 380A, first portion of metal gate 380B, and second portion of metal gate 380B thus partially, instead of completely, surround their respective channel layers 220'. In particular, first portion of metal gate 380A, second portion of metal gate 380A, first portion of metal gate 380B, and second portion of metal gate 380B each covers three sides of their respective channel layers 220'.

Width differences between dielectric fins 280A and 280B cause lateral growth variations of epitaxial source/drain features 320A, 320B along the x-direction, which results in epitaxial source/drain features 320A, 320B having asymmetric profiles. For example, each of epitaxial source/drain features 320A, 320B has a facet A that physically contacts a respective one of first portions 280B-1 of dielectric fins 280B, a facet B that physically contacts a respective one of dielectric fins 280B, a facet C that extends from facet A to a respective one of fin portions 206', a facet D that extends from facet B to a respective one of fin portions 206', a facet E that extends from facet A to a facet F (e.g., top surfaces of epitaxial source/drain features 320A, 320B), and a facet G that extends from facet B to facet F. Because a width of dielectric fins 280A is less than a width of their underlying isolation features (e.g., isolation features 260A) but a width of dielectric fins 280B is substantially the same as a width of their underlying isolation features (e.g., isolation features 260B), such that sidewalls of dielectric fins 280A are spaced away from sidewalls of fin portions 206' along the x-direction while sidewalls of dielectric fins 280B are not spaced away from sidewalls of fin portions 206' along the x-direction, epitaxial material can grow laterally along the x-direction beyond a first sidewall of the respective one of the fin portions 206' from which it grows but not beyond a second sidewall of the respective one of the fin portions 206' from which it grows. Such lateral growth variation results in length variations between facets proximate and adjacent to dielectric fins 280A and facets proximate and adjacent to dielectric fins 280B. In FIGS. 29A-29C, a length of facet A is greater than a length of facet B and lengths of facets that extend from facet A (e.g., facet C and facet E) are less than lengths of facets that extend from facet B (e.g., facet D and facet G). Facets of epitaxial source/drain features 320A, 320B extending from dielectric fins 280A are thus longer and larger than facets of epitaxial source/drain features 320A, 320B extending from dielectric fins 280B. Further, in some embodiments, air gaps 412 are formed between facets D, dielectric fins 280A, and isolation features 260A, while air gaps are not formed between facets C, dielectric fins 280B, and isolation features 260B. In some embodiments, where air gaps are formed between facets C, dielectric fins 280B, and isolation features 260B, such a volume and/or a size of such air gaps is smaller than a volume and/or a size of air gaps 412 because of the lateral growth variations caused by width differences in dielectric fins 280A, 280B.

Though not depicted, one or more gate contacts can be formed that extend through ILD layer 408, CESL 410, and dielectric layer 392 to metal gate 380A and/or metal gate 380B. In some embodiments, the gate contacts extend into or through metal capping layers 390A, 390B. A gate contact can include a contact barrier layer and a contact plug disposed over the contact barrier layer. The contact barrier layer includes a material that promotes adhesion between a surrounding dielectric material (here, ILD layer 408, CESL 410, dielectric layers 392, and/or other ILD layers, CESL layers, and/or dielectric layers formed over ILD layer 408) and the contact plug. The material of the contact barrier layer may further prevent diffusion of metal constituents from the contact plug into the surrounding dielectric material. In some embodiments, the contact barrier layer includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, the contact barrier layer includes multiple layers. For example, the contact barrier layer may include a first sub-layer that includes titanium and a second sub-layer that includes titanium nitride. In another example, the contact barrier layer may include a first sub-layer that includes tantalum and a second sub-layer that includes tantalum nitride. The contact plug includes tungsten, ruthenium, cobalt, copper, aluminum, iridium, palladium, platinum, nickel, low resistivity metal constituent, alloys thereof, or combinations thereof. The gate contacts can be formed using a damascene process, a dual damascene process, any of the processes described herein, and/or other suitable process.

The various etching processes performed in FIGS. 2-28 and FIGS. 29A-29D include dry etching processes, wet etching processes, or combinations thereof. The dry etching processes may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. The dry etching processes can use a carrier gas to deliver the etch gas. The carrier gas can include nitrogen, argon, helium, xenon, other suitable carrier gas constituent, or combinations thereof. The wet etching processes may implement a wet etchant solution that includes $H_2SO_4$, $H_2O_2$, $NH_4OH$, HCl, HF, DHF, KOH, $NH_3$, $CH_3COOH$, $HNO_3$, $H_3PO_4$, $H_2O$ (which can be DIW or $DIWO_3$), $O_3$, other suitable chemicals, or combinations thereof. During each etching process, various etch parameters can be tuned to achieve desired selective etching, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. Further, the various etching processes described herein can include multiple steps.

From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. One advantage is that fabrication processes described herein reduce a size and/or a footprint of metal gates and epitaxial source/drain features of transistors, compared to transistors fabricated using conventional metal gate cut techniques, thereby allowing for higher packing density of transistors and increasing IC pattern density. Reduced sizes and/or footprints of the metal gates and epitaxial source/drain features arise because dielectric fins 280A, 280B confine space for forming such features. Another advantage from the reduced sizes and/or footprints is a reduction in parasitic capacitance. For example, smaller metal gates and epitaxial source/drain features reduces parasitic capacitance (Cgd) between the metal gates and the source/drain features, thereby improving speed and performance of transistors. Furthermore, as described above, the disclosed self-aligned metal gate cut techniques described herein do not have to account for lithography process variations, allowing for smaller spacings between active regions of transistors, and thus further increasing packing density of transistors and IC pattern density.

The present disclosure provides for many different embodiments. An exemplary device includes a substrate and a multigate device having a channel layer, a metal gate that wraps a portion of the channel layer, and source/drain features disposed over the substrate. The channel layer extends along a first direction between the source/drain features. The device further includes a first dielectric fin and a second dielectric fin disposed over the substrate. The channel layer extends along a second direction between the first dielectric fin and the second dielectric fin. The second direction is different than the first direction. The metal gate is disposed between the channel layer and the second dielectric fin. The first dielectric fin is different than the second dielectric fin. In some embodiments, the device further includes a first isolation feature disposed between the first dielectric fin and the substrate and a second isolation feature disposed between the second dielectric fin and the substrate. The second isolation feature is different than the first isolation feature. In some embodiments, the metal gate is disposed over and physically contacts a top surface of the first dielectric fin. In some embodiments, a top surface of the first dielectric fin relative to a top surface of the substrate is lower than a top surface of the metal gate relative to the top surface of the substrate. In some embodiments, a top surface of the second dielectric fin relative to the top surface of the substrate is higher than the top surface of the metal gate relative to the substrate.

In some embodiments, the first dielectric fin includes a first oxide layer and a first dielectric layer having a first dielectric constant and the second dielectric fin includes a second oxide layer, a second dielectric layer having the first dielectric constant, and a third dielectric layer having a second dielectric constant that is greater than the first dielectric constant. The first oxide layer is disposed over the first dielectric layer, the second oxide layer is disposed over the second dielectric layer, and the third dielectric layer is disposed over the second oxide layer. In some embodiments, the first isolation feature includes a first oxide layer and a dielectric liner, where the first oxide layer is disposed over the dielectric liner, and the second isolation feature includes a second oxide layer. In some embodiments, a first silicon liner is disposed between the substrate and the dielectric liner, and a second silicon liner is disposed between the substrate and the second oxide layer. In some embodiments, the device further includes a gate contact that wraps a portion of the third dielectric layer of the second dielectric fin.

In some embodiments, the multigate device is a first multigate device, the channel layer is a first channel layer, the metal gate is a first metal gate, and the source/drain features are first source/drain features. In such embodiments, the device can further include a third dielectric fin disposed over the substrate and a second multigate device having a second channel layer, a second metal gate wrapping a portion of the second channel layer, and second source/drain features disposed over the substrate. The second channel layer extends along the first direction between the second source/drain features. The second dielectric fin is disposed between and separates the first metal gate and the second metal gate. The second channel layer extends along the second direction between the second dielectric fin and the third dielectric fin. The second metal gate is disposed between the second channel layer and the third dielectric fin. The third dielectric fin is the same as the first dielectric fin.

Another exemplary device includes a fin portion disposed between a first isolation feature and a second isolation feature. The first isolation feature is different than the second isolation feature. The device further includes a first dielectric fin disposed over the first isolation feature and a second dielectric fin disposed over the second isolation feature. The first dielectric fin is different than the second dielectric fin. The device further includes a multigate device having a channel layer, a metal gate that wraps a portion of the channel layer, and source/drain features. The channel layer extends along a first direction between the source/drain features and along a second direction between the first dielectric fin and the second dielectric fin. The second direction is different than the first direction. The metal gate is disposed between and separates the channel layer from the second dielectric fin.

In some embodiments, the channel layer has a top surface, a bottom surface, a first sidewall that extends between the top surface and the bottom surface, and a second sidewall that extends between the top surface and the bottom surface. The metal gate physically contacts the top surface, the bottom surface and the first sidewall and the first dielectric fin physically contacts the second sidewall. In some embodiments, the first dielectric fin has a first width along the second direction, the second dielectric fin has a second width along the second direction, the first isolation feature has a third width along the second direction, and the second isolation feature has a fourth width along the second direction. The first width is substantially the same as the third width and the second width is less than the fourth width.

In some embodiments, the first dielectric fin includes a first oxide layer and a first dielectric layer, where the first oxide layer is disposed over the first dielectric layer. In such embodiments, the second dielectric fin includes a second oxide layer, a second dielectric layer, and a third dielectric layer, where the second oxide layer is disposed over the second dielectric layer and the third dielectric layer is disposed over the second oxide layer. In such embodiments, the first isolation feature includes a third oxide layer and a fourth dielectric layer, where the third oxide layer is disposed over the fourth dielectric layer. In such embodiments, the second isolation feature includes a fourth oxide layer. The first dielectric layer, the second dielectric layer, and the fourth dielectric layer have a first dielectric constant. The third dielectric layer has a second dielectric constant that is greater than the first dielectric constant. In some embodiments, the first dielectric layer, the second dielectric layer, and the fourth dielectric layer each include a silicon-comprising dielectric material and the third dielectric layer includes a metal-and-oxygen comprising dielectric material. In some embodiments, the first isolation feature further includes a first silicon layer disposed between the fourth dielectric layer and the fin portion and the second isolation feature further includes a second silicon layer disposed between the fourth oxide layer and the fin portion.

In some embodiments, the first dielectric fin has a first portion in a channel region of the device and second portions in source/drain regions of the device. A first configuration of the first portion is different than a second configuration of the second portions. In such embodiments, the second dielectric fin has a third portion in the channel region of the device and fourth portions in the source/drain regions of the device. A third configuration of the third portion is different than a fourth configuration of the fourth portions. The channel layer extends along the second direction between the first portion of the first dielectric fin and the third portion of the second dielectric fin. The source/drain features extend along the second direction between the second portions of the first dielectric fin and the fourth portions of the second dielectric fin. Each of the source/drain features have a first facet disposed along a respective one of the second portions of the first dielectric fin and a second facet disposed along a respective one of the fourth portions of the second dielectric fin. In some embodiments, a first length of the first facet is greater than a second length of the second facet. In some embodiments, a third facet extends from the first facet and a fourth facet extends from the second facet. In some embodiments, a third length of the third facet is less than a fourth length of the fourth facet.

An exemplary method includes forming a multigate device having a channel layer, a metal gate that wraps a portion of the metal gate, and source/drain features over a substrate. The channel layer extends along a first direction between the source/drain features. The method further includes forming a first dielectric fin and a second dielectric fin over the substrate. The channel layer extends along a second direction between the first dielectric fin and the second dielectric fin. The second direction is different than the first direction. The metal gate is disposed between the channel layer and the second dielectric fin. The first dielectric fin is different than the second dielectric fin. In some embodiments, the method further includes forming a first isolation feature and a second isolation feature before forming the first dielectric fin and the second dielectric fin. The first dielectric fin is disposed over the first isolation feature and the second dielectric fin is disposed over the second isolation feature. The first isolation feature is different than the second isolation feature. In some embodiments, the method further includes forming an interlevel dielectric layer over the multigate device, the first dielectric fin, and the second dielectric fin. In some embodiments, the multigate device is a first multigate device and the metal gate is a first metal gate, and the method further includes performing a gate cut process that separates the first metal gate from a second metal gate of a second multigate device without performing a lithography process.

Another exemplary method includes forming a first fin structure, a second fin structure, a third fin structure, and a fourth fin structure over a substrate. A first trench is defined between the first fin structure and the second fin structure, a second trench is defined between the second fin structure and the third fin structure, and a third trench is defined between the third fin structure and the fourth fin structure.

The first fin structure, the second fin structure, the third fin structure, and the fourth fin structure each include a first semiconductor layer disposed over a second semiconductor layer. The method further includes forming a silicon liner over the first fin structure, the second fin structure, the third fin structure, and the fourth fin structure. The silicon liner lines the first trench, the second trench, and the third trench. The method further includes forming a dielectric liner over the first fin structure, the second fin structure, the third fin structure, and the fourth fin structure. The dielectric liner is disposed over the silicon liner and further lines the first trench, the second trench, and the third trench. The method further includes, after removing the dielectric liner from the second trench, filling the first trench, the second trench, and the third trench with an oxide material.

The method further includes partially removing the oxide material and the dielectric liner to form a first isolation feature between the first fin structure and the second fin structure, a second isolation feature between the second fin structure and the third fin structure, and a third isolation feature between the third fin structure and the fourth fin structure. The first isolation feature includes a first oxide layer disposed over a first dielectric liner, the second isolation feature includes a second oxide layer, the third isolation feature includes a third oxide layer disposed over a second dielectric liner. The first isolation feature, the second isolation feature, and the third isolation feature fill a respective lower portion of the first trench, the second trench, and the third trench. The method further includes forming a first dielectric fin over the first isolation feature, a second dielectric fin over the second isolation feature, and a third dielectric fin over the third isolation feature. The first dielectric fin includes a fourth oxide layer disposed over a first low-k dielectric layer and a first high-k dielectric layer disposed over the fourth oxide layer, the second dielectric fin includes a fifth oxide layer disposed over a second low-k dielectric layer and a second high-k dielectric layer disposed over the fifth oxide layer, and the third dielectric fin includes a sixth oxide layer disposed over a third low-k dielectric layer and a third high-k dielectric layer disposed over the sixth oxide layer. The first dielectric fin, the second dielectric fin, and the third dielectric fin fill a respective upper portion of the first trench, the second trench, and the third trench.

The method further includes, after removing a mask layer of the first fin structure, the second fin structure, the third fin structure, and the fourth fin structure, forming a dummy gate structure over channel regions of the first fin structure, the second fin structure, the third fin structure, and the fourth fin structure. The dummy gate structure includes a dummy gate and gate spacers. The dummy gate wraps first portions of the first high-k dielectric layer of the first dielectric fin, the second high-k dielectric layer of the second dielectric fin, and the third high-k dielectric layer of the third dielectric fin. The channel regions of the first fin structure, the second fin structure, the third fin structure, and the fourth fin structure are disposed between respective source/drain regions of the first fin structure, the second fin structure, the third fin structure, and the fourth fin structure. The method further includes etching the source/drain regions of the first fin structure, the second fin structure, the third fin structure, and the fourth fin structure to form source/drain recesses. In some embodiments, the etching recesses the first high-k dielectric layer, the second high-k dielectric layer, and the third high-k dielectric layer respectively of second portions of the first dielectric fin, the second dielectric fin, and the third dielectric fin that are not covered by the dummy gate structure. The method further includes forming first source/ drain features in the source/drain recesses of the first fin structure and the fourth fin structure and second source/drain features in the source/drain recesses of the second fin structure and the third fin structure. The method can further include forming inner spacers before forming the first source/drain features and the second source/drain features.

The method further includes forming an interlevel dielectric (ILD) layer over the first source/drain features, the second source/drain features, and the second portions of the first dielectric fin, the second dielectric fin, and the third dielectric fin that are not covered by the dummy gate structure. The method further includes partially removing the dummy gate to form a gate opening, wherein the gate opening exposes the first high-k dielectric layer, the second high-k dielectric layer, and the third high-k dielectric layer respectively of the first portions of the first dielectric fin, the second dielectric fin, and the third dielectric fin. The method further includes masking the second high-k dielectric layer of the first portion of the second dielectric fin and removing the first high-k dielectric layer and the third high-k dielectric layer respectively from the first portions of the first dielectric fin and the third dielectric fin. The method further includes removing a remainder of the dummy gate, such that the gate opening further exposes channel regions of the first fin structure, the second fin structure, the third fin structure, and the fourth fin structure. The method further includes selectively removing the second semiconductor layer from the channel regions of the first fin structure, the second fin structure, the third fin structure, and the fourth fin structure, such that the first semiconductor layer in the channel region of the first fin structure is suspended to provide a first channel layer, the first semiconductor layer in the channel region of the second fin structure is suspended to provide a second channel layer, the first semiconductor layer in the channel region of the third fin structure is suspended to provide a third channel layer, and the first semiconductor layer in the channel region of the fourth fin structure is suspended to provide a fourth channel layer. The first dielectric fin is disposed between the first channel layer and the second channel layer, the second dielectric fin is disposed between the second channel layer and the third channel layer, and the third dielectric fin is disposed between the third channel layer and the fourth channel layer.

The method further includes forming a first metal gate in the gate opening that wraps the first channel layer and the second channel layer and a second metal gate in the gate opening that wraps the third channel layer and the fourth channel layer. The first metal gate is disposed between the second channel layer and the second dielectric fin and the second metal gate is disposed between the third channel layer and the second dielectric fin. In some embodiments, forming the first metal gate in the gate opening and the second metal gate in the gate opening includes depositing a gate dielectric layer over the first channel layer, the second channel layer, the third channel layer, and the fourth channel layer that partially fills the gate opening. In such embodiments, forming the first metal gate in the gate opening and the second metal gate in the gate opening further includes depositing a gate electrode layer over the gate dielectric layer, wherein the gate electrode layer fills a remainder of the gate opening and the gate electrode layer extends over a top surface of the second high-k dielectric layer of the first portion of the second dielectric fin. In such embodiments, forming the first metal gate in the gate opening and the second metal gate in the gate opening further includes recessing the gate electrode layer to expose the top surface of the second high-k dielectric layer of the first portion of the second dielectric fin, thereby forming a first gate electrode that wraps the first channel layer and the second channel layer and a second gate electrode that wraps the third channel layer and the fourth channel layer. The first gate electrode is separated from the second gate electrode by the first portion of the second dielectric fin. The method further includes forming a gate contact in a remainder of the gate opening, where the gate contact is disposed over the first metal gate and the second metal gate. The method further includes forming first source/drain contacts that extend through the ILD layer to the first source/drain features and second source/drain contacts that extend through the ILD layer to the second source/drain features.

Another exemplary device includes a substrate, a first dielectric fin and a second dielectric fin disposed over the substrate, and a multigate device having a channel layer, a metal gate the wraps a portion of the channel layer, and source/drain features disposed over the substrate. The channel layer extends along a first direction between the source/drain features. The channel layer further extends along a second direction from the first dielectric fin to the metal gate. The second direction is different than the first direction. The metal gate is disposed between the channel layer and the second dielectric fin. The first dielectric fin is different than the second dielectric fin. In some embodiments, the device further includes a first isolation feature disposed between the first dielectric fin and the substrate and a second isolation feature disposed between the second dielectric fin and the substrate. The second isolation feature is different than the first isolation feature. In some embodiments, the metal gate is disposed over a top surface of the first dielectric fin. In some embodiments, a top surface of the first dielectric fin relative to a top surface of the substrate is lower than a top surface of the metal gate relative to the top surface of the substrate, and a top surface of the second dielectric fin relative to the top surface of the substrate is higher than the top surface of the metal gate relative to the substrate.

In some embodiments, the first dielectric fin includes a first oxide layer and a first low-k dielectric layer, and the second dielectric fin includes a second oxide layer, a second low-k dielectric layer, and a high-k dielectric layer. The first oxide layer is disposed over the first low-k dielectric layer. The second oxide layer is disposed over the second low-k dielectric layer and the high-k dielectric layer is disposed over the second oxide layer. In some embodiments, the device further includes a gate contact that wraps a portion of the high-k dielectric layer. In some embodiments, the first isolation feature includes a first oxide layer and a dielectric liner, where the first oxide layer is disposed over the dielectric liner, and the second isolation feature includes a second oxide layer. In some embodiments, the device further includes a first silicon liner disposed between the substrate and the dielectric liner and a second silicon liner disposed between the substrate and the second oxide layer. In some embodiments, the substrate includes a fin portion disposed between the first isolation feature and the second isolation feature, the channel layer is disposed over the fin portion, and the metal gate is disposed between the fin portion and the channel layer. In some embodiments, the first dielectric fin has a first width along the second direction, the second dielectric fin has a second width along the second direction, the first isolation feature has a third width along the second direction, the second isolation feature has a fourth width along the second direction, the first width is substantially the same as the third width, and the second width is less than the fourth width.

In some embodiments, the device further includes a third dielectric fin and a fourth dielectric fin disposed over the substrate. The source/drain features extend along the second direction from the third dielectric fin to the fourth dielectric fin. The third dielectric fin and the fourth dielectric fin each include an oxide layer, a low-k dielectric layer, and a high-k dielectric layer. The oxide layer is disposed over the low-k dielectric layer and the high-k dielectric layer is disposed over the oxide layer. In some embodiments, the source/drain features have a first sidewall disposed along the third dielectric fin, a second sidewall disposed along the fourth dielectric fin, a first facet that extends from the first sidewall, a second facet that extends from the second sidewall. In some embodiments, a first length of the first sidewall is greater than a second length of the second sidewall and a third length of the first facet is less than a fourth length of the second facet. In some embodiments, the third dielectric fin has a first width along the second direction and the fourth dielectric fin has a second width along the second direction, wherein the first width is greater than a second width.

In some embodiments, the multigate device is a first multigate device, the channel layer is a first channel layer, the metal gate is a first metal gate, and the source/drain features are first source/drain features. In such embodiments, the device further includes a second multigate device having a second channel layer, a second metal gate wrapping a portion of the second metal gate, and second source/drain features disposed over the substrate. The second channel layer extends along the first direction between the second source/drain features. In such embodiments, the device can further include a third dielectric fin disposed over the substrate. The second dielectric fin is disposed between and separates the first metal gate and the second metal gate. The second channel layer further extends along the second direction from the third dielectric fin to the second metal gate. The second metal gate is disposed between the second channel layer and the second dielectric fin. In some embodiments, the third dielectric fin is the same as the first dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure extending from a substrate, wherein the fin structure includes a semiconductor layer stack over a substrate extension;
    forming a first isolation feature and a second isolation feature over the substrate, wherein the substrate extension is between the first isolation feature and the second isolation feature, the first isolation feature has a first configuration, and the second isolation feature has a second configuration that is different than the first configuration;
    forming a first gate isolation structure and a second gate isolation structure over the first isolation feature and the second isolation feature, respectively, wherein the semiconductor layer stack is between the first gate isolation structure and the second gate isolation structure, the first gate isolation structure has a first configuration, and the second gate isolation structure has a second configuration that is different than the first configuration;
    processing the semiconductor layer stack to provide a semiconductor layer suspended over the substrate extension, a first epitaxial source/drain over the substrate extension, and a second epitaxial source/drain over the substrate extension, wherein:
        the semiconductor layer extends between the first epitaxial source/drain and the second epitaxial source/drain along a first direction,
        the semiconductor layer extends between the first gate isolation structure and the second gate isolation structure along a second direction, and
        the second direction is different than the first direction; and
    forming a gate that wraps the semiconductor layer, wherein the gate is between the first gate isolation structure and the semiconductor layer but not between the second gate isolation structure and the semiconductor layer.

2. The method of claim 1, wherein:
    the forming the first isolation feature includes forming a first oxide layer and a first silicon liner, wherein the first oxide layer is over the first silicon liner; and
    the forming the second isolation feature includes forming a second oxide layer, a dielectric liner, and a second silicon liner, wherein the dielectric liner is over the second silicon liner and the second oxide layer is over the dielectric liner, such that the dielectric liner is between the second oxide layer and the second silicon liner.

3. The method of claim 2, wherein the fin structure is between and forms a respective sidewall of each of a first trench and a second trench and the forming the first isolation feature and the second isolation feature includes:
    depositing a silicon layer over the fin structure, wherein the silicon layer wraps the fin structure, lines the first trench, and lines the second trench;
    depositing a dielectric layer over the silicon layer, wherein the dielectric layer wraps the fin structure, lines the first trench, and lines the second trench;
    after removing the dielectric layer from the first trench and from over a portion of a top of the fin structure, depositing an oxide material that fills remainders of the first trench and the second trench, wherein the oxide material is deposited over the silicon layer in the first trench and the dielectric layer in the second trench; and
    etching back the oxide material.

4. The method of claim 1, wherein:
    the forming the first gate isolation structure includes forming a first oxide layer, a first dielectric liner having a first dielectric constant, and a first dielectric layer having a second dielectric constant that is greater than the first dielectric constant, wherein the first oxide layer is over the first dielectric liner and the first dielectric layer is over the first oxide layer; and
    the forming the second gate isolation structure includes forming a second oxide layer and a second dielectric liner having the first dielectric constant, wherein the second oxide layer is over the second dielectric liner.

5. The method of claim 4, wherein the forming the second gate isolation structure further includes:

forming a second dielectric layer having the second dielectric constant, wherein the second dielectric layer is over the second oxide layer; and removing the second dielectric layer from a portion of the second gate isolation structure.

6. The method of claim 1, wherein:

the fin structure is between a first trench and a second trench and the semiconductor layer stack has a top between a first sidewall and a second sidewall, wherein the first sidewall forms a portion of a trench sidewall of the first trench and the second sidewall forms a portion of a trench sidewall of the second trench;

after forming the first isolation feature and the second isolation feature, the first isolation feature is adjacent to the substrate extension and fills a bottom portion of the first trench, the second isolation feature is adjacent to the substrate extension and fills a bottom portion of the second trench, a silicon layer is along the first sidewall, the second sidewall, and the top of the semiconductor layer stack, and a dielectric layer is along the second sidewall of the semiconductor layer stack; and the forming the first gate isolation structure and the second gate isolation structure includes:

converting the silicon layer along the first sidewall and the top of the semiconductor layer stack into a sacrificial semiconductor feature, removing the silicon layer and the dielectric layer along the second sidewall of the semiconductor layer stack, forming a first dielectric layer that lines a top portion of the first trench and a top portion of the second trench, wherein the dielectric layer is along the second sidewall of the semiconductor layer stack, and further wherein the sacrificial semiconductor feature is between the first dielectric layer and the first sidewall of the semiconductor layer stack, forming an oxide material over the first dielectric layer, wherein the oxide material fills remainders of the top portion of the first trench and the second trench, recessing the oxide material and the first dielectric layer, and forming a second dielectric layer over the recessed oxide material and the recessed first dielectric layer.

7. The method of claim 1, wherein:

the first epitaxial source/drain is between the first gate isolation structure and the second gate isolation structure along the second direction, the second epitaxial source/drain is between the first gate isolation structure and the second gate isolation structure along the second direction; and the processing the semiconductor layer stack to provide the first epitaxial source/drain and the second epitaxial source/drain includes:

removing the semiconductor layer stack from the fin structure in a first source/drain region and a second source/drain region, and epitaxially growing a semiconductor material from the substrate extension in the first source/drain region and the second source/drain region, wherein the semiconductor material has an asymmetric profile.

8. The method of claim 1, wherein forming the first gate isolation structure and the second gate isolation structure includes providing the first gate isolation structure with a first width and the second gate isolation structure with a second width, wherein the first width is less than the second width.

9. The method of claim 1, wherein the fin structure is a first fin structure, the semiconductor layer stack is a first semiconductor layer stack, the substrate extension is a first substrate extension, the semiconductor layer is a first semiconductor layer, and the method further comprising:

forming a second fin structure extending from the substrate, wherein the second fin structure includes a second semiconductor layer stack over a second substrate extension;

processing the second semiconductor layer stack to provide a second semiconductor layer suspended over the second substrate extension, a third epitaxial source/drain over the second substrate extension, and a fourth epitaxial source/drain over the second substrate extension, wherein the second semiconductor layer extends between the third epitaxial source/drain and the fourth epitaxial source/drain along the first direction; and wherein the second gate isolation structure is between the second semiconductor layer and the first semiconductor layer along the second direction, the gate extends over a top of the second gate isolation structure and wraps the second semiconductor layer, and the gate is not between the second gate isolation structure and the second semiconductor layer.

10. The method of claim 9, wherein the gate is a first gate, the method further comprising:

forming a third fin structure extending from the substrate, wherein the third fin structure includes a third semiconductor layer stack over a third substrate extension;

processing the third semiconductor layer stack to provide a third semiconductor layer suspended over the third substrate extension, a fifth epitaxial source/drain over the third substrate extension, and a sixth epitaxial source/drain over the third substrate extension, wherein the third semiconductor layer extends between the fifth epitaxial source/drain and the sixth epitaxial source/drain along the first direction; and forming a second gate that wraps the third semiconductor layer, wherein the second gate is between the first gate isolation structure and the third semiconductor layer and the first gate isolation structure is between the first gate and the second gate.

11. A method comprising:

forming a semiconductor extension from a substrate;

forming a semiconductor layer over the semiconductor extension;

forming a first isolation structure and a second isolation structure over the substrate, wherein the semiconductor extension is between the first isolation structure and the second isolation structure, the first isolation structure has a first configuration, and the second isolation structure has a second configuration that is different than the first configuration;

forming a third isolation structure and a fourth isolation structure over the first isolation structure and the second isolation structure, respectively, wherein the semiconductor layer is between the third isolation structure and the fourth isolation structure, the third isolation structure has a third configuration, and the fourth isolation structure has a fourth configuration that is different than the third configuration; and forming a multilayer structure that wraps the semiconductor layer, wherein the multilayer structure has a dielectric portion and a metal portion and the multilayer structure is between the fourth isolation structure and the semiconductor layer but not between the third isolation structure and the semiconductor layer.

12. The method of claim 11, wherein:
the forming the first isolation structure includes forming a first oxide layer and a first silicon liner, wherein the first oxide layer is over the first silicon liner;
the forming the second isolation structure includes forming a second oxide layer, a first dielectric liner, and a second silicon liner, wherein the first dielectric liner is over the second silicon liner and the second oxide layer is over the first dielectric liner, such that the first dielectric liner is between the second oxide layer and the second silicon liner;
the forming the third isolation structure includes forming a third oxide layer, a second dielectric liner having a first dielectric constant, and a first dielectric layer having a second dielectric constant that is greater than the first dielectric constant, wherein the third oxide layer is over the second dielectric liner and the first dielectric layer is over the third oxide layer;
the forming the fourth isolation structure includes forming a fourth oxide layer, a third dielectric liner having the first dielectric constant, and a second dielectric layer having the second dielectric constant, wherein the fourth oxide layer is over the third dielectric liner and the second dielectric layer is over the fourth oxide layer; and
removing a portion of the second dielectric layer from the third isolation structure when forming the multilayer structure.

13. The method of claim 12, wherein the portion of the second dielectric layer is a first portion, the method further comprising:
forming a source/drain recess, wherein a second portion of the second dielectric layer is recessed when forming the source/drain recess; and
forming an epitaxial source/drain in the source/drain recess and over the semiconductor extension, wherein the epitaxial source/drain is between the third isolation structure and the fourth isolation structure.

14. The method of claim 13, wherein the dielectric portion is a gate dielectric and the metal portion is a gate electrode and the forming the multilayer structure includes:
forming a gate opening that exposes the semiconductor layer;
removing a first sacrificial semiconductor layer to suspend the semiconductor layer over the semiconductor extension and a second sacrificial semiconductor layer to form a gap between the semiconductor layer and the fourth isolation structure;
depositing the gate dielectric in the gate opening, wherein the gate dielectric is deposited on the semiconductor layer, the third isolation structure, and the fourth isolation structure;
depositing the gate electrode in the gate opening, wherein the gate electrode is deposited over the gate dielectric; and
etching back the gate electrode, such that a top surface of the gate electrode is below a top surface of the fourth isolation structure.

15. The method of claim 14, wherein the etching back stops before reaching the third isolation structure, such that the gate electrode remains over a top surface of the third isolation structure.

16. A semiconductor structure comprising:
a semiconductor extension from a substrate;
a semiconductor layer over the semiconductor extension;
a first isolation structure and a second isolation structure over the substrate, wherein the semiconductor extension is between the first isolation structure and the second isolation structure, the first isolation structure has a first configuration, and the second isolation structure has a second configuration that is different than the first configuration;
a third isolation structure and a fourth isolation structure over the first isolation structure and the second isolation structure, respectively, wherein the semiconductor layer is between the third isolation structure and the fourth isolation structure, the third isolation structure has a third configuration, and the fourth isolation structure has a fourth configuration that is different than the third configuration; and
a multilayer structure that wraps the semiconductor layer, wherein the multilayer structure has a dielectric portion and a metal portion and the multilayer structure is between the fourth isolation structure and the semiconductor layer but not between the third isolation structure and the semiconductor layer.

17. The semiconductor structure of claim 16, wherein the semiconductor extension is a first semiconductor extension, the semiconductor layer is a first semiconductor layer, and the semiconductor structure further comprises:
a second semiconductor extension from the substrate;
a second semiconductor layer over the second semiconductor extension;
a fifth isolation structure over the substrate, wherein the fifth isolation structure has the second configuration, the second semiconductor extension is between the first isolation structure and the fifth isolation structure, and the first isolation structure is between the second semiconductor extension and the first semiconductor extension;
a sixth isolation structure over the fifth isolation structure, wherein the sixth isolation structure has the fourth configuration, the second semiconductor layer is between the third isolation structure and the sixth isolation structure, and the third isolation structure is between the second semiconductor layer and the first semiconductor layer; and
wherein the multilayer structure wraps the second semiconductor layer and the multilayer structure is between the sixth isolation structure and the second semiconductor layer but not between the third isolation structure and the second semiconductor layer.

18. The semiconductor structure of claim 17, wherein the multilayer structure is a first multilayer structure, the dielectric portion is a first dielectric portion, the metal portion is a first metal portion, and the semiconductor structure further comprises:
a third semiconductor extension from the substrate;
a third semiconductor layer over the third semiconductor extension;
a seventh isolation structure over the substrate, wherein the seventh isolation structure has the first configuration, the third semiconductor extension is between the second isolation structure and the seventh isolation structure, and the second isolation structure is between the third semiconductor extension and the first semiconductor extension;
an eighth isolation structure over the seventh isolation structure, wherein the eighth isolation structure has the third configuration, the third semiconductor layer is between the fourth isolation structure and the eighth isolation structure, and the fourth isolation structure is between the third semiconductor layer and the first semiconductor layer; and a second multilayer structure that wraps the third semiconductor layer, wherein the second multilayer structure has a second dielectric portion and a second metal portion, the second multilayer structure is between the fourth isolation structure and the third semiconductor layer but not between the eighth isolation structure and the third semiconductor layer.

19. The semiconductor structure of claim 16, wherein:

the semiconductor layer has a first sidewall, a second sidewall, a top, and a bottom;

the multilayer structure is along the top, the first sidewall, and the second sidewall; and the fourth isolation structure is along the second sidewall.

20. The semiconductor structure of claim 16, wherein the dielectric portion is a gate dielectric and the metal portion is a gate electrode.

* * * * *